(12) United States Patent
Liu et al.

(10) Patent No.: US 11,894,340 B2
(45) Date of Patent: Feb. 6, 2024

(54) PACKAGE STRUCTURE AND METHOD FOR MANUFACTURING THE SAME

(71) Applicant: Advanced Semiconductor Engineering, Inc., Kaohsiung (TW)

(72) Inventors: Syu-Tang Liu, Kaohsiung (TW); Min Lung Huang, Kaohsiung (TW); Huang-Hsien Chang, Kaohsiung (TW); Tsung-Tang Tsai, Kaohsiung (TW); Ching-Ju Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 797 days.

(21) Appl. No.: 16/685,899

(22) Filed: Nov. 15, 2019

(65) Prior Publication Data

US 2021/0151407 A1   May 20, 2021

(51) Int. Cl.
*H01L 25/065* (2023.01)
*H01L 23/31* (2006.01)
(Continued)

(52) U.S. Cl.
CPC .......... *H01L 25/0652* (2013.01); *H01L 21/78* (2013.01); *H01L 23/16* (2013.01);
(Continued)

(58) Field of Classification Search
CPC ..... H01L 25/0652; H01L 25/50; H01L 25/18; H01L 25/56; H01L 25/561; H01L 25/03; H01L 25/0655; H01L 25/105; H01L 21/78; H01L 21/563; H01L 21/568; H01L 21/6835; H01L 23/16; H01L 23/3128; H01L 23/49822; H01L 23/562; H01L 23/3675; H01L 23/3135; H01L 24/13; H01L 24/16; H01L 24/81; H01L 24/32; H01L 24/73; H01L 24/92; H01L 2224/13101; H01L 2224/16145; H01L 2224/16225; H01L 2224/32145; H01L 2224/73253; H01L 2224/81801;
(Continued)

(56) References Cited

U.S. PATENT DOCUMENTS 7,675,153 B2 * 3/2010 Kurosawa ............... H01L 24/27
                                                                257/723
7,919,871 B2 * 4/2011 Moon ..................... H01L 24/97
                                                                438/110

(Continued)

*Primary Examiner* — Dale E Page
*Assistant Examiner* — Quovaunda Jefferson
(74) *Attorney, Agent, or Firm* — FOLEY & LARDNER LLP

(57) ABSTRACT

A package structure includes a wiring structure and a first electronic device. The wiring structure includes at least one dielectric layer and at least one circuit layer in contact with the dielectric layer. The first electronic device is electrically connected to the wiring structure, and has a first surface, a second surface and at least one lateral side surface extending between the first surface and the second surface. The first electronic device includes a first active circuit region and a first protrusion portion. The first protrusion portion protrudes from the at least one lateral side surface of the first electronic device. A portion of the first active circuit region is disposed in the first protrusion portion.

10 Claims, 51 Drawing Sheets

(51) Int. Cl.
- *H01L 23/16* (2006.01)
- *H01L 23/00* (2006.01)
- *H01L 21/78* (2006.01)
- *H01L 25/00* (2006.01)
- *H01L 23/498* (2006.01)

(52) U.S. Cl.
CPC .... *H01L 23/3128* (2013.01); *H01L 23/49822* (2013.01); *H01L 23/562* (2013.01); *H01L 25/50* (2013.01)

(58) Field of Classification Search
CPC . H01L 2224/92125; H01L 2224/32225; H01L 2224/73204; H01L 2221/68345; H01L 2924/181; H01L 2924/18161; H01L 2924/18301; H01L 2924/15311; H01L 2924/00012; H01L 2924/014
See application file for complete search history.

(56) References Cited

U.S. PATENT DOCUMENTS

| | | | |
|---|---|---|---|
| 9,196,607 B2* | 11/2015 | Bae | H01L 25/18 |
| 2010/0019359 A1* | 1/2010 | Pagaila | H01L 24/96 |
| | | | 257/659 |
| 2016/0079171 A1* | 3/2016 | Yeh | H01L 23/562 |
| | | | 257/532 |

* cited by examiner

PACKAGE STRUCTURE AND METHOD FOR MANUFACTURING THE SAME

BACKGROUND

1. Field of the Disclosure

The present disclosure relates to a package structure and a manufacturing method, and to a package structure including an electronic device including a protrusion portion, and a method for manufacturing the same.

2. Description of the Related Art

In a semiconductor assembly structure, a semiconductor package structure is mounted to a substrate, and a heat sink is attached to a top surface of the semiconductor package structure so as to dissipate the heat generated from the semiconductor device(s) in the semiconductor package during operation. However, when the heat sink is attached to the semiconductor package structure, a pressing force may be transmitted from the heat sink to the semiconductor package structure. Since a rigidity or stiffness of the semiconductor package structure is relatively low, a crack may be formed at the top surface of the semiconductor package structure. In addition, during a manufacturing process, several thermal process (e.g., reflow process) may be conducted to the semiconductor package structure, which may cause a warpage of the semiconductor package structure. Thus, a crack may be formed in the underfill between the semiconductor devices. Such crack may extend or grow into the interior of the semiconductor package structure. If the crack reaches the substrate, the circuit portion in the substrate may be damaged or broken, which may result in an open circuit and render the semiconductor package structure inoperative. Thus, a yield of the semiconductor assembly structure may decrease.

SUMMARY

In some embodiments, a package structure includes a wiring structure and a first electronic device. The wiring structure includes at least one dielectric layer and at least one circuit layer in contact with the dielectric layer. The first electronic device is electrically connected to the wiring structure, and has a first surface, a second surface and at least one lateral side surface extending between the first surface and the second surface. The first electronic device includes a first active circuit region and a first protrusion portion. The first protrusion portion protrudes from the at least one lateral side surface of the first electronic device. A portion of the first active circuit region is disposed in the first protrusion portion.

In some embodiments, a package structure includes a wiring structure, a first electronic device, a second electronic device and a protection material. The wiring structure includes at least one dielectric layer, and at least one circuit layer in contact with the dielectric layer. The first electronic device is electrically connected to the wiring structure. The second electronic device is electrically connected to the wiring structure. The protection material extends from a first space between the first electronic device and the wiring structure to a second space between the second electronic device and the wiring structure. The protection material includes a plurality of fillers, and a gap between the first electronic device and the second electronic device is less than a particle size of the fillers of the protection material.

In some embodiments, a manufacturing method includes: (a) providing a wiring structure, wherein the wiring structure includes at least one dielectric layer and at least one circuit layer in contact with the dielectric layer; (b) providing at least one first electronic device; and (c) electrically connecting the at least one first electronic device to the wiring structure, wherein the first electronic device includes a first active circuit region and a first protrusion portion, the first protrusion portion protrudes from the at least one lateral side surface of the first electronic device, and a portion of the first active circuit region is disposed in the first protrusion portion.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
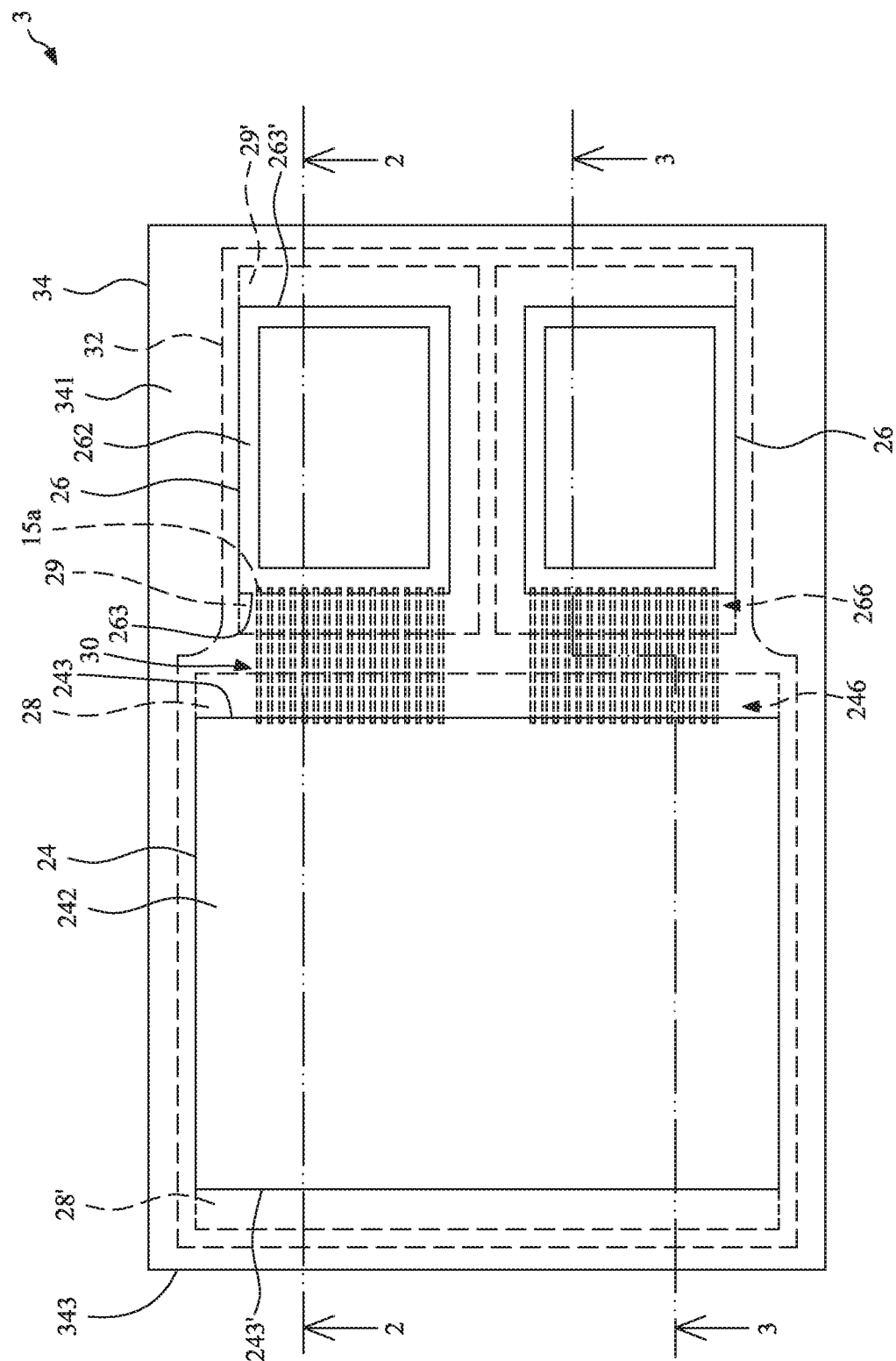
FIG. 1 illustrates a top view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure provide for a package structure which has an improved crack resistance. In some embodiments, an assembly structure includes such package structure so as to improve a reliability or a yield thereof. At least some embodiments of the present disclosure further provide for techniques for manufacturing the package structure and the assembly structure.

Figure 2:
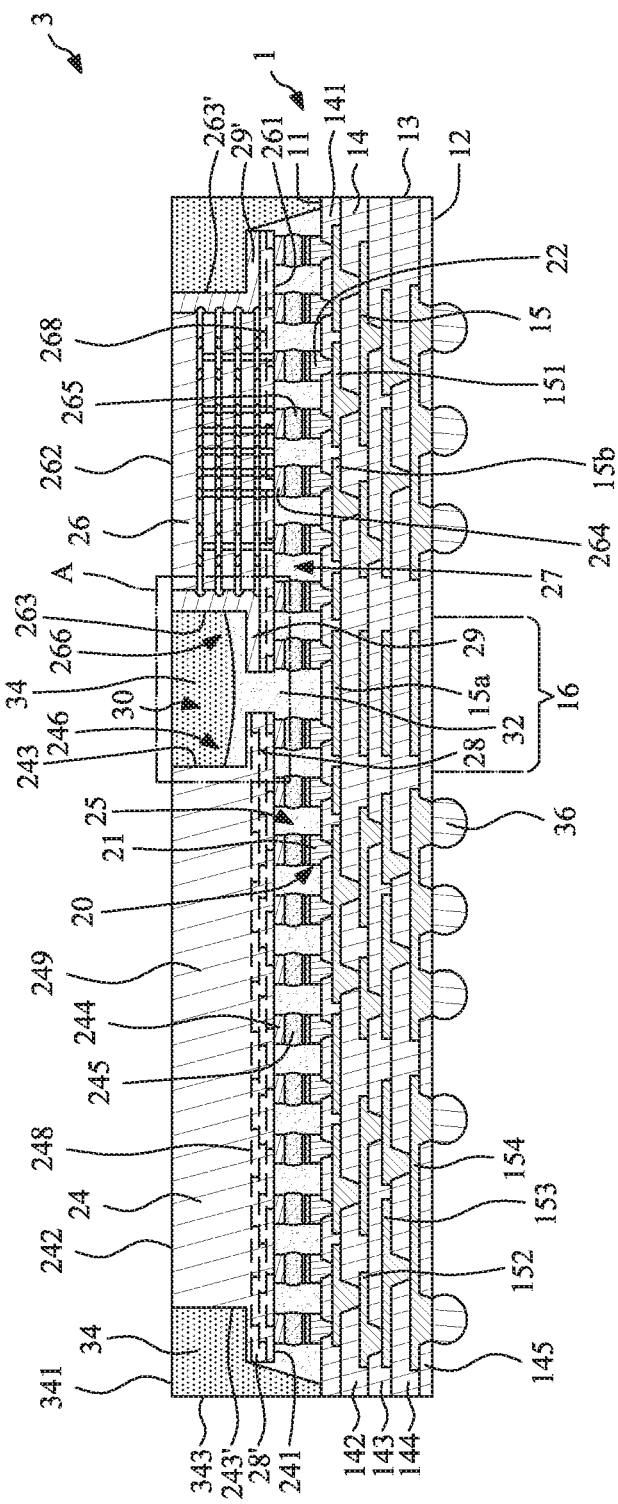
FIG. 2 illustrates a cross-sectional view taken along line 2-2 of the package structure of FIG. 1.
Figure 3:
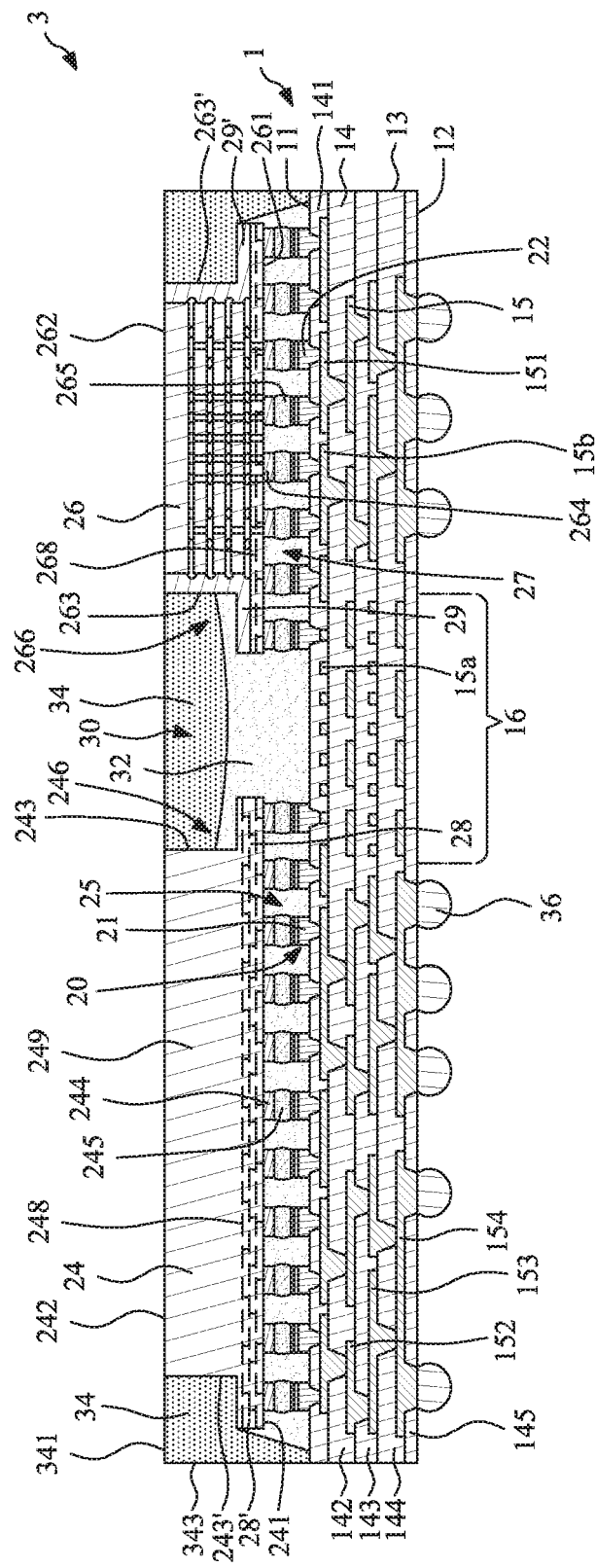
FIG. 3 illustrates a cross-sectional view taken along line 3-3 of the package structure of FIG. 1.

FIG. 1 illustrates a top view of a package structure 3 according to some embodiments of the present disclosure. FIG. 2 illustrates a cross-sectional view taken along line 2-2 of the package structure 3 of FIG. 1. FIG. 3 illustrates a cross-sectional view taken along line 3-3 of the package structure 3 of FIG. 1. The package structure 3 includes a wiring structure 1, a first electronic device 24, a second electronic device 26, a first protection material 32, an encapsulant 34 and a plurality of solder materials 36. As shown in FIG. 1, the package structure 3 may include one first electronic device 24 and two second electronic devices 26. However, the amounts of the first electronic device(s) 24 and the second electronic device(s) 26 are not limited in the present disclosure.

As shown in FIG. 2 and FIG. 3, the wiring structure 1 has a first surface 11, a second surface 12 opposite to the first surface 11, a lateral side surface 13 extending between the first surface 11 and the second surface 12, and a high density region 16 (or a fine line region) between the first electronic device 24 and the second electronic device 26. The wiring structure 1 may include at least one dielectric layer 14, at least one circuit layer 15 in contact with the dielectric layer 14, and a plurality of protrusion pads 20. For example, the wiring structure 1 includes a first dielectric layer 141, a first circuit layer 151, a second dielectric layer 142, a second circuit layer 152, a third dielectric layer 143, a third circuit layer 153, a fourth dielectric layer 144, a fourth circuit layer 154, and a fifth dielectric layer 145. That is, the at least one dielectric layer 14 includes the first dielectric layer 141, the second dielectric layer 142, the third dielectric layer 143, the fourth dielectric layer 144 and the fifth dielectric layer 145. The at least one circuit layer 15 includes the first circuit layer 151, the second circuit layer 152, the third circuit layer 153 and the fourth circuit layer 154.

The first dielectric layer 141 may be a topmost dielectric layer or an outermost dielectric layer of the wiring structure 1. The first circuit layer 151 may be a topmost circuit layer or an outermost circuit layer of the wiring structure 1. A material of the first circuit layer 151 may include, for example, copper, another conductive metal, or an alloy thereof. A material of the first dielectric layer 141 may include an insulating material, a passivation material, a dielectric material or a solder resist material, such as, for example, a benzocyclobutene (BCB) based polymer or a polyimide (PI). In some embodiments, the first dielectric layer 141 may be made of a photoimageable material. In addition, the first surface 11 of the wiring structure 1 may be a top surface of the first dielectric layer 141. The first circuit layer 151 is disposed adjacent to the top surface of the first dielectric layer 141. In some embodiments, the first circuit layer 151 is embedded in the first dielectric layer 141, and is exposed from the top surface of the first dielectric layer 141. That is, the first dielectric layer 141 covers the first circuit layer 151, and defines a plurality of openings to expose portions of the first circuit layer 151.

Further, the first circuit layer 151 may include an interconnection portion 15a and a periphery portion 15b. The interconnection portion 15a is located in the high density region 16, and the periphery portion 15b is located outside the high density region 16 (e.g., a low density region). For example, the second electronic device 26 may be electrically connected to the first electronic device 24 through the interconnection portion 15a of the first circuit layer 151. The second electronic device 26 and the first electronic device 24 may be electrically connected to the solder materials 36 on the second surface 12 of the wiring structure 1 through the periphery portion 15b of the first circuit layer 151. A line width/line space (L/S) of the traces of the interconnection portion 15a may be less than an L/S of the traces of the periphery portion 15b. For example, an L/S of the traces of the interconnection portion 15a may be less than or equal to about 5 μm/about 5 μm, or less than or equal to about 2 μm/about 2 μm, or less than or equal to about 1.8 μm/about 1.8 μm. An L/S of the traces of the periphery portion 15b may be less than or equal to about 10 μm/about 10 μm, or less than or equal to about 7 μm/about 7 μm, or less than or equal to about 5 μm/about 5 μm.

The first dielectric layer 141 and the first circuit layer 151 may be disposed on the second dielectric layer 142. In addition, the second dielectric layer 142 may cover the second circuit layer 152. A portion (e.g., a via portion) of the first circuit layer 151 extends through the second dielectric layer 142 to electrically connect the second circuit layer 152. A material of the second dielectric layer 142 may be the same as or similar to the material of the first dielectric layer 141. The second circuit layer 152 may also include an interconnection portion located in the high density region 16, and a periphery portion located outside the high density region 16. In some embodiments, the via portion of the first circuit layer 151 may extend from the periphery portion 15b, and they may be formed concurrently and integrally.

Similarly, the second dielectric layer 142 and the second circuit layer 152 may be disposed on the third dielectric layer 143. In addition, the third dielectric layer 143 may cover the third circuit layer 153. A portion (e.g., a via portion) of the second circuit layer 152 extends through the third dielectric layer 143 to electrically connect the third circuit layer 153. A material of the third dielectric layer 143 may be the same as or similar to the material of the second dielectric layer 142. The third circuit layer 153 may also include an interconnection portion located in the high density region 16, and a periphery portion located outside the high density region 16. In some embodiments, the via portion of the second circuit layer 152 may extend from the periphery portion, and they may be formed concurrently and integrally.

Similarly, the third dielectric layer 143 and the third circuit layer 153 may be disposed on the fourth dielectric layer 144. In addition, the fourth dielectric layer 144 may cover the fourth circuit layer 154. A portion (e.g., a via portion) of the third circuit layer 153 extends through the fourth dielectric layer 144 to electrically connect the fourth circuit layer 154. A material of the fourth dielectric layer 144 may be the same as or similar to the material of the third dielectric layer 143. The fourth circuit layer 154 may also include an interconnection portion located in the high density region 16, and a periphery portion located outside the high density region 16.

The fourth dielectric layer 144 and the fourth circuit layer 154 may be disposed on the fifth dielectric layer 145. A portion (e.g., a via portion) of the fourth circuit layer 154 extends through the fifth dielectric layer 145 to be exposed from a bottom surface of the fifth dielectric layer 145 (e.g., the second surface 12 of the wiring structure 1). A material of the fifth dielectric layer 145 may be the same as or similar to the material of the fourth dielectric layer 144. As shown in FIG. 2 and FIG. 3, the second electronic device 26 may be electrically connected to the first electronic device 24 through the interconnection portion of the circuit layer (including, for example, the interconnection portions 15a of the first circuit layer 151, the second circuit layer 152, the third circuit layer 153 and the fourth circuit layer 154). The second electronic device 26 and the first electronic device 24 may be electrically connected to the solder materials 36 through the via portions of the periphery portion of the circuit layer (including, for example, the periphery portions 15b of the first circuit layer 151, the second circuit layer 152, the third circuit layer 153 and the fourth circuit layer 154).

The protrusion pads 20 may be disposed on and protrude from the first dielectric layer 141 (e.g., the topmost dielectric layer or the outermost dielectric layer) of the wiring structure 1. The protrusion pads 20 may be disposed on and protrude from the first surface 11 of the wiring structure 1, and extend through the first dielectric layer 141 (e.g., the topmost dielectric layer or the outermost dielectric layer) to electrically connect the first circuit layer 151. The protrusion pads 20 may include a plurality of first protrusion pads 21 corresponding to the first electronic device 24 and a plurality of second protrusion pads 22 corresponding to the second electronic device 26.

The first electronic device 24 and the second electronic device 26 are disposed adjacent to the first surface 11 of the wiring structure 1 side by side, and are electrically connected to the circuit layer 15 of the wiring structure 1. The first electronic device 24 may be a semiconductor device such as an application specific integrated circuit (ASIC) die. As shown in FIG. 2 and FIG. 3, the first electronic device 24 may have a first surface 241 (e.g., an active surface), a second surface 242 (e.g., a backside surface) opposite to the first surface 241, and at least one lateral side surface (e.g., a plurality of lateral side surfaces 243, 243') extending between the first surface 241 and the second surface 242.

Further, the first electronic device 24 may include a main body 249, a first active circuit region 248, a plurality of first electrical contacts 244 and at least one first protrusion portion (e.g., a plurality of first protrusion portions 28, 28'). The main body 249 may include a silicon material. The first active circuit region 248 may be disposed on the main body 249 and adjacent to the first surface 241, and may include a plurality of active circuit layers electrically connected with each other. The first electrical contacts 244 are disposed adjacent to the first surface 241, and electrically connected to the active circuit layers in the first active circuit region 248. The first electrical contacts 244 may be exposed or may protrude from the first surface 241 for electrical connection. The first electrical contacts 244 may be pads, bumps, studs, pillars or posts. In some embodiments, the first electrical contacts 244 of the first electronic device 24 may be electrically connected and physically connected to the first protrusion pads 21 through a plurality of solder materials 245. In other words, the first electronic device 24 may be electrically connected to the wiring structure 1 by flip-chip bonding.

The first protrusion portions 28, 28' protrude from the lateral side surface (e.g., the lateral side surfaces 243, 243') of the first electronic device 24. For example, the first protrusion portion 28 protrudes from the lateral side surface 243 toward the second electronic device 26, and the first protrusion portion 28' protrudes from the lateral side surface 243'. In some embodiments, the first protrusion portion 28 may be disposed above the interconnection portions 15a of the first circuit layer 151 that is located in the high density region 16. In addition, the first protrusion portion 28 and the lateral side surface 243 of the first electronic device 24 may define a first indentation structure 246. As shown in FIG. 2 and FIG. 3, a portion of the first active circuit region 248 may be disposed in the first protrusion portions 28, 28' under the first indentation structure 246, and electrically connected to the wiring structure 1 through at least one first electrical contact 244. That is, the first indentation structure 246 may be solely defined by the main body 249. The first indentation structure 246 does not extend to the first active circuit region 248. As shown in FIG. 2 and FIG. 3, at least one first electrical contact 244 is disposed on the lower surface 282 of the first protrusion portion 28 and electrically connects the first active circuit region 248 and the wiring structure 1.

The second electronic device 26 may be a semiconductor device such as a high bandwidth memory (HBM) die. As shown in FIG. 2 and FIG. 3, the second electronic device 26 may have a first surface 261, a second surface 262 opposite to the first surface 261, and at least one lateral side surface (e.g., a plurality of lateral side surfaces 263, 263') extending between the first surface 261 and the second surface 262. Further, the second electronic device 26 may include a second active circuit region 268 and a plurality of second electrical contacts 264. The second active circuit region 268 may be disposed adjacent to the first surface 261, and may include a plurality of active circuit layers electrically connected with each other. The second electrical contacts 264 are disposed adjacent to the first surface 261, and electrically connected to the active circuit layers in the second active circuit region. The second electrical contacts 264 may be exposed or may protrude from the first surface 261 for electrical connection. The second electrical contacts 264 may be pads, bumps, studs, pillars or posts. In some embodiments, the second electrical contacts 264 of the second electronic device 26 may be electrically connected and physically connected to the second protrusion pads 22 through a plurality of solder materials 265. In other words, the second electronic device 26 may be electrically connected to the wiring structure 1 by flip-chip bonding.

The second electronic device 26 may further include at least one second protrusion portion (e.g., a plurality of second protrusion portions 29, 29') protruding from the lateral side surface (e.g., the lateral side surfaces 263, 263') of the second electronic device 26. For example, the second protrusion portion 29 protrudes from the lateral side surface 263 toward the first electronic device 24, and the second protrusion portion 29' protrudes from the lateral side surface 263'. In some embodiments, the second protrusion portion 29 may be disposed above the interconnection portions 15a of the first circuit layer 151 that is located in the high density region 16. In addition, the second protrusion portion 29 and the lateral side surface 263 of the second electronic device 26 may define a second indentation structure 266. Further, a portion of the second active circuit region 268 may be disposed in the second protrusion portions 29, 29' under the second indentation structure 266, and electrically connected to the wiring structure 1 through at least one second electrical contact 264. That is, the second indentation structure 266 does not extend to the second active circuit region 268. As shown in FIG. 2 and FIG. 3, at least one second electrical contact 264 is disposed on the lower surface 292 of the second protrusion portion 29 and electrically connects the second active circuit region 268 and the wiring structure 1. As shown in FIG. 2 and FIG. 3, the first protrusion portion 28 and the second protrusion portion 29 are disposed between the first electronic device 24 and the second electronic device 26.

The first protection material 32 (e.g., an underfill with or without fillers) is disposed in a first space 25 between the first electronic device 24 and the wiring structure 1, and a second space 27 between the second electronic device 26 and the wiring structure 1 so as to cover and protect the first joints formed by the first electrical contacts 244, the first protrusion pads 21 and the solder materials 245, and the second joints formed by the second electrical contacts 264, the second protrusion pads 22 and the solder materials 265.

In addition, the first protection material 32 may extend from the first space 25 to the second space 27, and may extend into a gap 30 between the lateral side surface 243 of the first electronic device 24 and the lateral side surface 263 of the second electronic device 26. That is, the first protection material 32 may cover the first protrusion portion 28 and the second protrusion portion 29, and may extend into the first indentation structure 246 and the second indentation structure 266.

The encapsulant 34 covers at least a portion of the first surface 11 of the wiring structure 1, at least a portion of the first electronic device 24, at least a portion of the second electronic device 26 and the first protection material 32. A material of the encapsulant 34 may be a molding compound with or without fillers. The encapsulant 34 has a first surface 341 (e.g., a top surface) and a lateral side surface 343. As shown in FIG. 2 and FIG. 3, the first surface 341 of the encapsulant 34, the second surface 242 of the first electronic device 24, the second surface 262 of the second electronic device 26 may be substantially coplanar with each other. In some embodiments, the top surface of the first protection material 32 in the gap 30 may be recessed from the second surface 242 of the first electronic device 24 and the second surface 262 of the second electronic device 26. Thus, a portion of the encapsulant 34 may extend into the gap 30 between the first electronic device 24 and the second electronic device 26. In addition, the lateral side surface 343 of the encapsulant 34 may be substantially coplanar with the lateral side surface 13 of the wiring structure 1.

The solder materials 36 (e.g., solder balls) are disposed adjacent to the second surface 12 of the wiring structure 1 for external connection. As shown in FIG. 2 and FIG. 3, the solder materials 36 are disposed on the exposed portions (e.g., the bottom portions of the via portions) of the fourth circuit layer 154.

Figure 4:
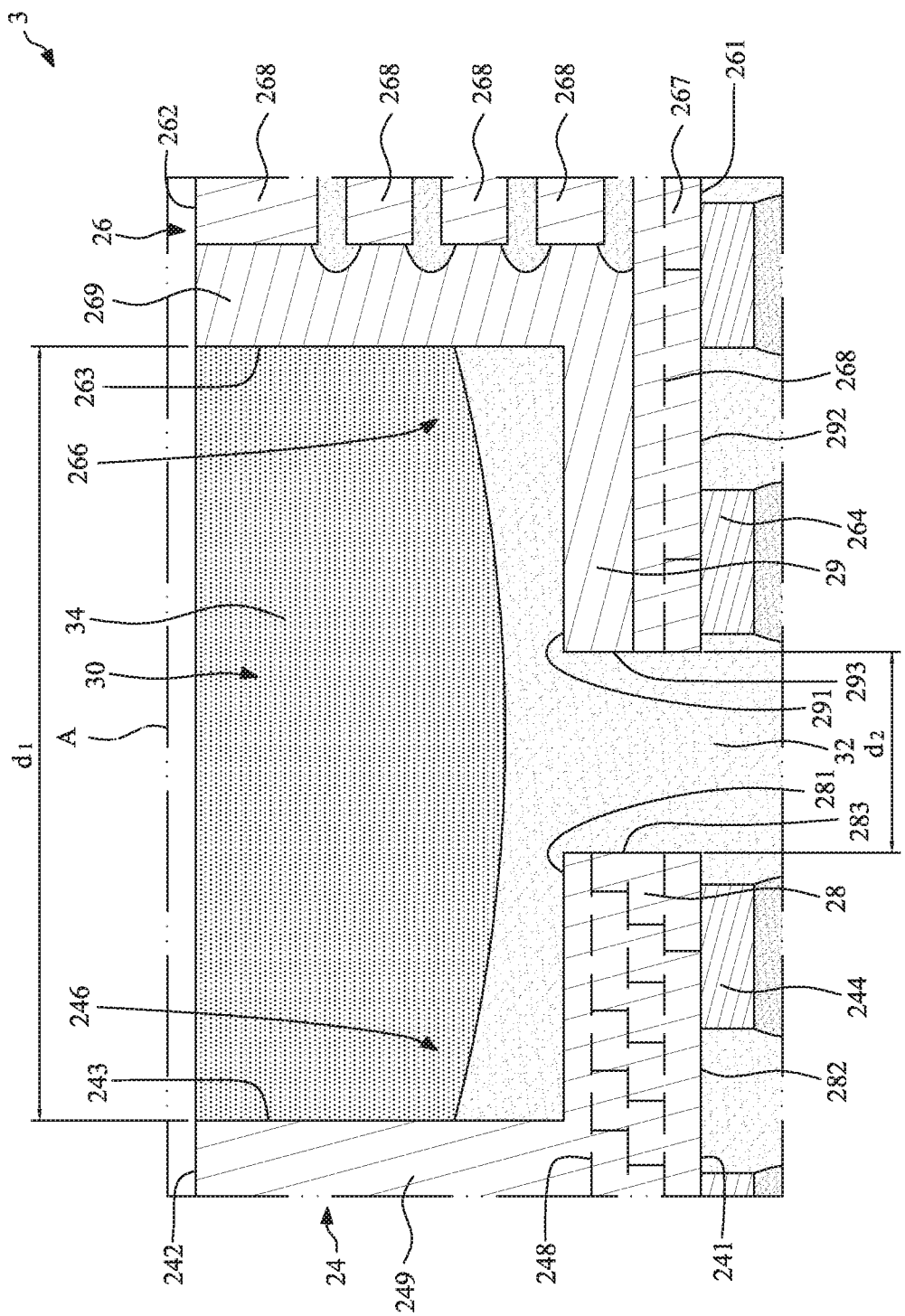
FIG. 4 illustrates an enlarged view of a region "A" in FIG. 2.

FIG. 4 illustrates an enlarged view of a region "A" in FIG. 2. The first protrusion portion 28 of the first electronic device 24 has an upper surface 281, a lower surface 282, and an outer side surface 283 extending between the upper surface 281 and the lower surface 282. The lower surface 282 of the first protrusion portion 28 is a portion of the first surface 241 of the first electronic device 24. The upper surface 281 of the first protrusion portion 28 and the lateral side surface 243 of the first electronic device 24 define the first indentation structure 246. Further, the second electronic device 26 may include a logic die 267, four dynamic random access memories (DRAMs) 268 and a molding compound 269. The DRAMs 268 are stacked on one another and on the logic die 267. The molding compound 269 covers the DRAMs 268 and a portion of the logic die 267. The second protrusion portion 29 of the second electronic device 26 may include a portion of the logic die 267 and a portion of the molding compound 269. That is, the second indentation structure 266 may be solely defined by the molding compound 269, and the second indentation structure 266 may not extend to the logic die 267. The second protrusion portion 29 of the second electronic device 26 has an upper surface 291, a lower surface 292, and an outer side surface 293 extending between the upper surface 291 and the lower surface 292. The lower surface 292 of the second protrusion portion 29 is a portion of the first surface 261 of the second electronic device 26. The upper surface 291 of the second protrusion portion 29 and the lateral side surface 263 of the second electronic device 26 define the second indentation structure 266.

A first distance d1 (e.g., a width of the gap 30) between the lateral side surface 243 of the first electronic device 24 and the second electronic device 26 (e.g., the lateral side surface 263 of the second electronic device 26) is greater than a second distance d2 between the first protrusion portion 28 of the first electronic device 24 and the second electronic device 26 (e.g., the second protrusion portion 29 of the second electronic device 26). For example, the first distance d1 may be greater than about 100 μm, greater than about 150 μm, greater than about 200 μm, greater than about 250 μm, or greater than about 300 μm. The second distance d2 may be less than about 100 μm, less than about 80 μm, less than about 70 μm, less than about 60 μm, or less than about 50 μm. In some embodiments, a ratio of the first distance d1 to the second distance d2 may be greater than about 1.5, greater than about 2, greater than about 2.5, greater than about 3, greater than about 3.5 or greater than about 4.

Figure 5:
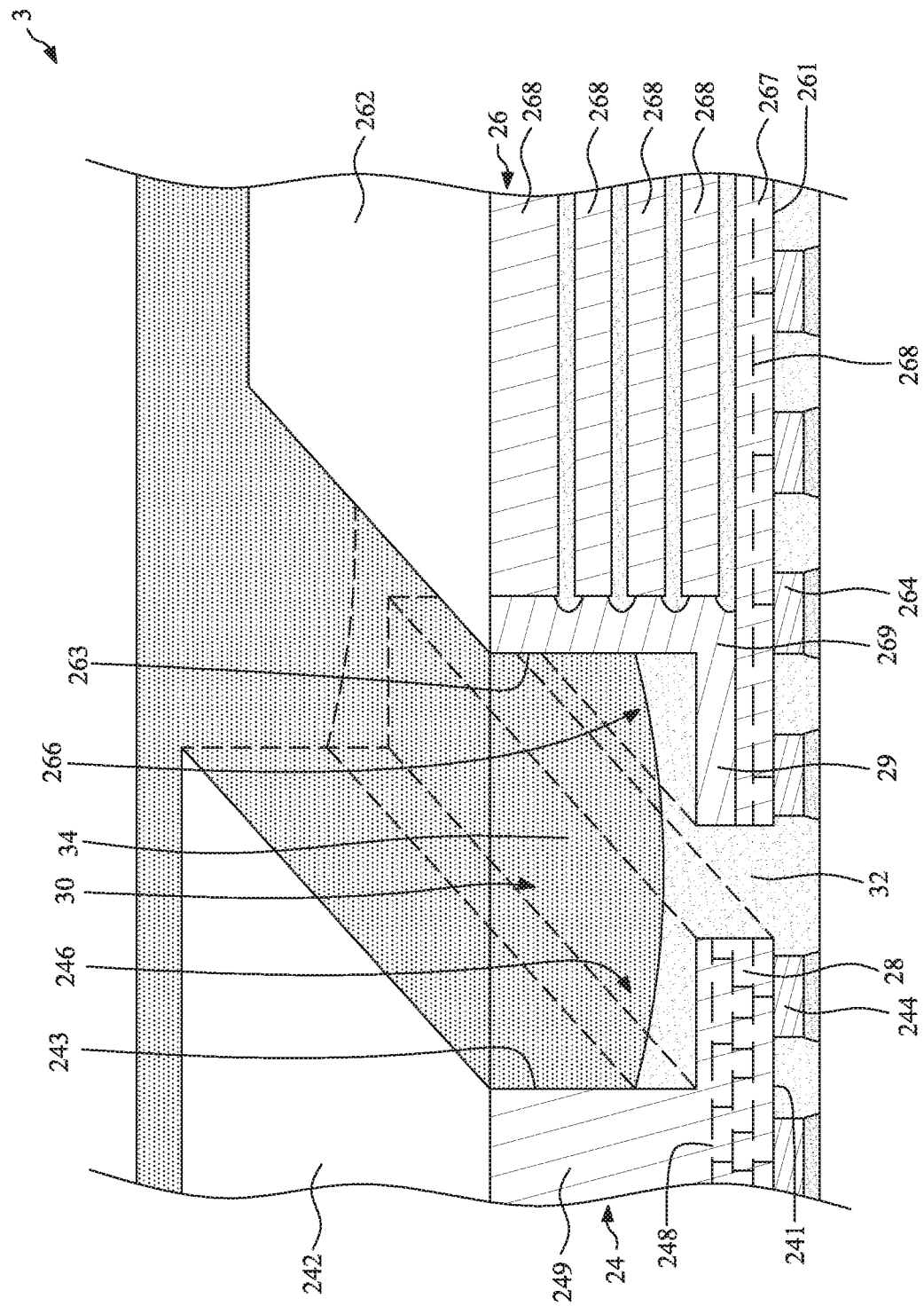
FIG. 5 illustrates a schematic perspective view of FIG. 4.

FIG. 5 illustrates a schematic perspective view of FIG. 4. As shown in FIG. 1 and FIG. 5, the first protrusion portion 28 of the first electronic device 24 is a strip structure that extends from one side of the lateral side surface 243 (e.g., a front surface) of the first electronic device 24 to the other side of the lateral side surface 243 (e.g., a rear surface) of the first electronic device 24. That is, the first indentation structure 246 extends from the front surface of the first electronic device 24 to the rear surface of the first electronic device 24. Thus, the first indentation structure 246 extends through the first electronic device 24.

In the embodiment illustrated in FIG. 1 to FIG. 5, the first indentation structure 246 and the second indentation structure 266 may increase the first distance d1 (e.g., the width of the gap 30) between the lateral side surface 243 of the first electronic device 24 and the lateral side surface 263 of the second electronic device 26. Thus, the first protection material 32 in the gap 30 may not reach to the level of the second surface 242 of the first electronic device 24 and the second surface 262 of the second electronic device 26. That is, the top surface of the first protection material 32 in the gap 30 may be recessed from the second surface 242 of the first electronic device 24 and the second surface 262 of the second electronic device 26. Further, a portion of the encapsulant 34 may extend into the gap 30 to contact the first protection material 32. For example, if a crack is formed at the top surface of the encapsulant 34 in the gap 30 and extend or grow downward, it may not easily to extend across or grow across the boundary between the encapsulant 34 and the first protection material 32. In some embodiments, if a crack is formed at the interface between the first electronic device 24 and the encapsulant 34 in the first indentation structure 246 and extend or grow downward to reach the first protrusion portion 28, it may not easily to further extend along or grow along the upper surface 281 of the first protrusion portion 28. That is, such crack may be stopped by the first protrusion portion 28. Similarly, if a crack is formed at the interface between the second electronic device 26 and the encapsulant 34 in the second indentation structure 266 and extend or grow downward to reach the second protrusion portion 29, it may not easily to further extend along or grow along the upper surface 291 of the second protrusion portion 29. That is, such crack may be stopped by the second protrusion portion 29. As a result, the first protrusion portion 28 and the second protrusion portion 29 may prevent the crack from reaching the wiring structure 1, and may protect the interconnection portion 15a of the circuit layer 15 from being damaged or broken. Therefore, the package structure 3 has an improved crack resistance, and the reliability and yield of the package structure 3 is improved.

Figure 6:
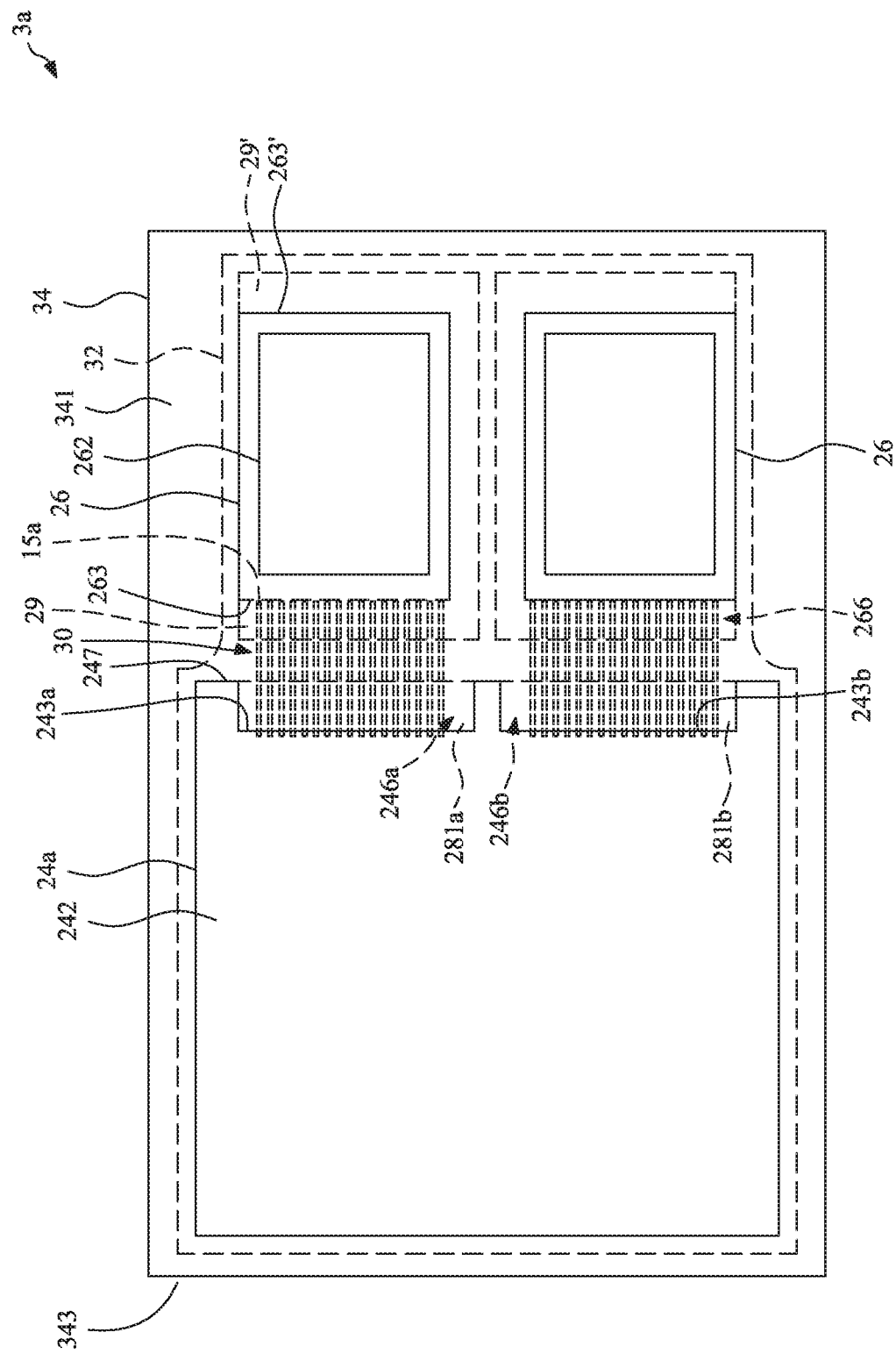
FIG. 6 illustrates a top view of a package structure according to some embodiments of the present disclosure.
Figure 7:
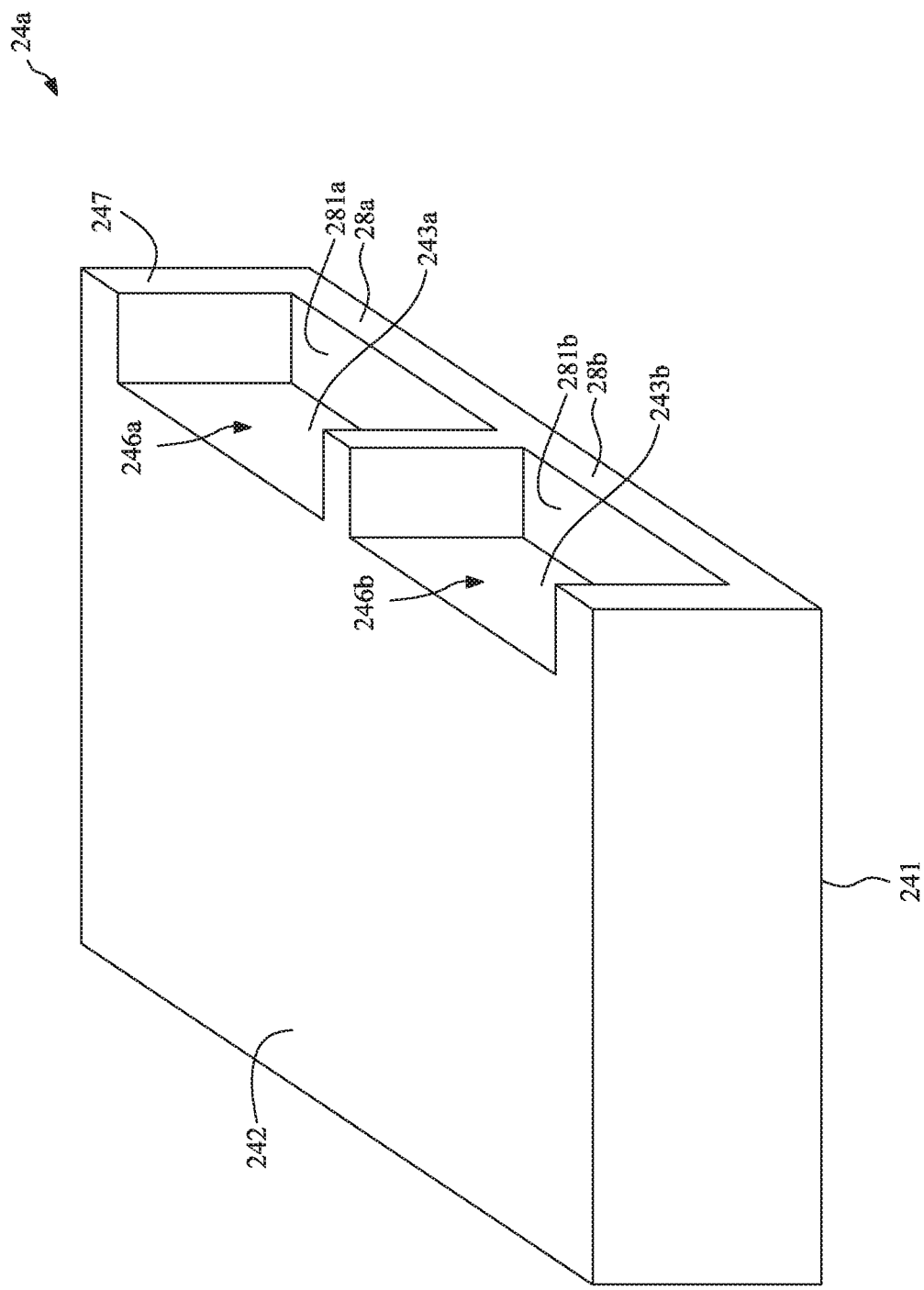
FIG. 7 illustrates a perspective view of the first electronic device of FIG. 6.

FIG. 6 illustrates a top view of a package structure 3*a* according to some embodiments of the present disclosure. FIG. 7 illustrates a perspective view of the first electronic device 24*a* of FIG. 6. The package structure 3*a* of FIG. 6 is similar to the package structure 3 of FIG. 1 to FIG. 5, except for a structure of the first electronic device 24*a*. As shown in FIG. 6 and FIG. 7, the first electronic device 24*a* has an outer side surface 247 and two lateral side surfaces 243*a*, 243*b*, includes two first protrusion portions 28*a*, 28*b*, and defines two first indentation structures 246*a*, 246*b*. The lateral side surfaces 243*a*, 243*b* are recessed from the outer side surface 247. The outer side surfaces of the first protrusion portions 28*a*, 28*b* are portions of the outer side surface 247. The first indentation structures 246*a*, 246*b* are separated from each other. The first indentation structures 246*a* is defined by the lateral side surfaces 243*a* and the upper surface 281*a* of the first protrusion portions 28*a*, and is disposed adjacent to a second electronic device 26. The first indentation structures 246*b* is defined by the lateral side surfaces 243*b* and the upper surface 281*b* of the first protrusion portions 28*b*, and is disposed adjacent to another second electronic device 26. Thus, the first indentation structures 246*a*, 246*b* do not extend through the first electronic device 24*a*.

Figure 8:
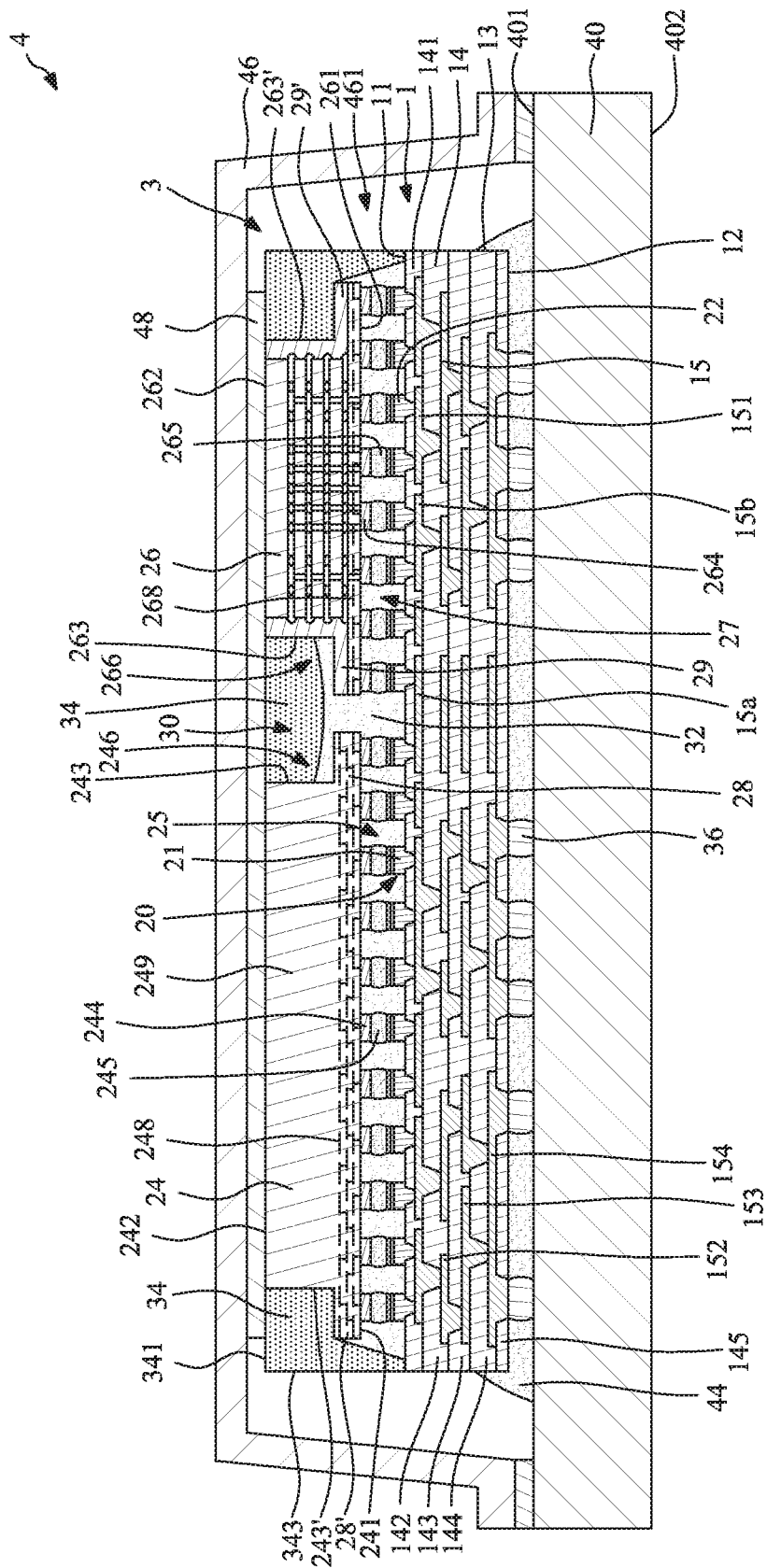
FIG. 8 illustrates a cross-sectional view of an assembly structure according to some embodiments of the present disclosure.

FIG. 8 illustrates a cross-sectional view of an assembly structure 4 according to some embodiments of the present disclosure. The assembly structure 4 may be a semiconductor package, and may include a base substrate 40, a package structure 3, a second protection material 44, and heat sink 46. The base substrate 40 may include a glass reinforced epoxy material (such as FR4), bismaleimide triazine (BT), epoxy resin, silicon, printed circuit board (PCB) material, glass, ceramic or photoimageable dielectric (PID) material. The base substrate 40 may have a first surface 401 and a second surface 402 opposite to the first surface 401. The package structure 3 of FIG. 8 may be same as or similar to the package structure 3 of FIG. 1 to FIG. 5. The package structure 3 may be electrically connected to the first surface 401 of the base substrate 40 through the solder materials 36. The second protection material 44 (e.g., an underfill) is disposed in a space between the package structure 3 and the base substrate 40 so as to cover and protect the solder materials 36.

The heat sink 46 may be a cap or hat structure, and may define a cavity 461 for accommodating the package structure 3. A material of the heat sink 46 may include metal such as copper, or aluminum. A portion of the heat sink 46 may be attached to the top surface of the package structure 3 through a thermal material 48 (e.g., thermal interface material (TIM)) so as to dissipate the heat generated by the first electronic device 24 and the second electronic device(s) 26. Another portion (e.g., bottom portion) of the heat sink 46 may be attached to the base substrate 40 through an adhesive material. In some embodiments, a plurality of external connectors (e.g., solder balls) may be formed or disposed adjacent to the second surface 402 of the base substrate 40 for external connection.

During a manufacturing process, when the heat sink 46 is attached to the package structure 3, a pressing force may be transmitted from the heat sink 46 to the package structure 3. If a crack is formed due to the pressing force, such crack may be stopped by the first protrusion portion 28 and the second protrusion portion 29 as stated above. In addition, during the thermal cycle, if a crack is formed due to the extrusion between the package structure 3 the heat sink 46 since a coefficient of thermal expansion (CTE) of the package structure 3 is greater than a CTE of the heat sink 46, such crack may also be stopped by the first protrusion portion 28 and the second protrusion portion 29 as stated above. Therefore, the reliability and yield of the assembly structure 4 is improved.

Figure 9:
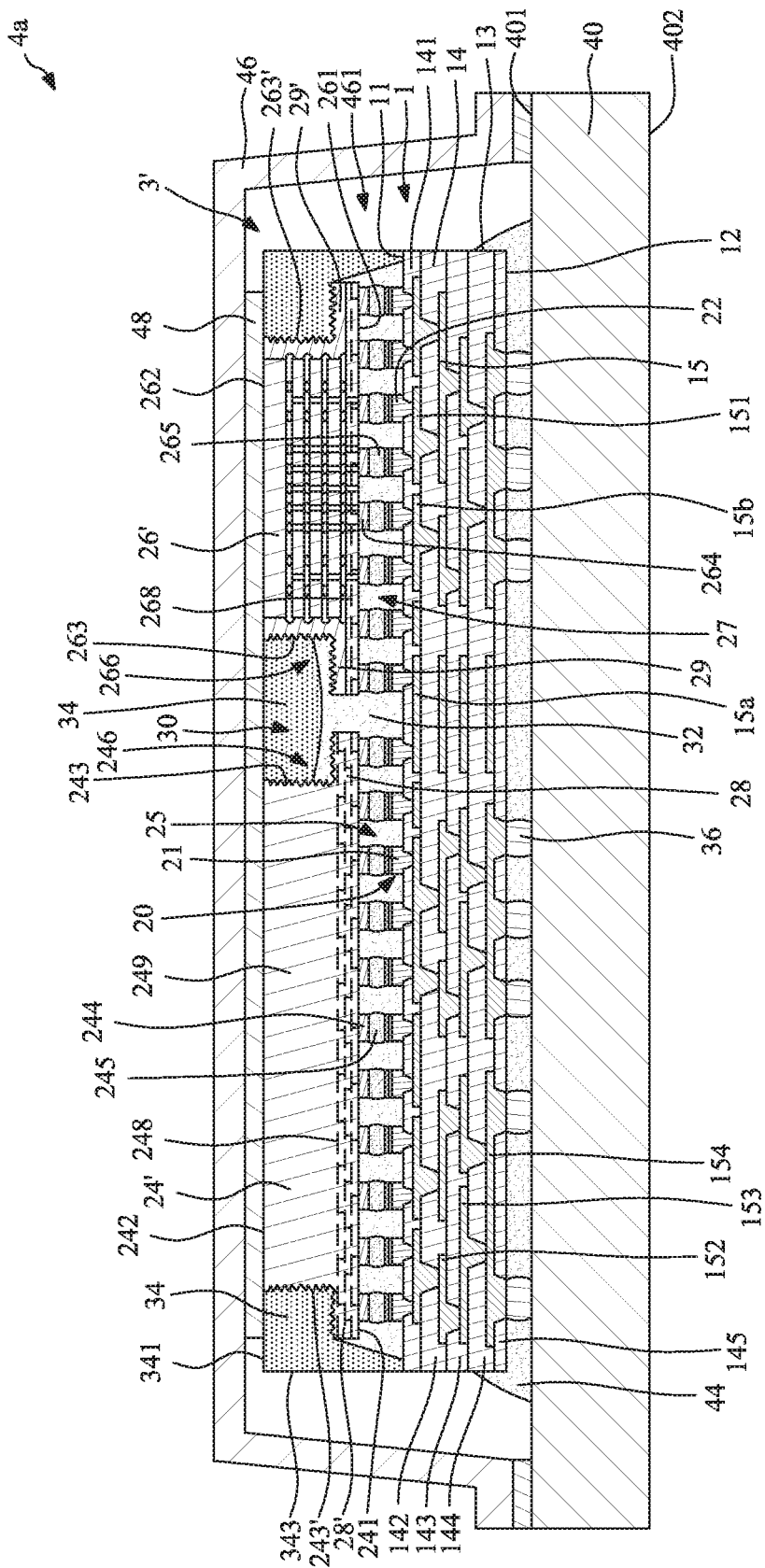
FIG. 9 illustrates a cross-sectional view of an assembly structure according to some embodiments of the present disclosure.

FIG. 9 illustrates a cross-sectional view of an assembly structure 4*a* according to some embodiments of the present disclosure. The assembly structure 4*a* of FIG. 9 is similar to the assembly structure 4 of FIG. 8, except for the surface condition of the first electronic device 24' and the second electronic device 26' of the package structure 3'. As shown in FIG. 9, the lateral side surfaces 243, 243' of the first electronic device 24' and the upper surfaces 281 of the first protrusion portions 28, 28' are rough surfaces. In some embodiments, a surface roughness of the lateral side surfaces 243, 243' of the first electronic device 24' and the upper surfaces 281 of the first protrusion portions 28, 28' may be greater than about 3 μm, greater than about 5 μm, greater than about 8 μm, greater than about 10 μm, or greater than about 15 μm. Thus, the bonding force between the first electronic device 24' and the encapsulant 34 is improved. Further, the bonding force between the first protection material 32 and the first electronic device 24', and the bonding force between the first protection material 32 and the first protrusion portions 28 are improved. Similarly, the lateral side surfaces 263, 263' of the second electronic device 26' and the upper surfaces 291 of the second protrusion portions 29, 29' are rough surfaces. In some embodiments, a surface roughness of the lateral side surfaces 263, 263' of the second electronic device 26' and the upper surfaces 291 of the second protrusion portions 29, 29' may be greater than about 3 μm, greater than about 5 μm, greater than about 8 μm, greater than about 10 μm, or greater than about 15 μm.

Figure 10:
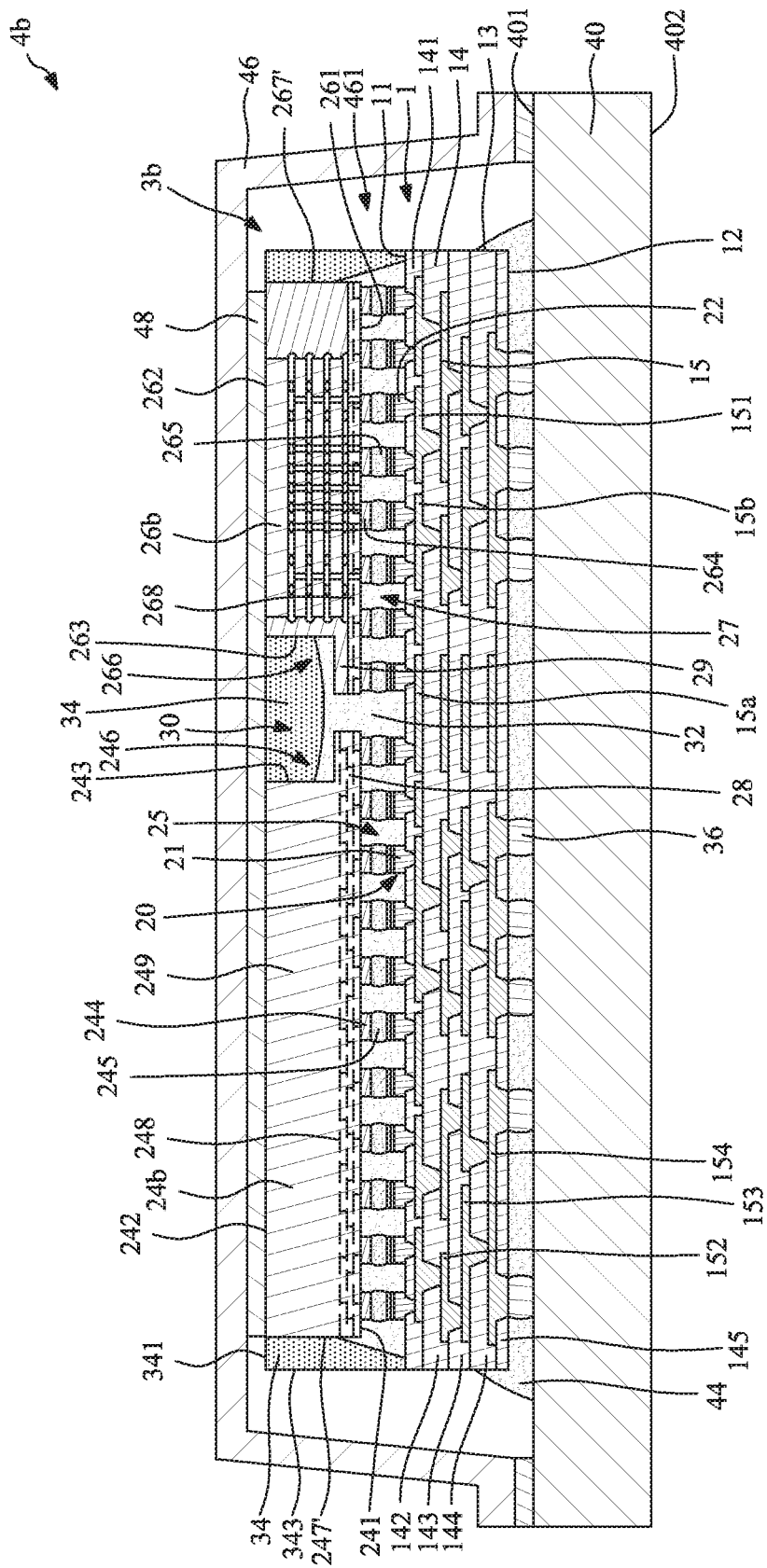
FIG. 10 illustrates a cross-sectional view of an assembly structure according to some embodiments of the present disclosure.

FIG. 10 illustrates a cross-sectional view of an assembly structure 4*b* according to some embodiments of the present disclosure. The assembly structure 4*b* of FIG. 10 is similar to the assembly structure 4 of FIG. 8, except for the structures of the first electronic device 24*b* and the second electronic device 26*b* of the package structure 3*b*. As shown in FIG. 10, the first electronic device 24*b* does not include the lateral side surface 243' and the first protrusion portion 28', thus, the first electronic device 24*b* has an outer side surface 247' which is a substantially flat surface. Similarly, the second electronic device 26*b* does not include the lateral side surface 263' and the second protrusion portion 29', thus, the second electronic device 26*b* has an outer side surface 267' which is a substantially flat surface.

Figure 11:
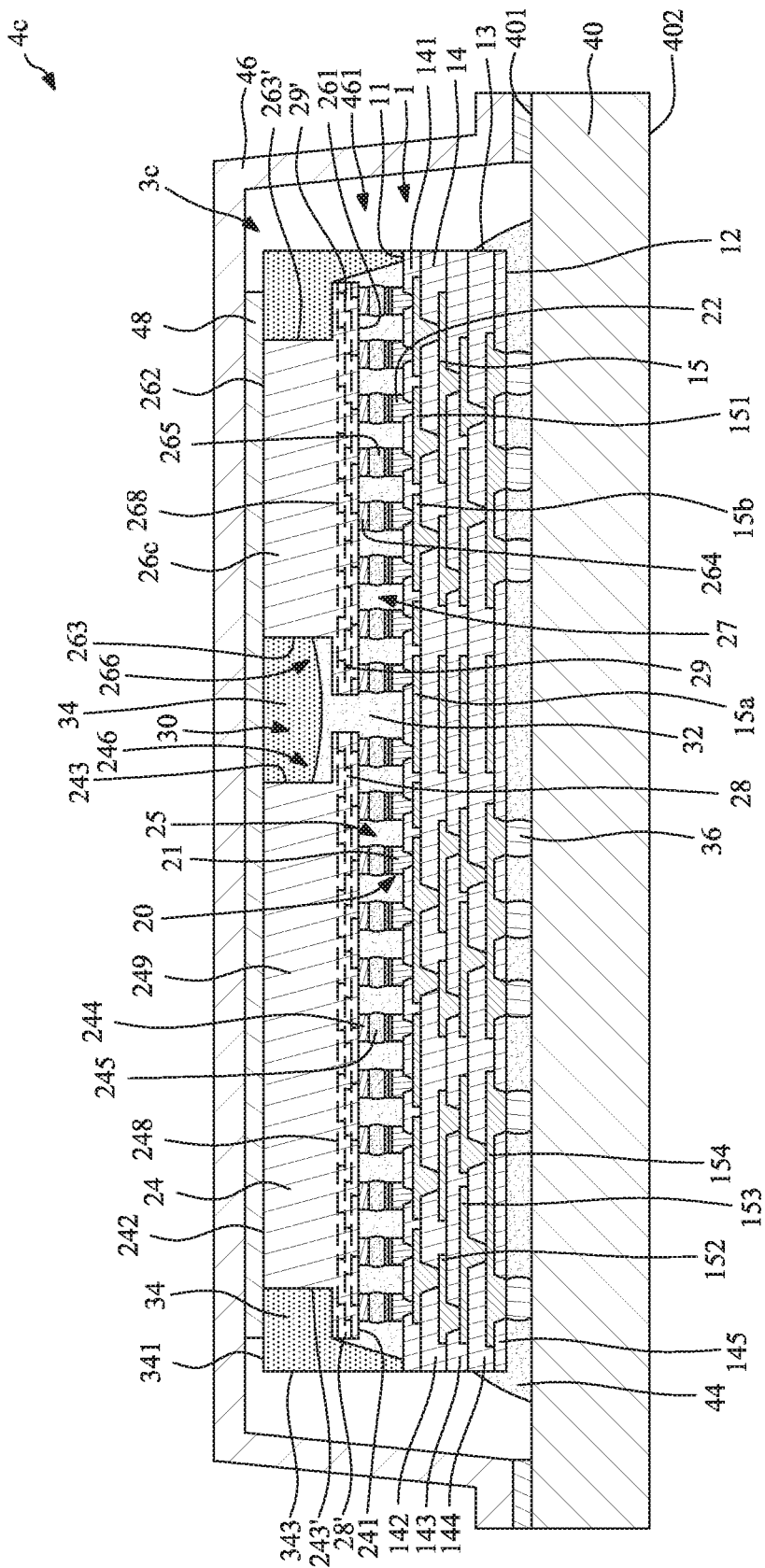
FIG. 11 illustrates a cross-sectional view of an assembly structure according to some embodiments of the present disclosure.

FIG. 11 illustrates a cross-sectional view of an assembly structure 4*c* according to some embodiments of the present disclosure. The assembly structure 4*c* of FIG. 11 is similar to the assembly structure 4 of FIG. 8, except for a structure of the second electronic device 26*c* of the package structure 3*c*. As shown in FIG. 11, the second electronic device 26*c* may be also an ASIC die.

Figure 12:
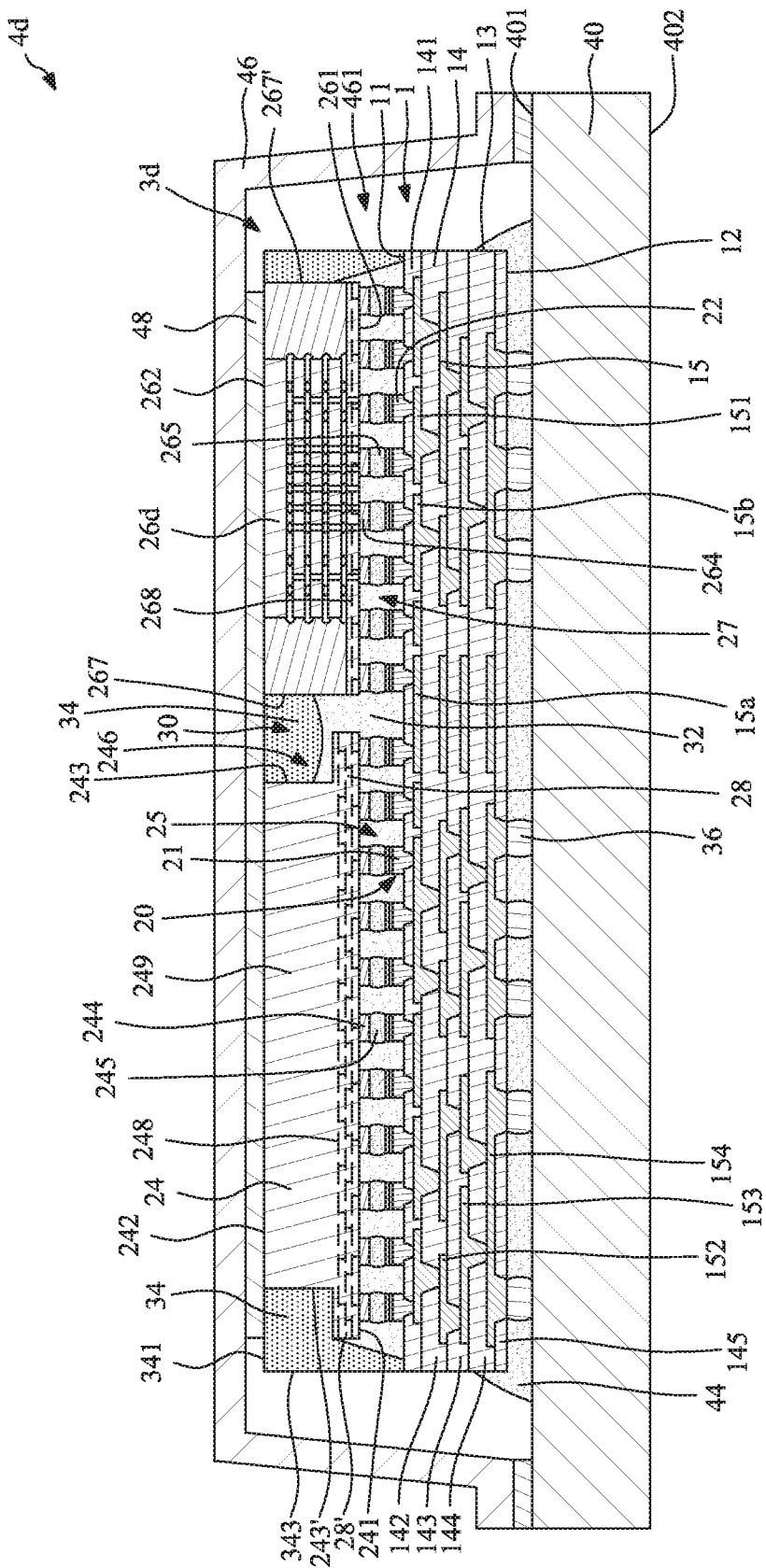
FIG. 12 illustrates a cross-sectional view of an assembly structure according to some embodiments of the present disclosure.

FIG. 12 illustrates a cross-sectional view of an assembly structure 4*d* according to some embodiments of the present disclosure. The assembly structure 4*d* of FIG. 12 is similar to the assembly structure 4*b* of FIG. 10, except for a structure of the second electronic device 26*d* of the package structure 3*d*. As shown in FIG. 12, the second electronic device 26*d* does not include the lateral side surface 263 and the second protrusion portion 29, thus, the second electronic device 26*d* has an outer side surface 267 which is a substantially flat surface. The outer side surface 267 extends between the first 261 and the second surface 262, and faces the first electronic device 24.

Figure 13:
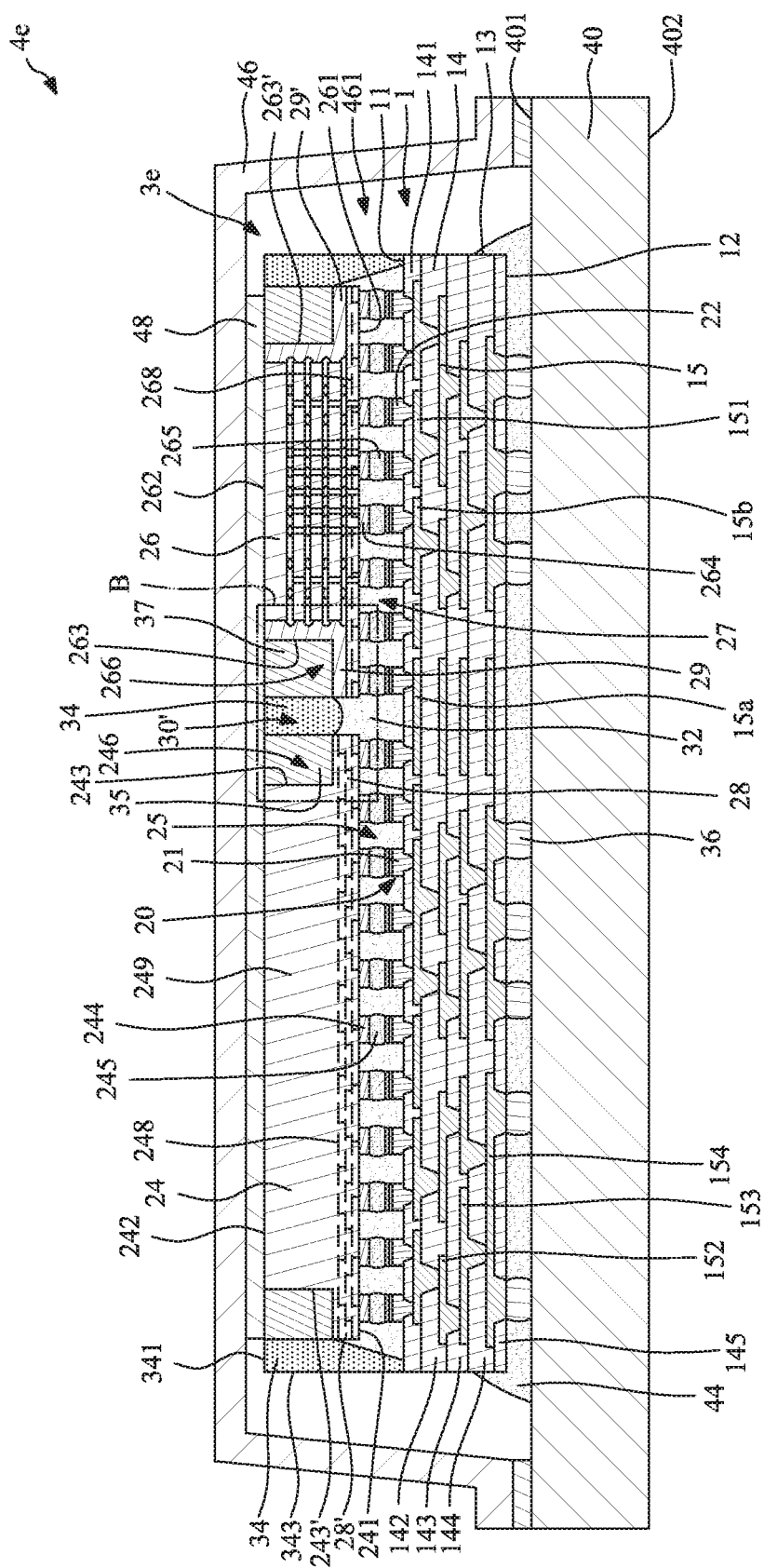
FIG. 13 illustrates a cross-sectional view of an assembly structure according to some embodiments of the present disclosure.
Figure 14:
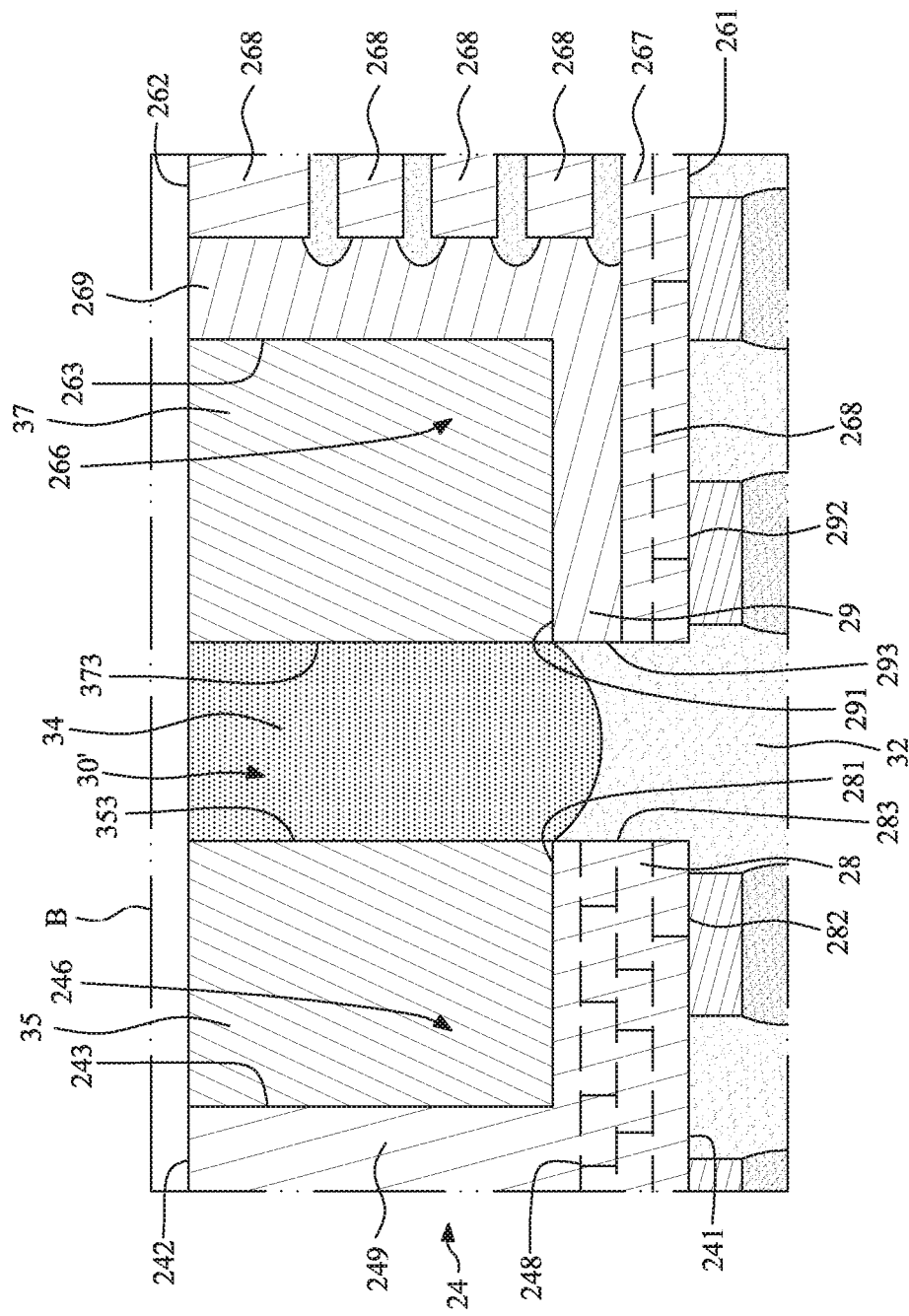
FIG. 14 illustrates an enlarged view of a region "B" in FIG. 14.

FIG. 13 illustrates a cross-sectional view of an assembly structure 4*e* according to some embodiments of the present disclosure. FIG. 14 illustrates an enlarged view of a region "B" in FIG. 13. The assembly structure 4e of FIG. 13 is similar to the assembly structure 4 of FIG. 8, except for a structure of the package structure 3e. The package structure 3e may further include a first underfill-repelling material 35 and a second underfill-repelling material 37. The first underfill-repelling material 35 is disposed in the first indentation structure 246, and faces the second electronic device 26. The second underfill-repelling material 37 is disposed in the second indentation structure 266, and faces the first electronic device 24.

In some embodiments, the outer side surface 283 of the first protrusion portion 28 is substantially coplanar with an outer side surface 353 of the first underfill-repelling material 35, and the outer side surface 293 of the second protrusion portion 29 is substantially coplanar with an outer side surface 373 of the second underfill-repelling material 37. In some embodiments, the first underfill-repelling material 35 and the second underfill-repelling material 37 are the materials that can prevent the first protection material 32 (e.g., underfill) to be adhered, attached or disposed thereon. The first underfill-repelling material 35 and the second underfill-repelling material 37 may be underfill-underfill-repelling materials may be graphene nanocomposite material. As shown in FIG. 13 and FIG. 14, the first protection material 32 does not extend or climb into the gap 30' between the first underfill-repelling material 35 and the second underfill-repelling material 37. Thus, the first protection material 32 does not contact the first underfill-repelling material 35 and the second underfill-repelling material 37.

In some embodiments, the encapsulant 34 may extends into the gap 30' between the first underfill-repelling material 35 and the second underfill-repelling material 37 to contact the first protection material 32. However, in other embodiment, the encapsulant 34 may not extend into the gap 30', thus, the gap 30' between the first underfill-repelling material 35 and the second underfill-repelling material 37 may be an empty space.

Figure 15:
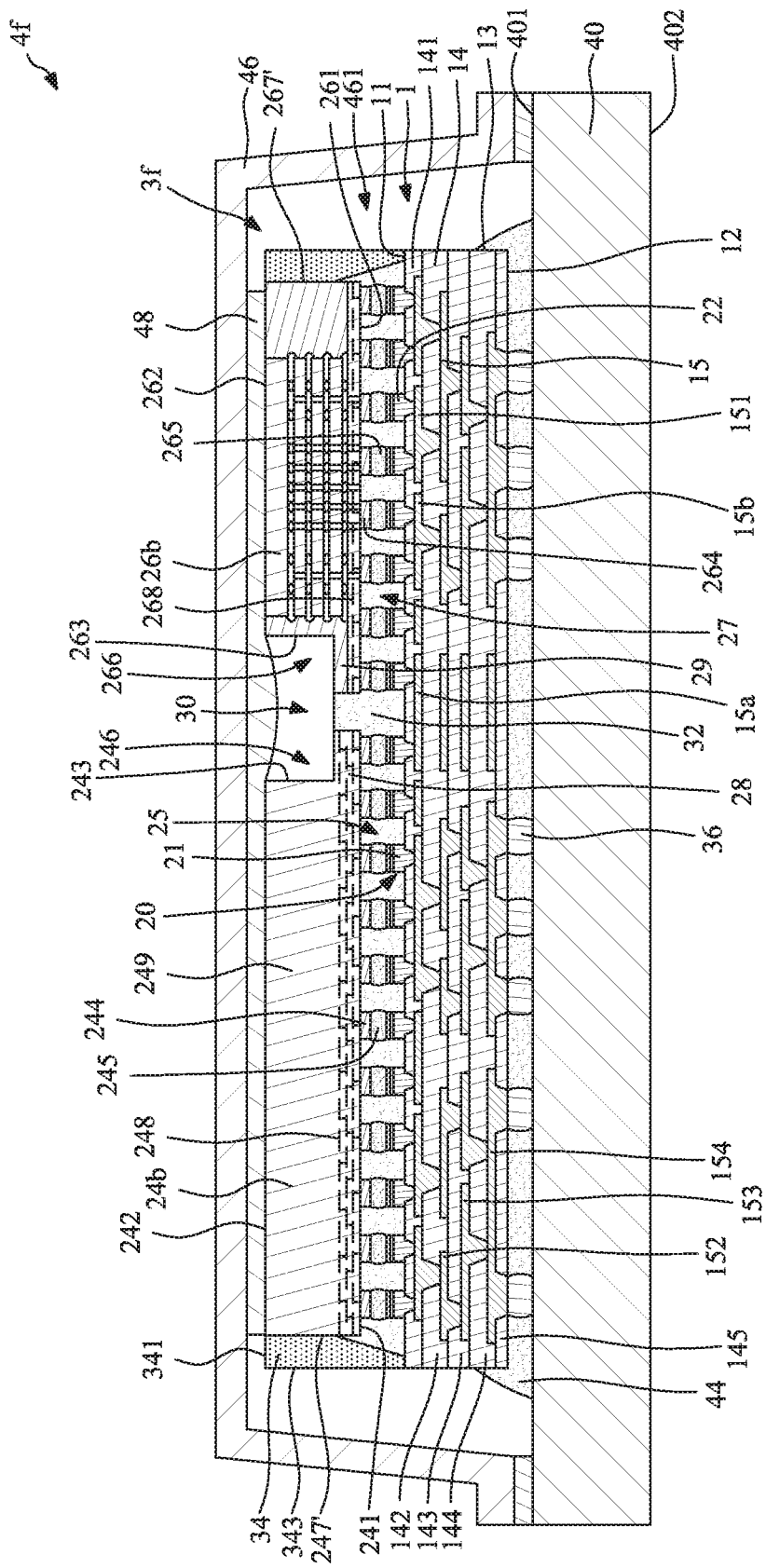
FIG. 15 illustrates a cross-sectional view of an assembly structure according to some embodiments of the present disclosure.

FIG. 15 illustrates a cross-sectional view of an assembly structure 4f according to some embodiments of the present disclosure. The assembly structure 4f of FIG. 15 is similar to the assembly structure 4b of FIG. 10, except for a structure of the package structure 3f. In the package structure 3f, the gap 30 between the lateral side surface 243 of the first electronic device 24b and the lateral side surface 263 of the second electronic device 26b may be a substantially empty space. In addition, a top surface of a portion of the first protection material 32 between the first protrusion portion 28 and the second protrusion portion 29 may be substantially coplanar with the upper surface 281 of the first protrusion portion 28 and the upper surface 291 of the second protrusion portion 29.

Figure 16:
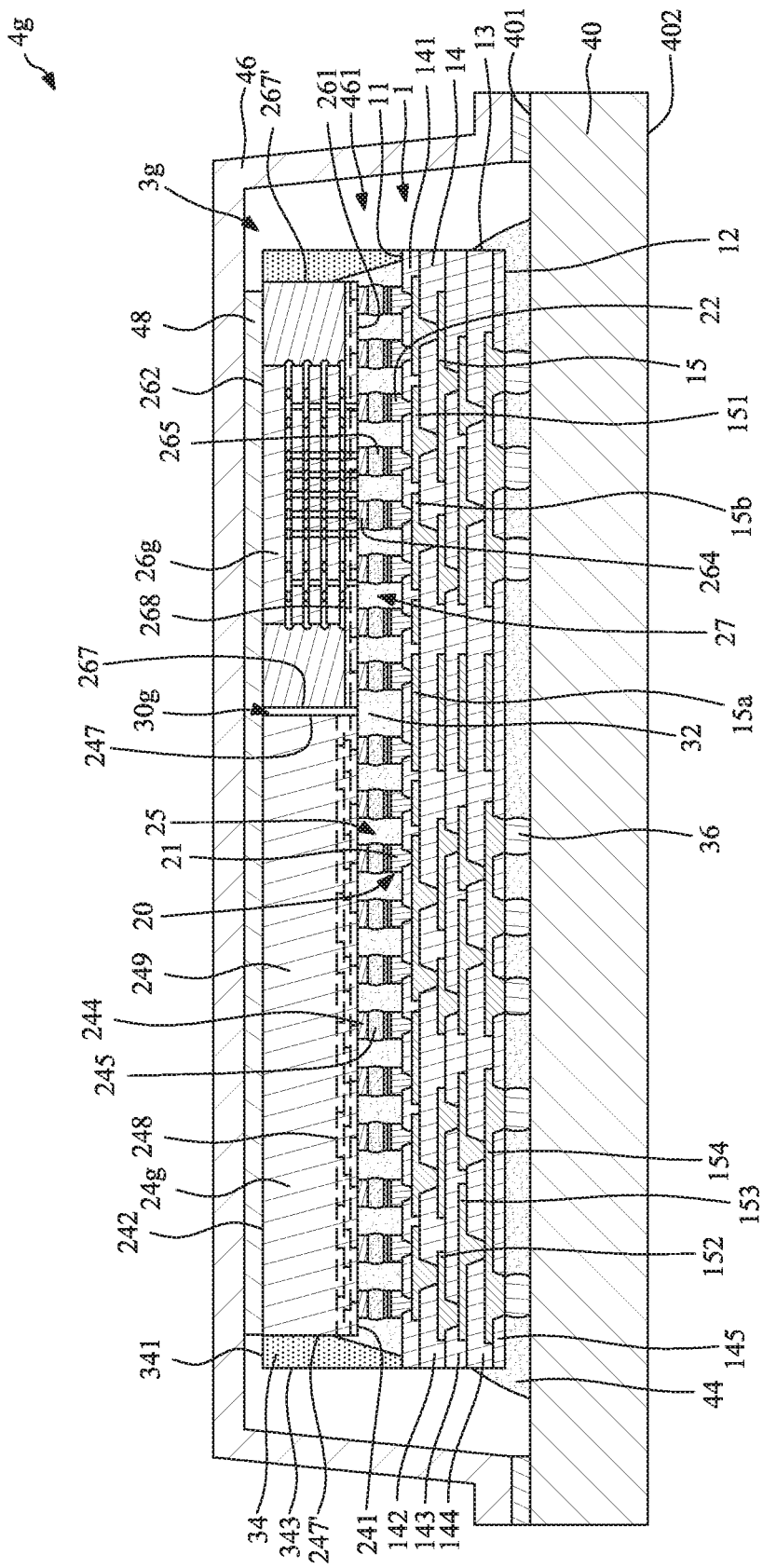
FIG. 16 illustrates a cross-sectional view of an assembly structure according to some embodiments of the present disclosure.

FIG. 16 illustrates a cross-sectional view of an assembly structure 4g according to some embodiments of the present disclosure. The assembly structure 4g of FIG. 16 is similar to the assembly structure 4b of FIG. 10, except for a structure of the package structure 3g. In the package structure 3g, the first electronic device 24g does not include the lateral side surface 243 and the first protrusion portion 28, thus, the first electronic device 24g has an outer side surface 247 which is a substantially flat surface extending between the first surface 241 and the second surface 242. Similarly, the second electronic device 26g does not include the lateral side surface 263 and the second protrusion portion 29, thus, the second electronic device 26g has an outer side surface 267 which is a substantially flat surface extending between the first surface 261 and the second surface 262. Further, a gap 30g is formed between the outer side surface 247 of the first electronic device 24g and the outer side surface 267 of the second electronic device 26g. In some embodiments, the first protection material 32 includes a plurality of fillers, and the encapsulant 34 includes a plurality of fillers. A particle size of the fillers of the encapsulant 34 may be greater than a particle size of the fillers of the first protection material 32. A width of the gap 30g between the first electronic device 24 and the second electronic device 26 may be less than the particle size of the fillers of the first protection material 32. Thus, the first protection material 32 and the encapsulant 34 may not extend into the gap 30g, and the gap 30g may be an empty space. In some embodiments, the gap 30g may be less than about 10 μm, or less than about 5 μm.

Figure 17:
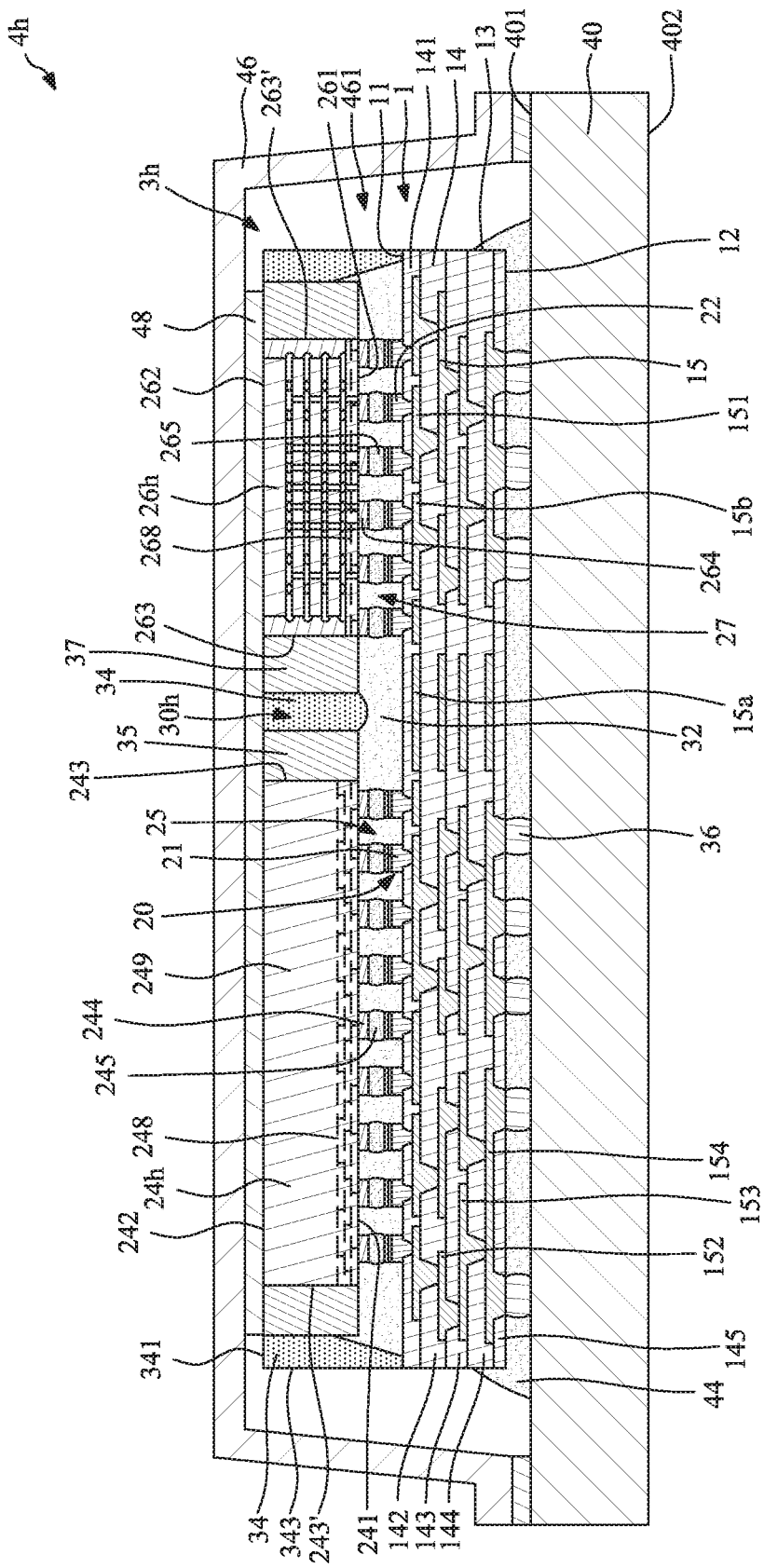
FIG. 17 illustrates a cross-sectional view of an assembly structure according to some embodiments of the present disclosure.

FIG. 17 illustrates a cross-sectional view of an assembly structure 4h according to some embodiments of the present disclosure. The assembly structure 4h of FIG. 17 is similar to the assembly structure 4e of FIG. 13, except for a structure of the package structure 3h. In the package structure 3h, the first underfill-repelling material 35 may be disposed on the entire lateral side surfaces 243, 243' of the first electronic device 24h and the entire lateral side surfaces 263, 263' of the second electronic device 26h. As shown in FIG. 17, the first protection material 32 does not extend or climb into the gap 30h between the first underfill-repelling material 35 and the second underfill-repelling material 37. Thus, the first protection material 32 does not contact the first underfill-repelling material 35 and the second underfill-repelling material 37. In some embodiments, the encapsulant 34 may extends into the gap 30h between the first underfill-repelling material 35 and the second underfill-repelling material 37 to contact the first protection material 32.

Figure 18:
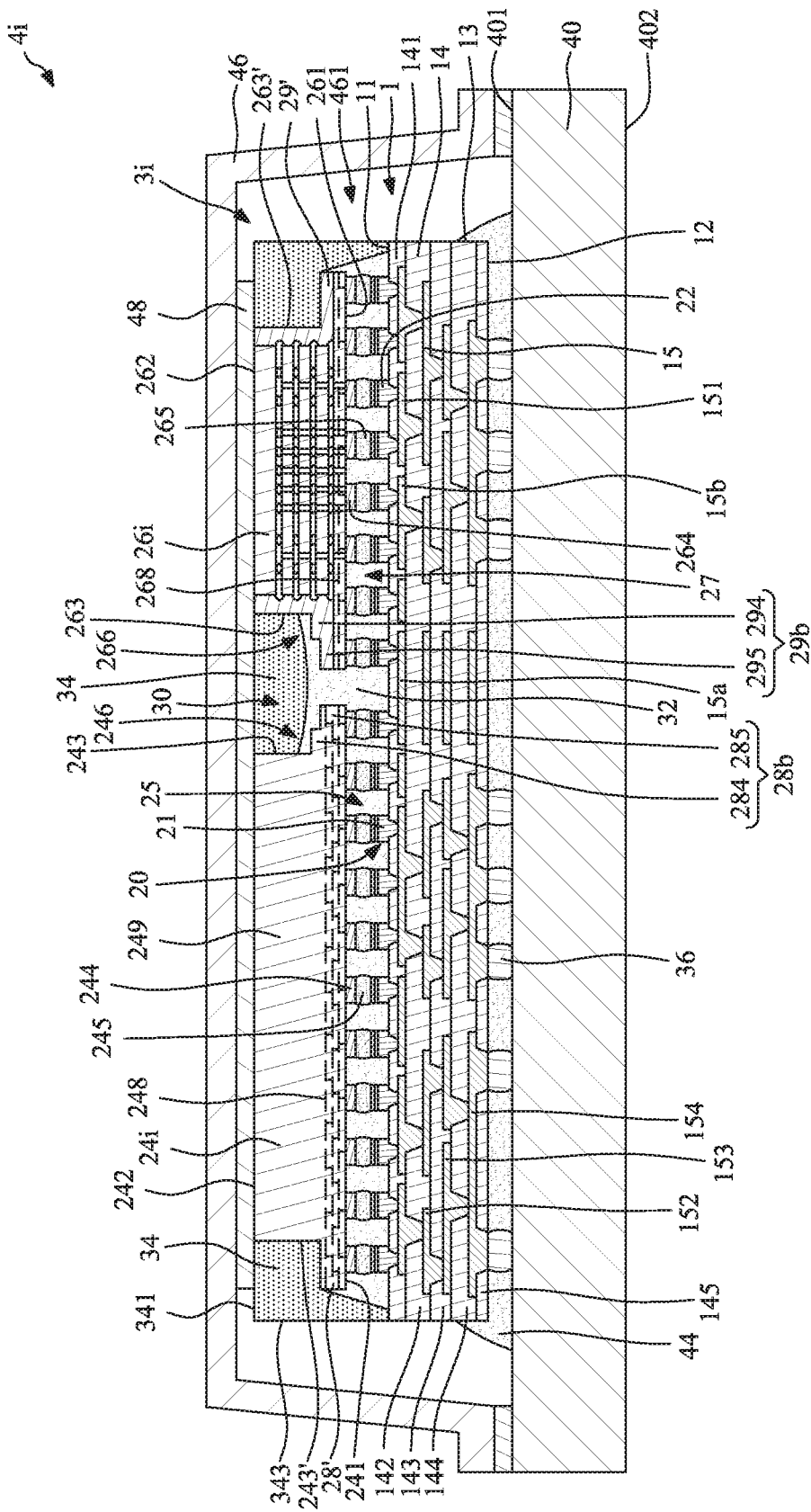
FIG. 18 illustrates a cross-sectional view of an assembly structure according to some embodiments of the present disclosure.

FIG. 18 illustrates a cross-sectional view of an assembly structure 4i according to some embodiments of the present disclosure. The assembly structure 4i of FIG. 18 is similar to the assembly structure 4 of FIG. 8, except for the structures of the first electronic device 24i and the second electronic device 26i of the package structure 3i. For example, the first protrusion portion 28b of the first electronic device 24i may include a first portion 284 and a second portion 285, and a thickness of the first portion 284 is greater than a thickness of the second portion 285 so as to form a step structure. Similarly, the second protrusion portion 29b of the second electronic device 26i may include a first portion 294 and a second portion 295, and a thickness of the first portion 294 is greater than a thickness of the second portion 295 so as to form a step structure.

Figure 19:
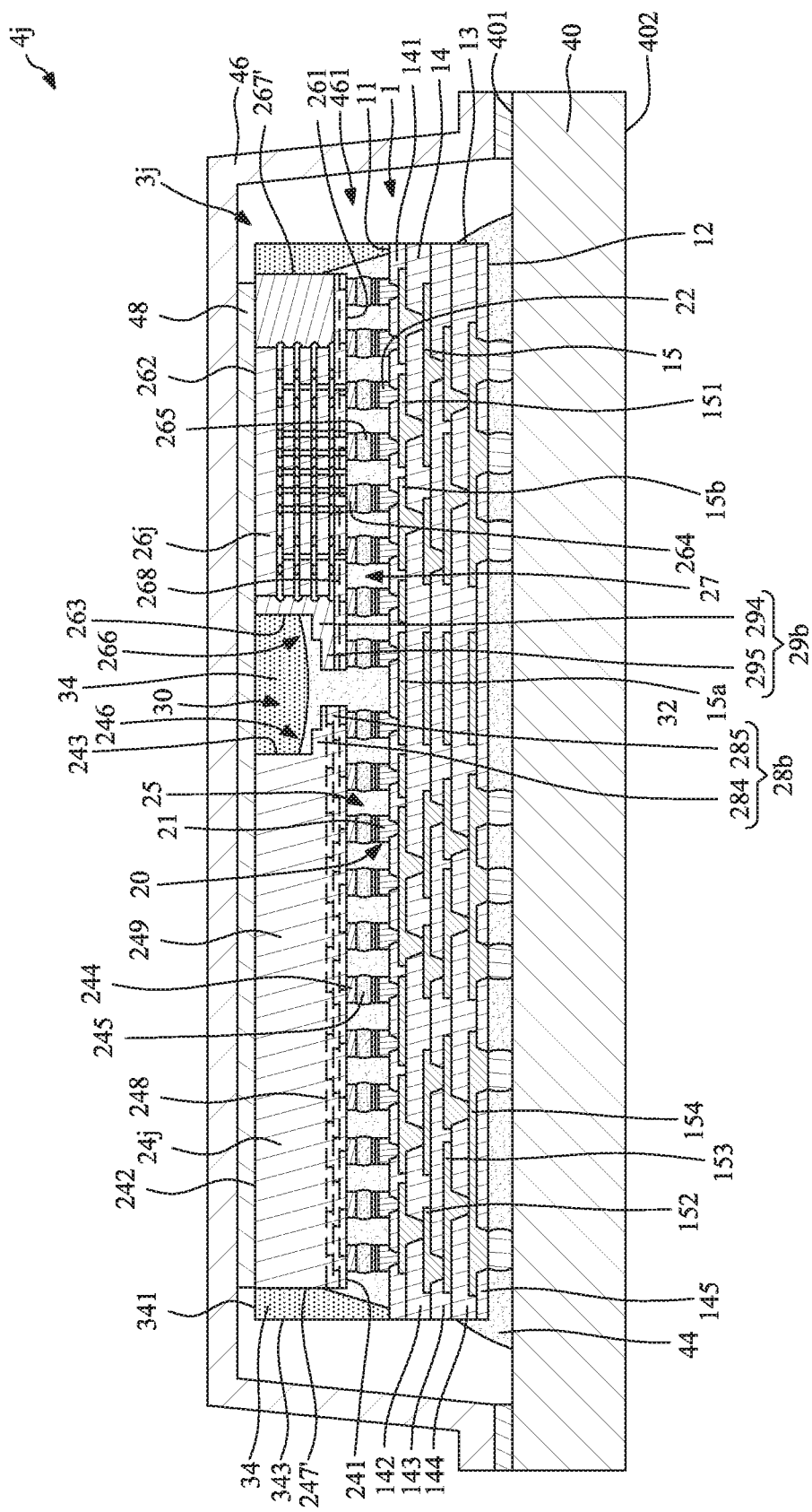
FIG. 19 illustrates a cross-sectional view of an assembly structure according to some embodiments of the present disclosure.

FIG. 19 illustrates a cross-sectional view of an assembly structure 4j according to some embodiments of the present disclosure. The assembly structure 4j of FIG. 19 is similar to the assembly structure 4i of FIG. 18, except for the structures of the first electronic device 24j and the second electronic device 26j of the package structure 3j. As shown in FIG. 19, the first electronic device 24j does not include the lateral side surface 243' and the first protrusion portion 28', thus, the first electronic device 24j has an outer side surface 247' which is a substantially flat surface. Similarly, the second electronic device 26j does not include the lateral side surface 263' and the second protrusion portion 29', thus, the second electronic device 26j has an outer side surface 267' which is a substantially flat surface.

FIG. 20 through FIG. 32 illustrate a method for manufacturing an assembly structure according to some embodiments of the present disclosure. In some embodiments, the method is for manufacturing the package structure 3 shown in FIG. 1 to FIG. 5, and the assembly structure 4 in FIG. 8.

Figure 20:
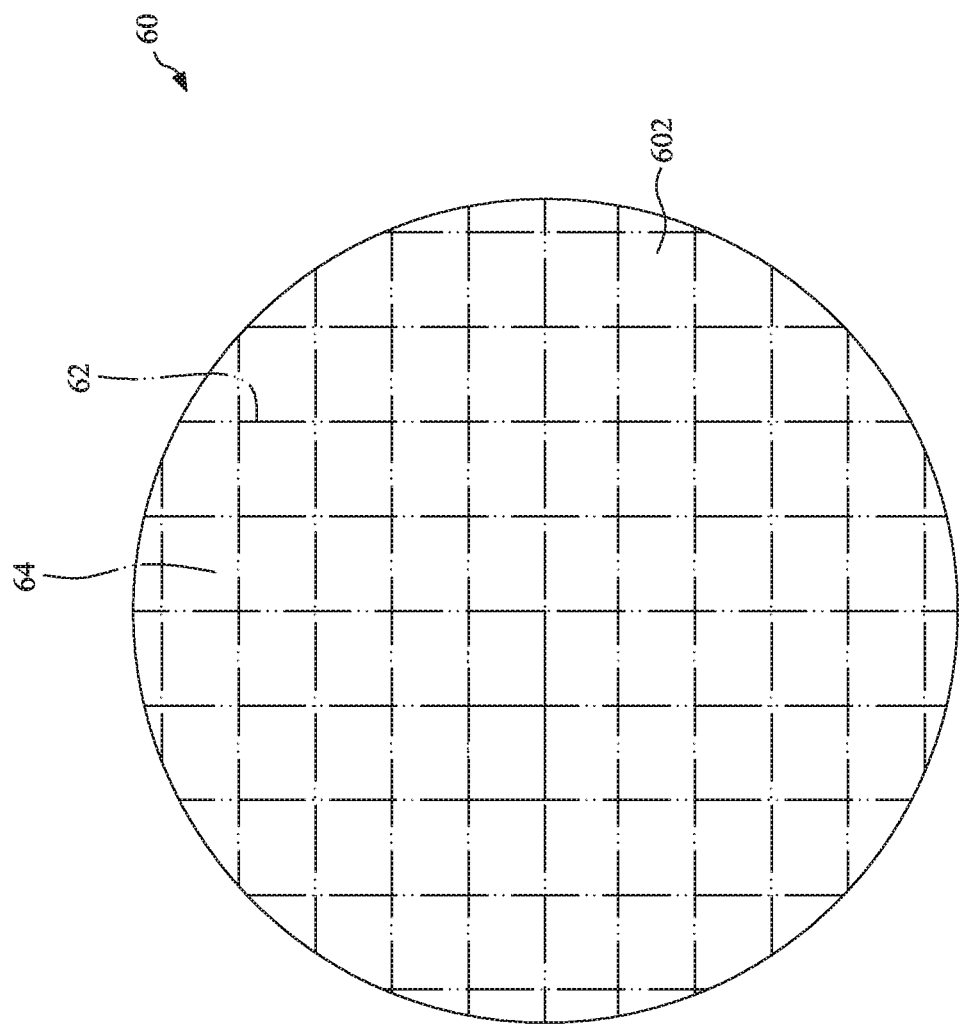
FIG. 20 illustrates one or more stages of an example of a method for manufacturing an assembly structure according to some embodiments of the present disclosure.
Figure 21:
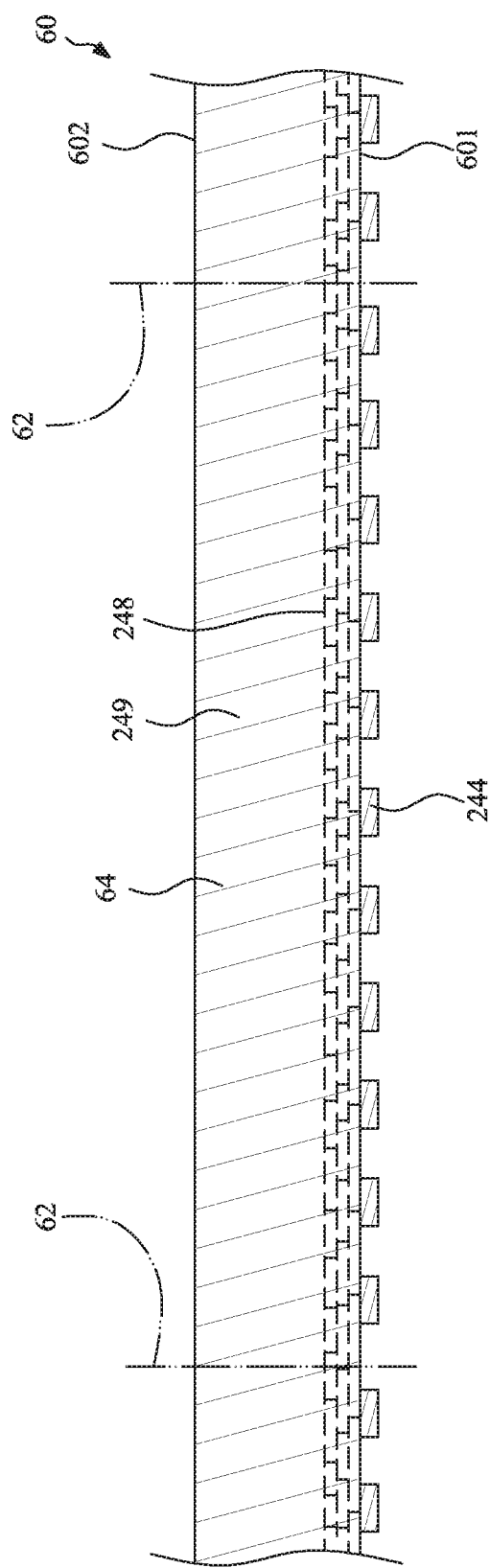
FIG. 21 illustrates one or more stages of an example of a method for manufacturing an assembly structure according to some embodiments of the present disclosure.

Referring to FIG. 20 and FIG. 21, wherein FIG. 21 illustrates a partially enlarged cross-sectional view of the wafer 60 of FIG. 20, a wafer 60 is provided. The wafer 60 may be circular, rectangular, square or elliptical. In some embodiments, the wafer 60 may be a silicon wafer. As shown in FIG. 20 and FIG. 21, the wafer 60 has a plurality of imaginary cutting lines 62 crossed with each other to define a plurality of die units 64. In some embodiments, the wafer 60 may have a first surface 601 (e.g., an active surface) and a second surface 602 (e.g., a backside surface) opposite to the first surface 601. In addition, the wafer 60 may include a main body 249, a first active circuit region 248 and a plurality of first electrical contacts 244. The main body 249 may include a silicon material. The first active circuit region 248 may be disposed on the main body 249, and may include a plurality of active circuit layers electrically connected with each other. The first electrical contacts 244 are disposed adjacent to the first surface 601, and electrically connected to the active circuit layers in the first active circuit region 248. The first electrical contacts 244 may be exposed or may protrude from the first surface 601 for electrical connection. The first electrical contacts 244 may be pads, bumps, studs, pillars or posts.

Figure 22:
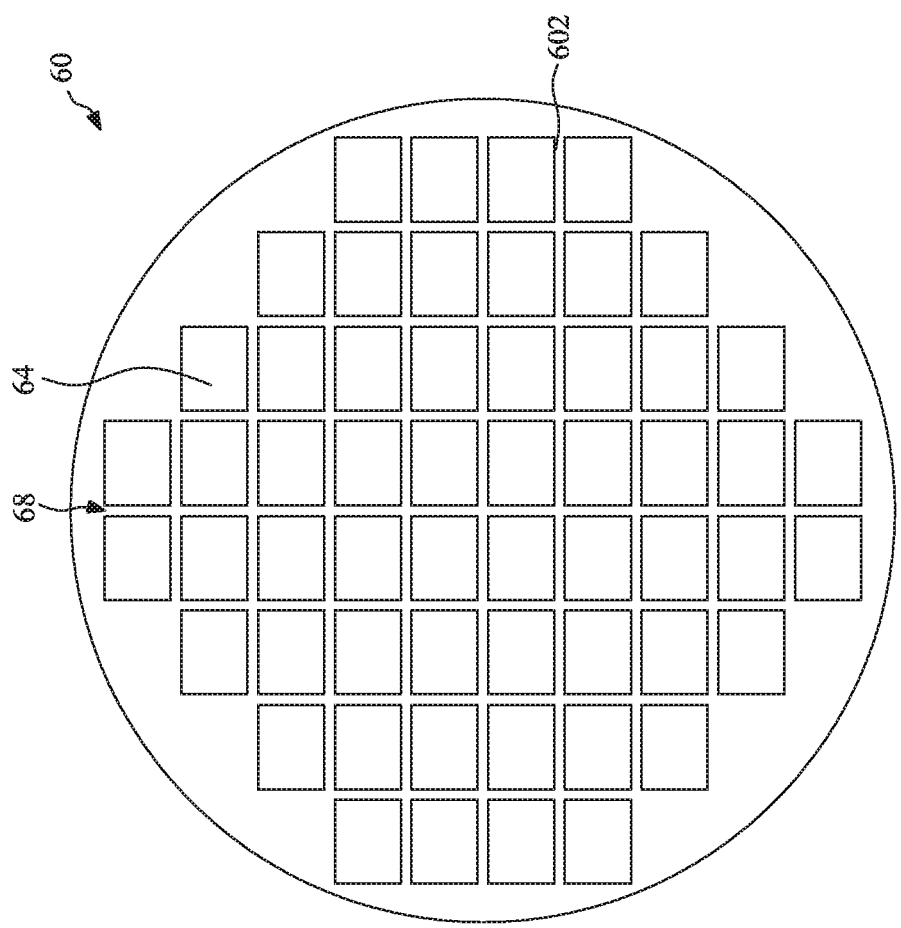
FIG. 22 illustrates one or more stages of an example of a method for manufacturing an assembly structure according to some embodiments of the present disclosure.
Figure 23:
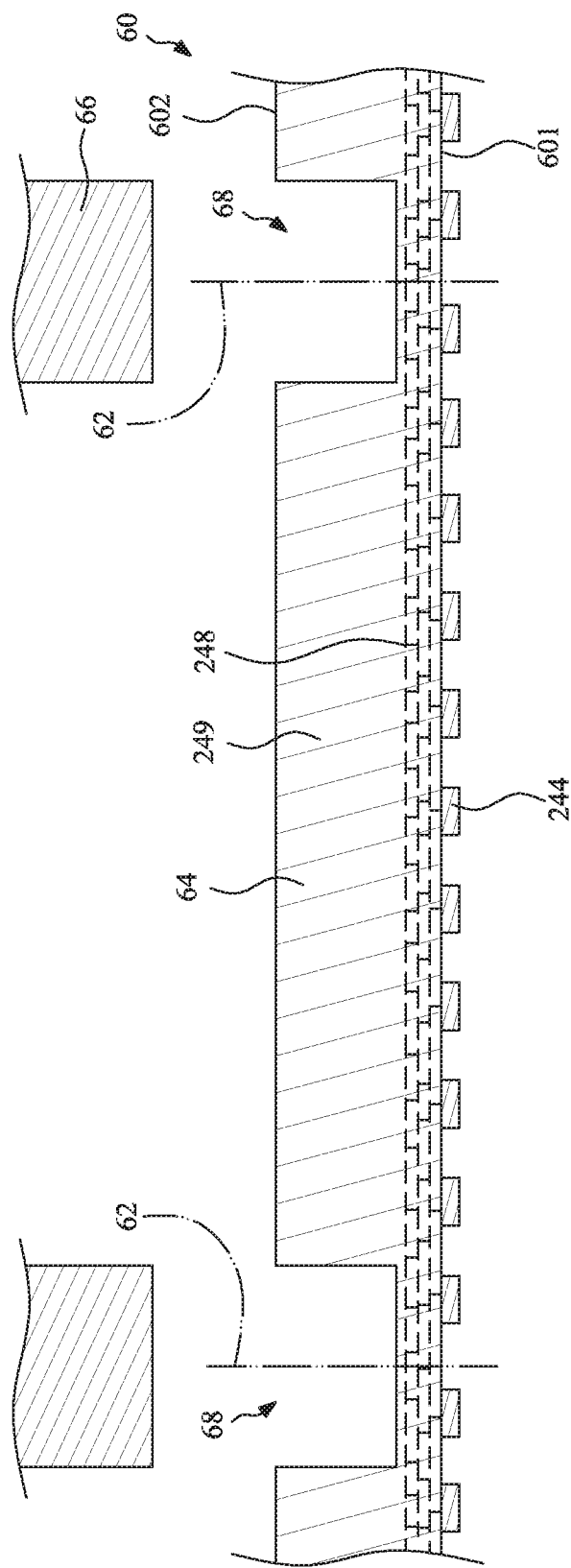
FIG. 23 illustrates one or more stages of an example of a method for manufacturing an assembly structure according to some embodiments of the present disclosure.

Referring to FIG. 22 and FIG. 23, wherein FIG. 23 illustrates a partially enlarged cross-sectional view of the wafer 60 of FIG. 22, the wafer 60 may be cut by a first cutting tool, such as a first cutting blade 66, along the imaginary cutting lines 62. It is noted that the first cutting blade 66 does not cut through the wafer 60. Thus, the wafer 60 defines a plurality of first trenches 68 crossed with each other. The die units 64 are surrounded by the first trenches 68. A width of each of the first trenches 68 is substantially equal to a width of the first cutting blade 66.

Figure 24:
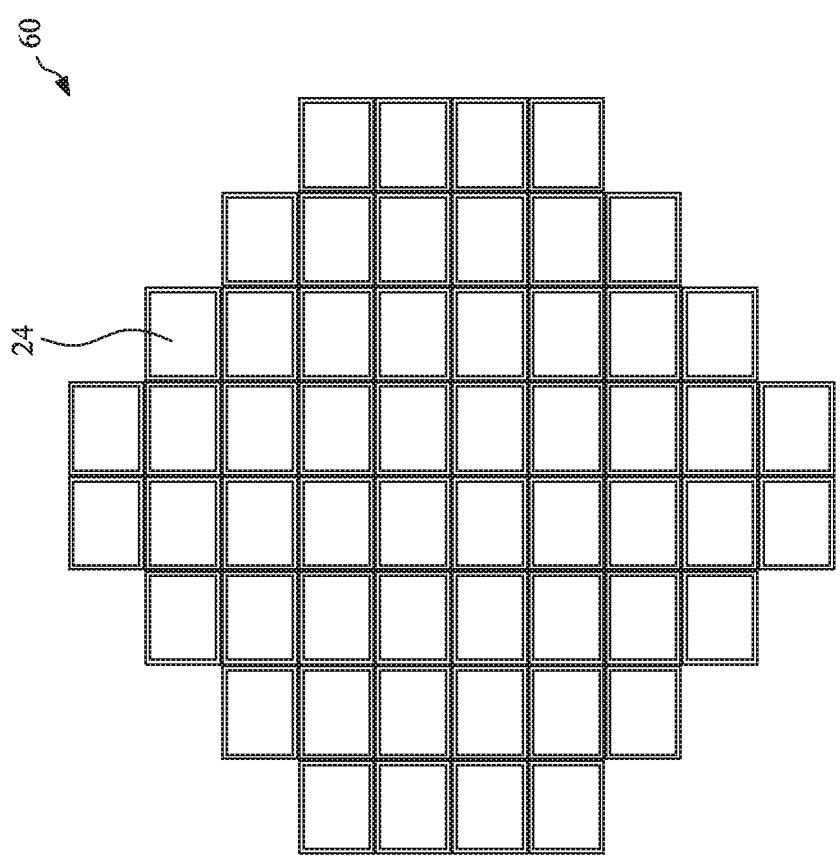
FIG. 24 illustrates one or more stages of an example of a method for manufacturing an assembly structure according to some embodiments of the present disclosure.
Figure 25:
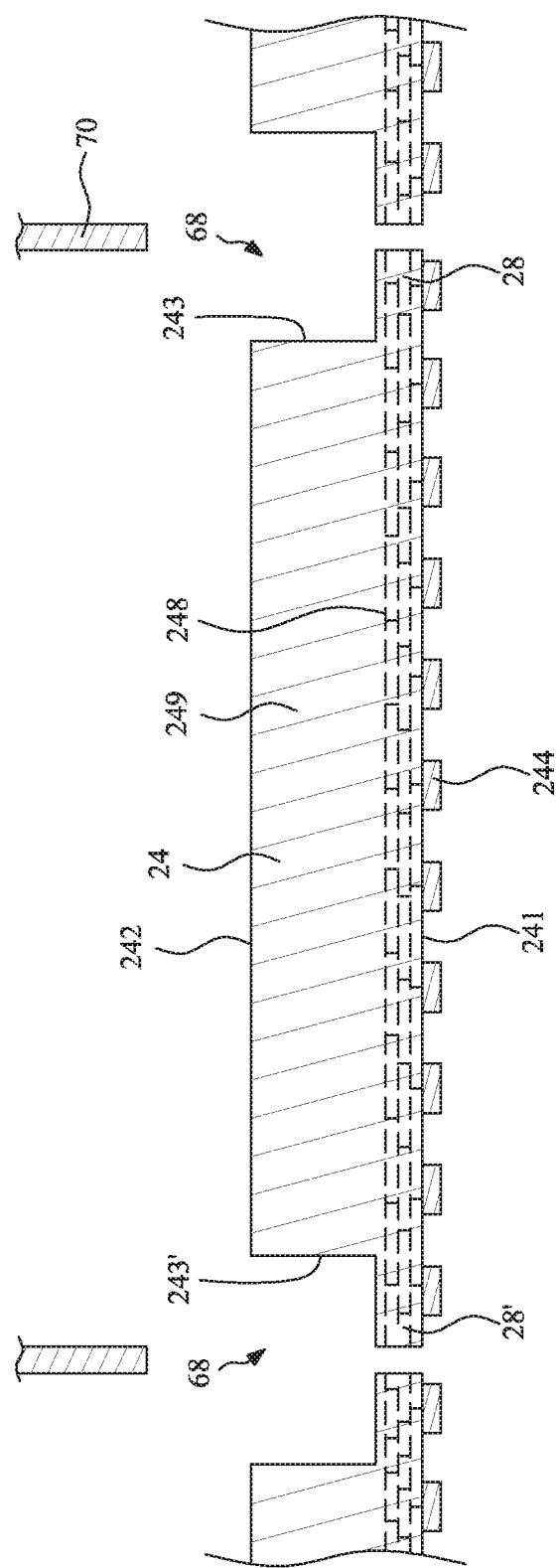
FIG. 25 illustrates one or more stages of an example of a method for manufacturing an assembly structure according to some embodiments of the present disclosure.

Referring to FIG. 24 and FIG. 25, wherein FIG. 25 illustrates a partially enlarged cross-sectional view of the wafer 60 of FIG. 24, the wafer 60 may be cut through by a second cutting tool, such as a second cutting blade 70, along the first trenches 68. Meanwhile, the die units 64 become a plurality of first electronic devices 24 shown in FIG. 2 and FIG. 3. Thus, at least one first electronic device 24 is provided. It is noted that a width of the second cutting tool (e.g., the second cutting blade 70) may be equal to or different from a width of the first cutting tool (e.g., the first cutting blade 66). As shown in FIG. 25, a width of the second cutting tool (e.g., the second cutting blade 70) is less than a width of the first cutting tool (e.g., the first cutting blade 66), and a cutting position (or a cutting path) of the second cutting tool (e.g., the second cutting blade 70) is within the first trenches 68, so as to form the first protrusion portions 28, 28'. In some embodiments, the profiles (e.g., widths) and cutting positions (e.g., cutting paths) of the first cutting blade 66 and the second cutting blade 70 may be adjusted, and a third cutting blade or a fourth cutting blade may be further used so as to obtain different types of the first electronic device 24. In some embodiments, the first cutting tool and the second cutting tool may be plasma so as to obtain the first electronic device 24a shown in FIG. 7.

The first electronic device 24 may have a first surface 241 (e.g., an active surface), a second surface 242 (e.g., a backside surface) opposite to the first surface 241, and at least one lateral side surface (e.g., a plurality of lateral side surfaces 243, 243') extending between the first surface 241 and the second surface 242. Further, the first electronic device 24 may include the main body 249, the first active circuit region 248, the first electrical contacts 244 and the at least one first protrusion portion (e.g., a plurality of first protrusion portions 28, 28'). In addition, the first protrusion portion 28 and the lateral side surface 243 of the first electronic device 24 may define a first indentation structure 246.

Figure 26:
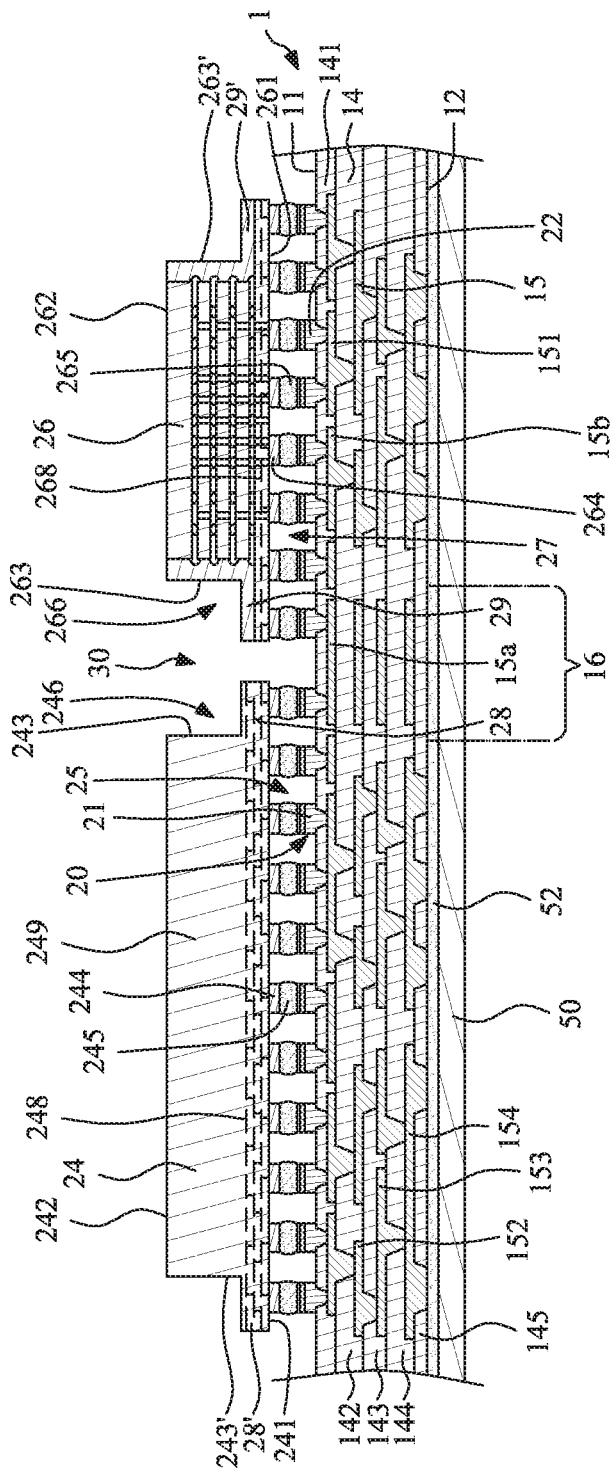
FIG. 26 illustrates one or more stages of an example of a method for manufacturing an assembly structure according to some embodiments of the present disclosure.

Referring to FIG. 26, a carrier 50 is provided. The carrier 50 may include a release layer 52 disposed thereon. Then, a wiring structure 1' is formed or disposed on the release layer 52 on the carrier 50. The wiring structure 1' of FIG. 26 may be similar to the wiring structure 1 of FIG. 2, and may have a first surface 11, a second surface 12 opposite to the first surface 11, and a high density region 16 (or a fine line region). The wiring structure 1' may include at least one dielectric layer 14, at least one circuit layer 15 in contact with the dielectric layer 14 and a plurality of protrusion pads 20. For example, the wiring structure 1' includes a first dielectric layer 141, a first circuit layer 151, a second dielectric layer 142, a second circuit layer 152, a third dielectric layer 143, a third circuit layer 153, a fourth dielectric layer 144, a fourth circuit layer 154, and a fifth dielectric layer 145.

Then, a second electronic device 26 is provided. The second electronic device 26 may be manufactured as the stages similar to the stages of FIG. 20 to FIG. 25. The second electronic device 26 may have a first surface 261, a second surface 262 opposite to the first surface 261, and at least one lateral side surface (e.g., a plurality of lateral side surfaces 263, 263') extending between the first surface 261 and the second surface 262. Further, the second electronic device 26 may include a plurality of second electrical contacts 264 disposed adjacent to the first surface 261. The second electronic device 26 may further include at least one second protrusion portion (e.g., a plurality of second protrusion portions 29, 29') protruding from the lateral side surface (e.g., the lateral side surfaces 263, 263') of the second electronic device 26. In addition, the second protrusion portion 29 and the lateral side surface 263 of the second electronic device 26 may define a second indentation structure 266.

Then, the first electronic device 24 and the second electronic device 26 are electrically connected to the circuit layer 15 of the wiring structure 1' by flip-chip bonding. Thus, the second electronic device 26 may be electrically connected to the first electronic device 24 through the interconnection portion 15a of the circuit layer 15 (including, for example, the interconnection portions 15a of the first circuit layer 151, the second circuit layer 152, the third circuit layer 153 and the fourth circuit layer 154).

Figure 27:
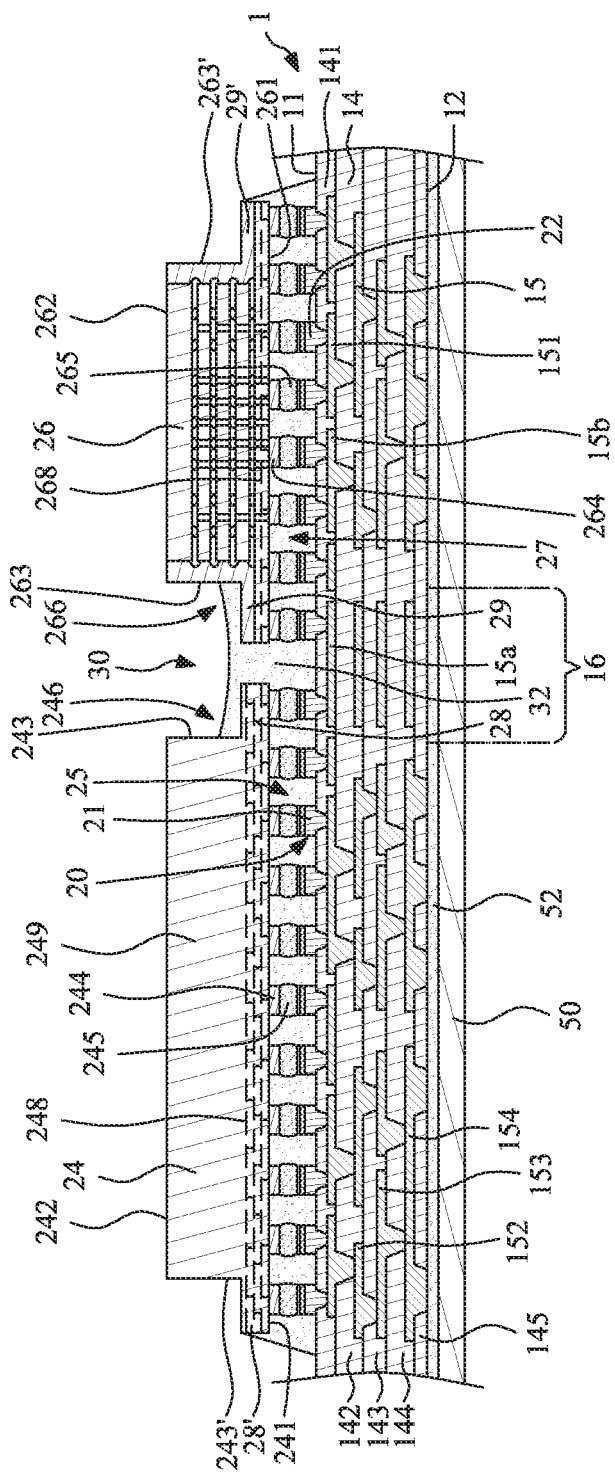
FIG. 27 illustrates one or more stages of an example of a method for manufacturing an assembly structure according to some embodiments of the present disclosure.

Referring to FIG. 27, a first protection material 32 (e.g., an underfill) is formed or disposed to extend from a first space 25 between the first electronic device 24 and the wiring structure 1' to a second space 27 between the second electronic device 26 and the wiring structure 1' so as to cover and protect the joints formed by the first electrical contacts 244, the first protrusion pads 21 and the solder materials 245, and the joints formed by the second electrical contacts 264, the second protrusion pads 22 and the solder materials 265. In addition, the first protection material 32 may further extend into a gap 30 between the lateral side surface 243 of the first electronic device 24 and the lateral side surface 263 of the second electronic device 26. That is, the first protection material 32 may cover the first protrusion portion 28 and the second protrusion portion 29, and may extend into the first indentation structure 246 and the second indentation structure 266. However, the first protection material 32 may not reach to the level of the second surface 242 of the first electronic device 24 and/or the second surface 262 of the second electronic device 26 since the gap 30 is enlarged. In some embodiments, the top surface of the first protection material 32 in the gap 30 may be recessed from the second surface 242 of the first electronic device 24 and/or the second surface 262 of the second electronic device 26.

Figure 28:
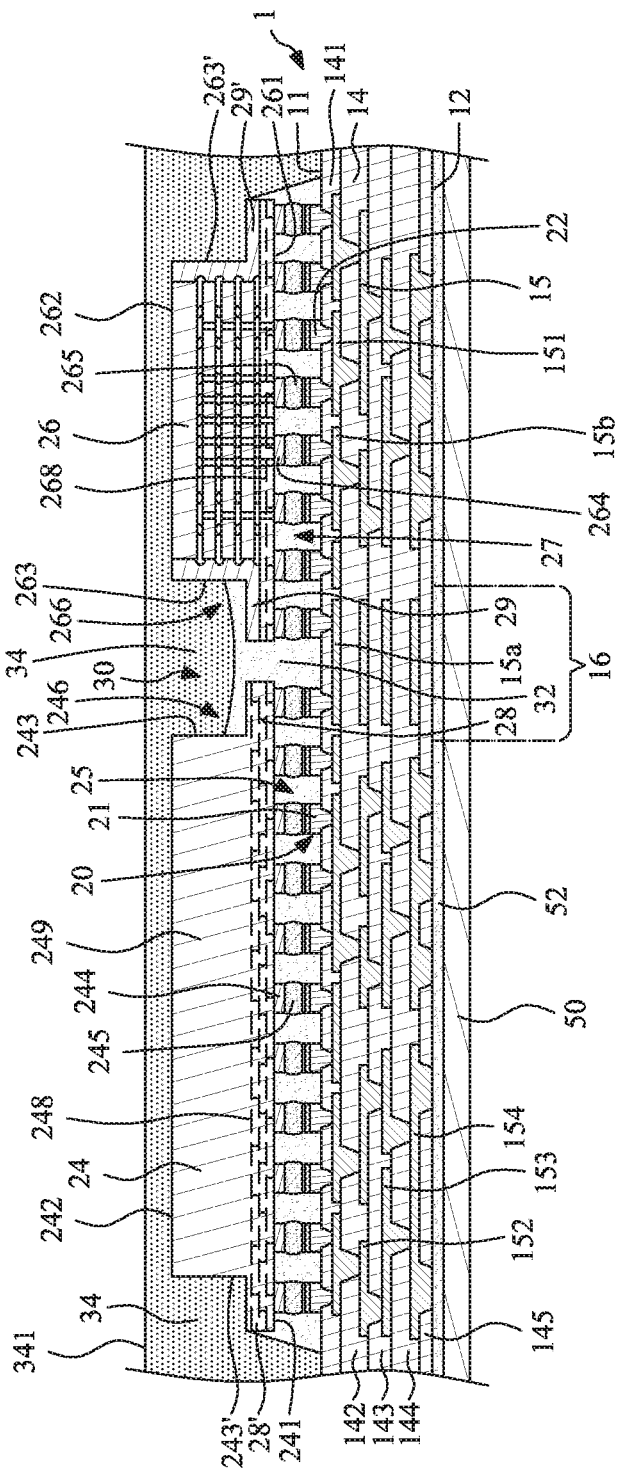
FIG. 28 illustrates one or more stages of an example of a method for manufacturing an assembly structure according to some embodiments of the present disclosure.

Referring to FIG. 28, an encapsulant 34 is formed or disposed to cover at least a portion of the first surface 11 of the wiring structure 1', at least a portion of the first electronic device 24, at least a portion of the second electronic device 26 and the first protection material 32. The encapsulant 34 has a first surface 341 (e.g., a top surface). As shown in FIG. 28, a portion of the encapsulant 34 may extend into the gap 30 between the first electronic device 24 and the second electronic device 26 to contact the first protection material 32.

Figure 29:
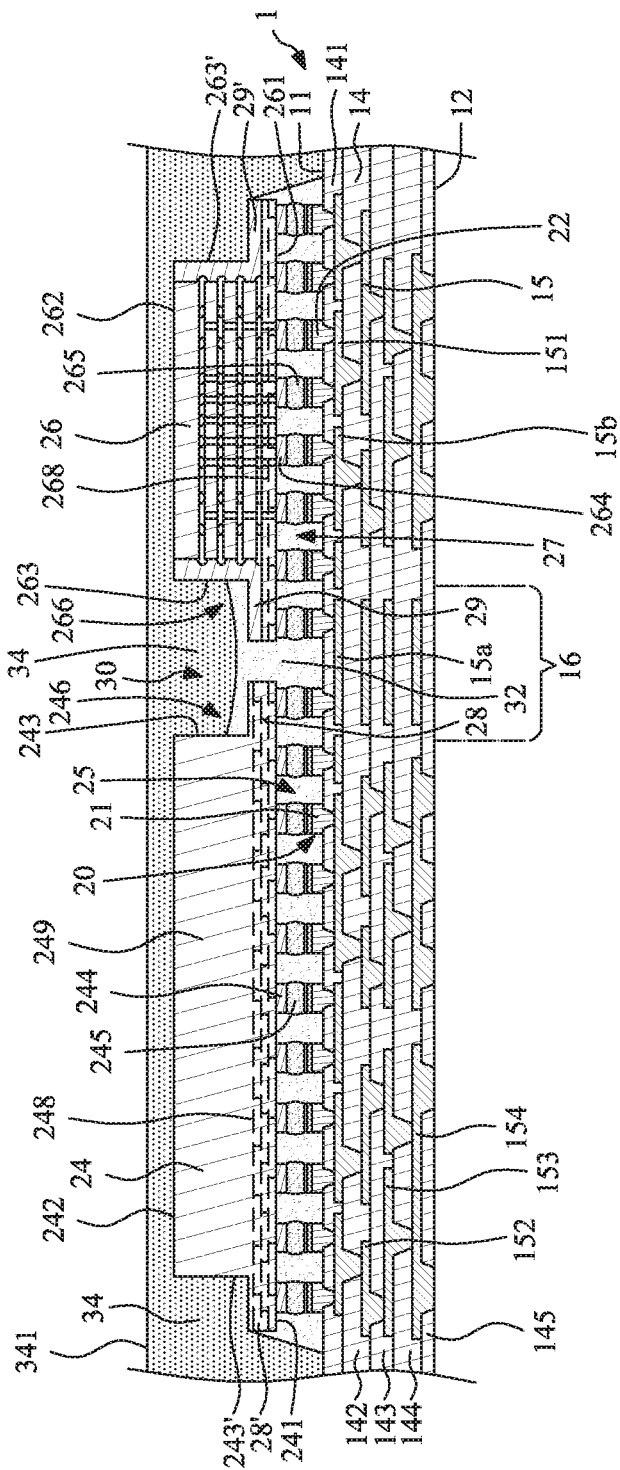
FIG. 29 illustrates one or more stages of an example of a method for manufacturing assembly structure according to some embodiments of the present disclosure.

Referring to FIG. 29, the carrier 50 and the release layer 52 are removed. Thus, portions (e.g., the bottom portions of the via portions) of the fourth circuit layer 154 are exposed from the second surface 12 of the wiring structure 1'.

Figure 30:
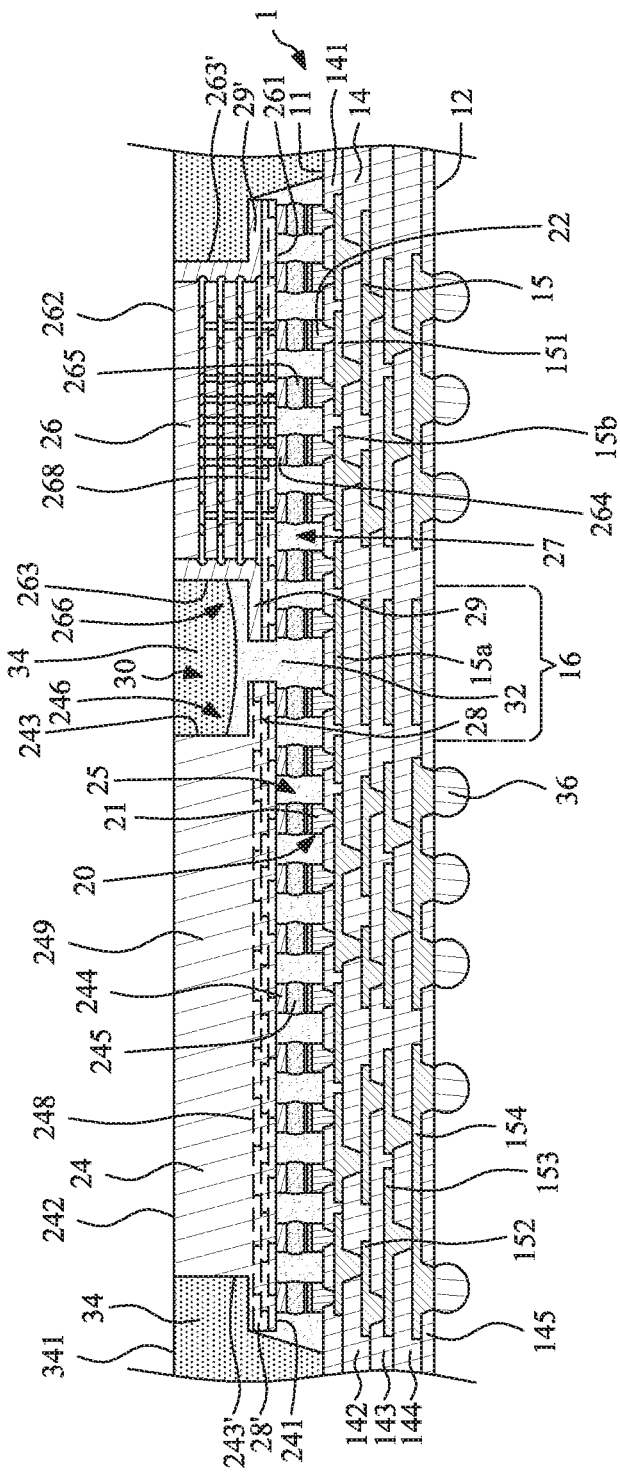
FIG. 30 illustrates one or more stages of an example of a method for manufacturing an assembly structure according to some embodiments of the present disclosure.

Referring to FIG. 30, the encapsulant 34 is thinned from its first surface 341 by, for example, grinding. Thus, the first surface 341 of the encapsulant 34, the second surface 242 of the first electronic device 24, the second surface 262 of the second electronic device 26 may be substantially coplanar with each other. Then, a plurality of solder materials 36 (e.g., solder balls) are formed or disposed to the second surface 12 of the wiring structure 1'.

Figure 31:
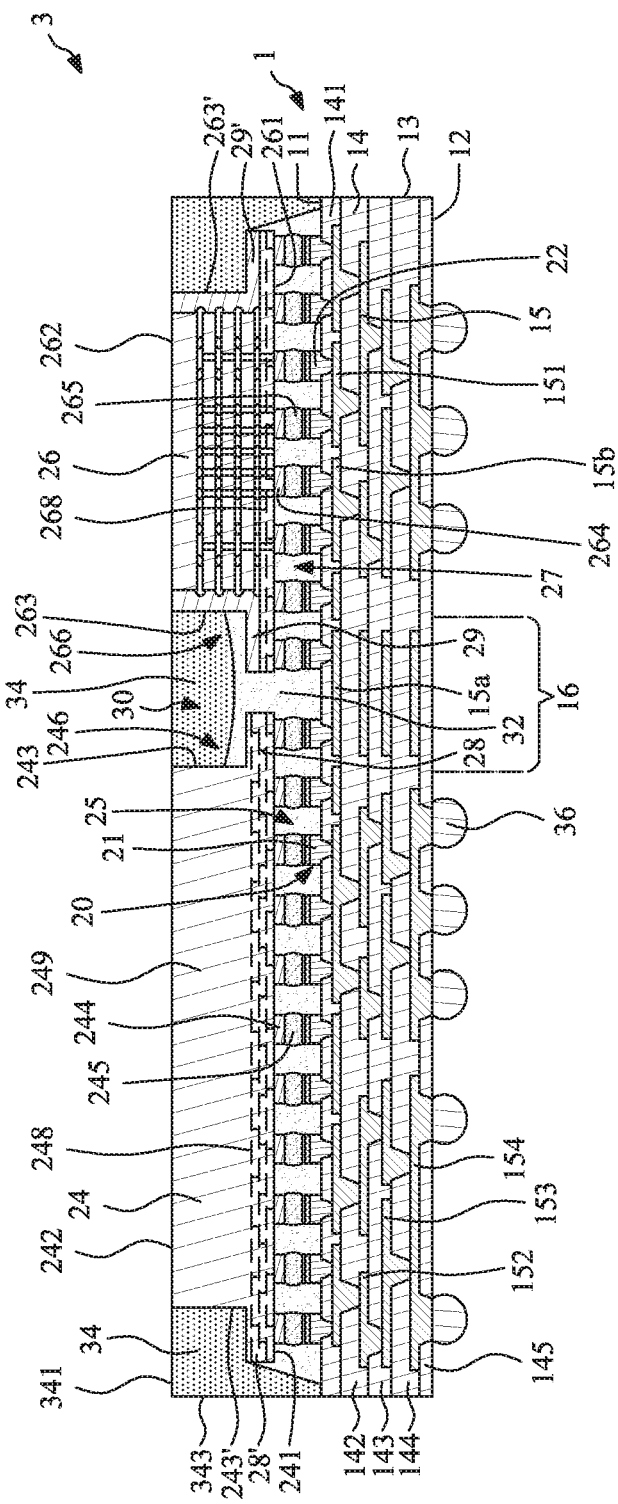
FIG. 31 illustrates one or more stages of an example of a method for manufacturing an assembly structure according to some embodiments of the present disclosure.

Referring to FIG. 31, a singulation process may be conducted to the wiring structure 1' so as to obtain a plurality of package structures 3 shown in FIG. 1 to FIG. 5.

Figure 32:
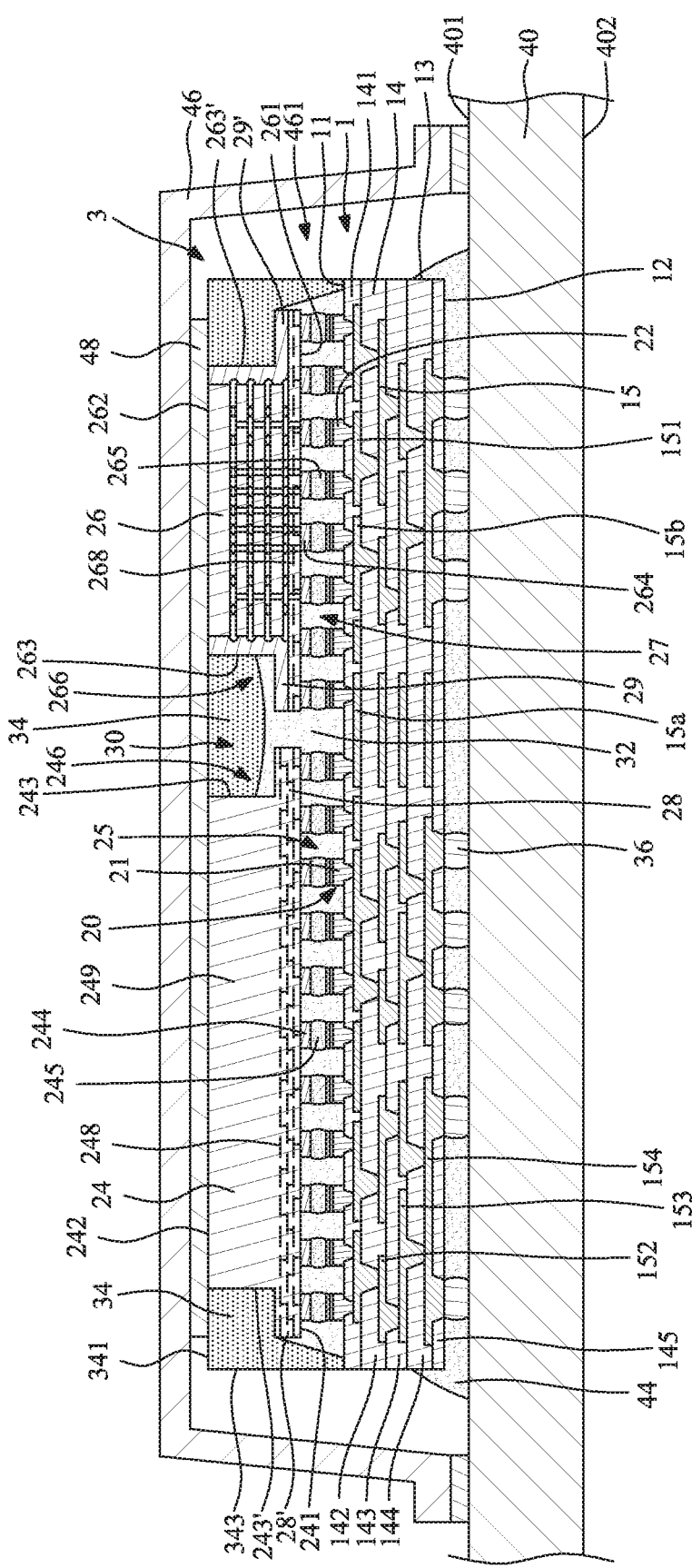
FIG. 32 illustrates one or more stages of an example of a method for manufacturing an assembly structure according to some embodiments of the present disclosure.

Referring to FIG. 32, the package structure 3 may be electrically connected to a first surface 401 of a base substrate 40 through the solder materials 36. Then, a second protection material 44 (e.g., an underfill) is formed or disposed in a space between the package structure 3 and the base substrate 40 so as to cover and protect the solder materials 36. Then, a heat sink 46 may be attached to package structure 3 and the base substrate 40. In some embodiments, the heat sink 46 may be a cap or hat structure, and may define a cavity 461 for accommodating the package structure 3. A portion of the heat sink 46 may be attached to the top surface of the package structure 3 through a thermal material 48 (e.g., thermal interface material (TIM)). Another portion (e.g., bottom portion) of the heat sink 46 may be attached to the base substrate 40 through an adhesive material.

Then, a singulation process may be conducted to the base substrate 40 so as to obtain a plurality of assembly structures 4 shown in FIG. 8.

Figure 33:
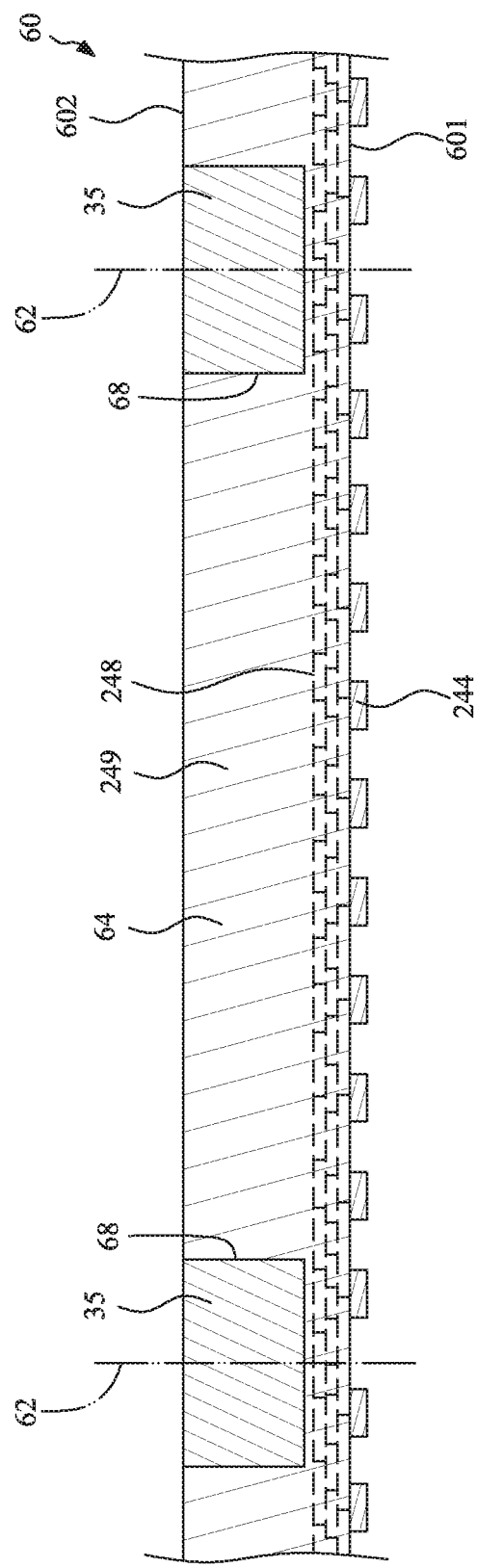
FIG. 33 illustrates one or more stages of an example of a method for manufacturing an assembly structure according to some embodiments of the present disclosure.
Figure 34:
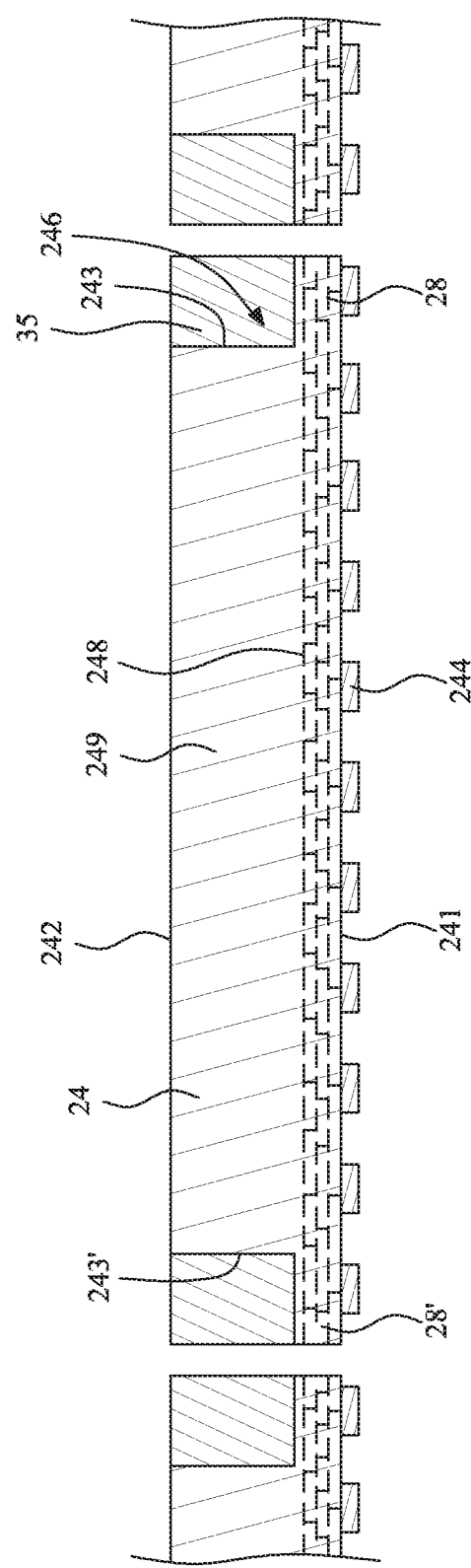
FIG. 34 illustrates one or more stages of an example of a method for manufacturing an assembly structure according to some embodiments of the present disclosure.

FIG. 33 through FIG. 34 illustrate a method for manufacturing an assembly structure according to some embodiments of the present disclosure. In some embodiments, the method is for manufacturing the package structure 3e and the assembly structure 4e shown in FIG. 13. The initial stages of the illustrated process are the same as, or similar to, the stages illustrated in FIG. 20 to FIG. 23. FIG. 33 depicts a stage subsequent to that depicted in FIG. 23.

Referring to FIG. 33, a first underfill-repelling material 35 is formed or disposed in the trenches 68 to fill the trenches 68.

Referring to FIG. 34, the wafer 60 may be cut through by a cutting tool, such as a cutting blade, along the trenches 68. A width of the cutting blade is less than the width of the trench 68, thus, a portion of the first underfill-repelling material 35 remains in the first indentation structure 246 so as to obtain a plurality of first electronic devices 24 shown in FIG. 13.

Then, the following stages of the illustrated process are the same as, or similar to, the stages illustrated in FIG. 26 to FIG. 32 so as to obtain the package structure 3e and the assembly structure 4e shown in FIG. 13.

Figure 35:
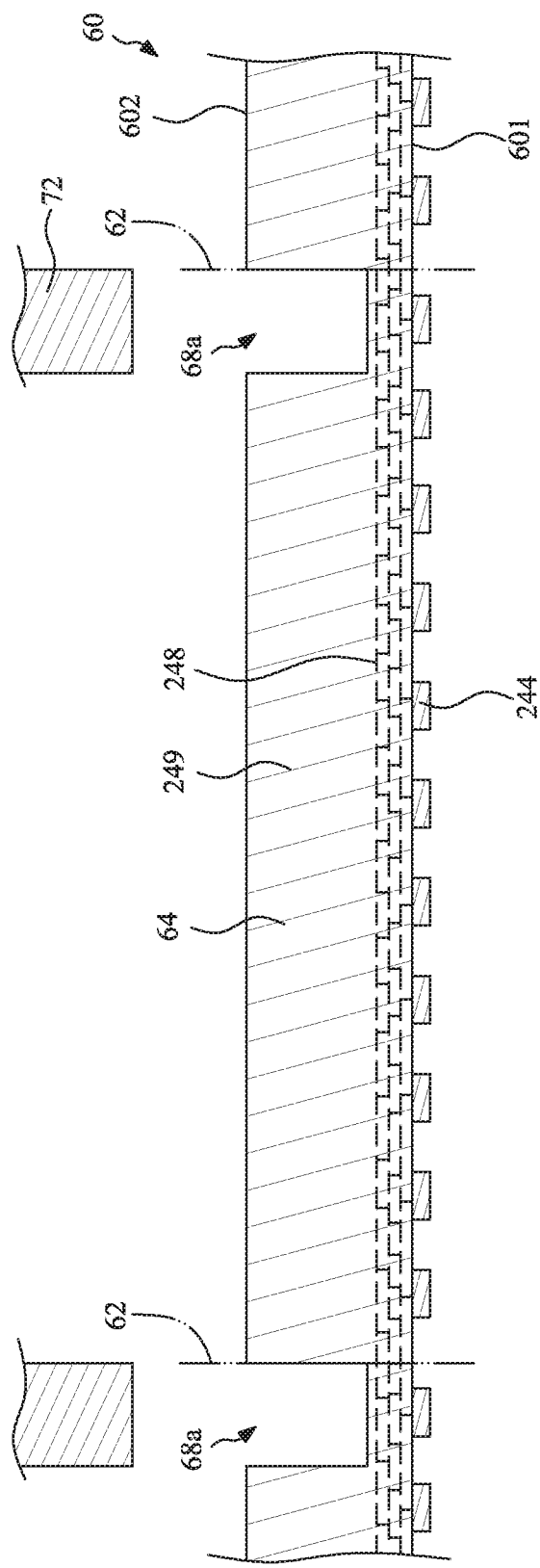
FIG. 35 illustrates one or more stages of an example of a method for manufacturing an assembly structure according to some embodiments of the present disclosure.
Figure 36:
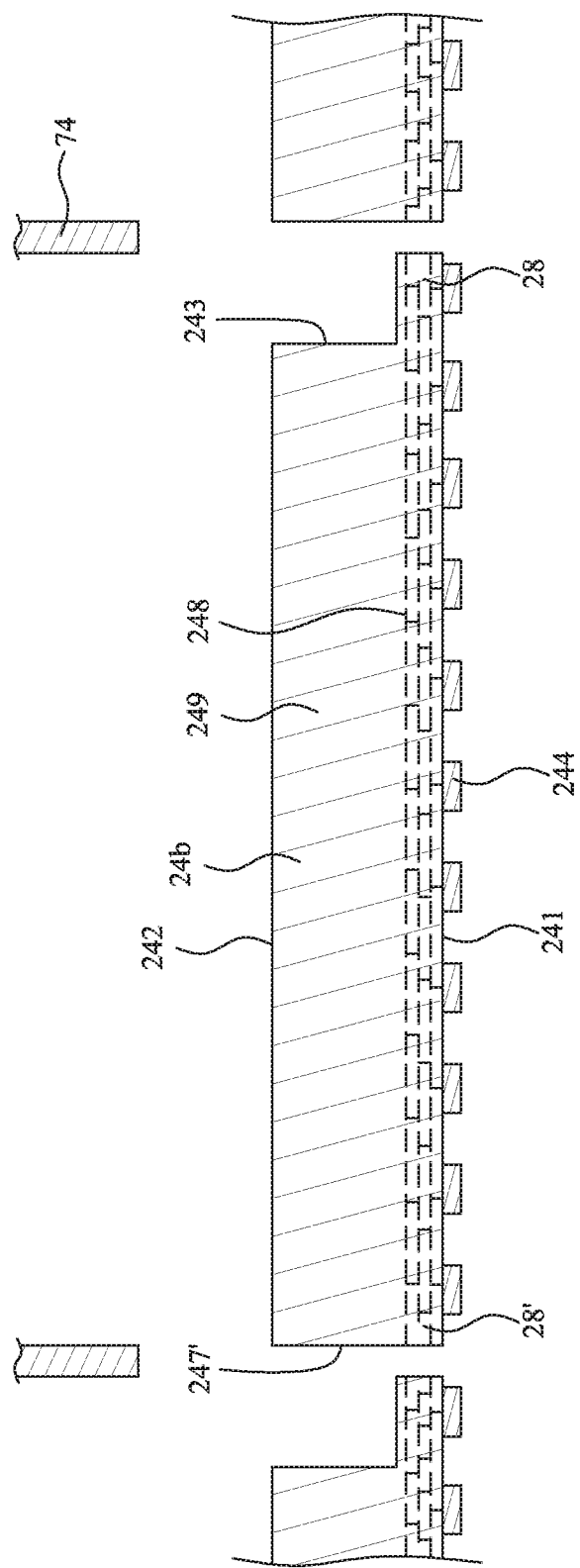
FIG. 36 illustrates one or more stages of an example of a method for manufacturing an assembly structure according to some embodiments of the present disclosure.

FIG. 35 through FIG. 36 illustrate a method for manufacturing an assembly structure according to some embodiments of the present disclosure. In some embodiments, the method is for manufacturing the package structure 3b and the assembly structure 4b shown in FIG. 10. The initial stages of the illustrated process are the same as, or similar to, the stages illustrated in FIG. 20 to FIG. 21. FIG. 35 depicts a stage subsequent to that depicted in FIG. 21.

Referring to FIG. 35, the wafer 60 may be cut by a first cutting tool, such as a first cutting blade 72, along the imaginary cutting lines 62. It is noted that the first cutting blade 72 does not cut through the wafer 60. Thus, the wafer 60 defines a plurality of first trenches 68a crossed with each other. The die units 64 are surrounded by the first trenches 68a. A width of each of the first trenches 68a is substantially equal to a width of the first cutting blade 72.

Referring to FIG. 36, the wafer 60 may be cut through by a second cutting tool, such as a second cutting blade 74, along the first trenches 68. Meanwhile, the die units 64 become a plurality of first electronic devices 24b shown in FIG. 10. It is noted that a width of the second cutting tool (e.g., the second cutting blade 74) may be equal to or different from a width of the first cutting tool (e.g., the first cutting blade 72). A cutting position (or a cutting path) of the second cutting tool (e.g., the second cutting blade 74) is outside the first trenches 68a and adjacent to the first trenches 68a so that a sidewall (e.g., a right sidewall) of the first trenches 68a is removed.

Then, the following stages of the illustrated process are the same as, or similar to, the stages illustrated in FIG. 26 to FIG. 32 so as to obtain the package structure 3b and the assembly structure 4b shown in FIG. 10.

Figure 37:
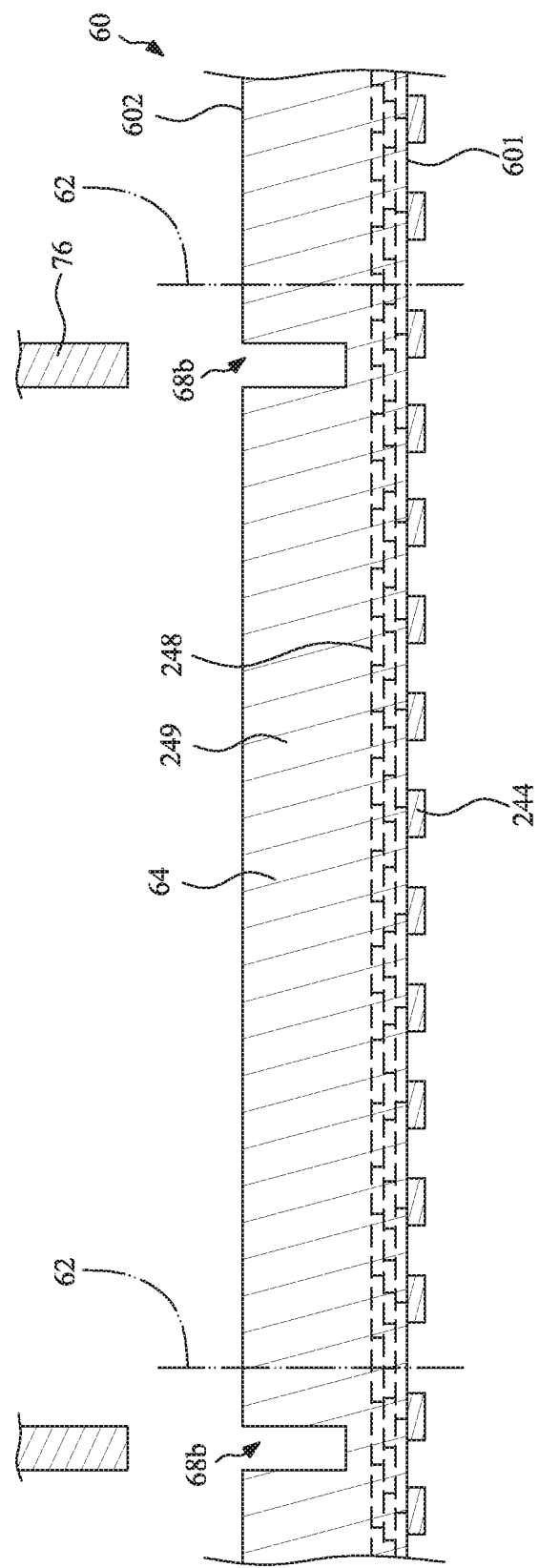
FIG. 37 illustrates one or more stages of an example of a method for manufacturing an assembly structure according to some embodiments of the present disclosure.
Figure 38:
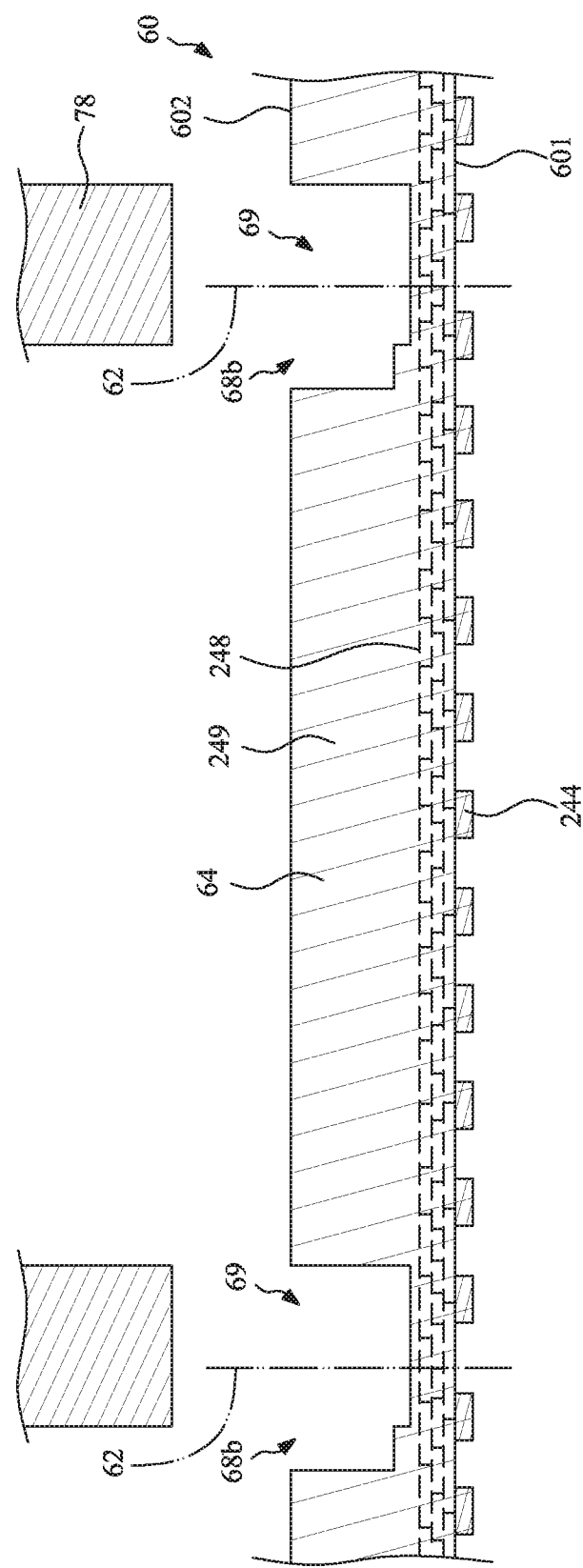
FIG. 38 illustrates one or more stages of an example of a method for manufacturing an assembly structure according to some embodiments of the present disclosure.
Figure 39:
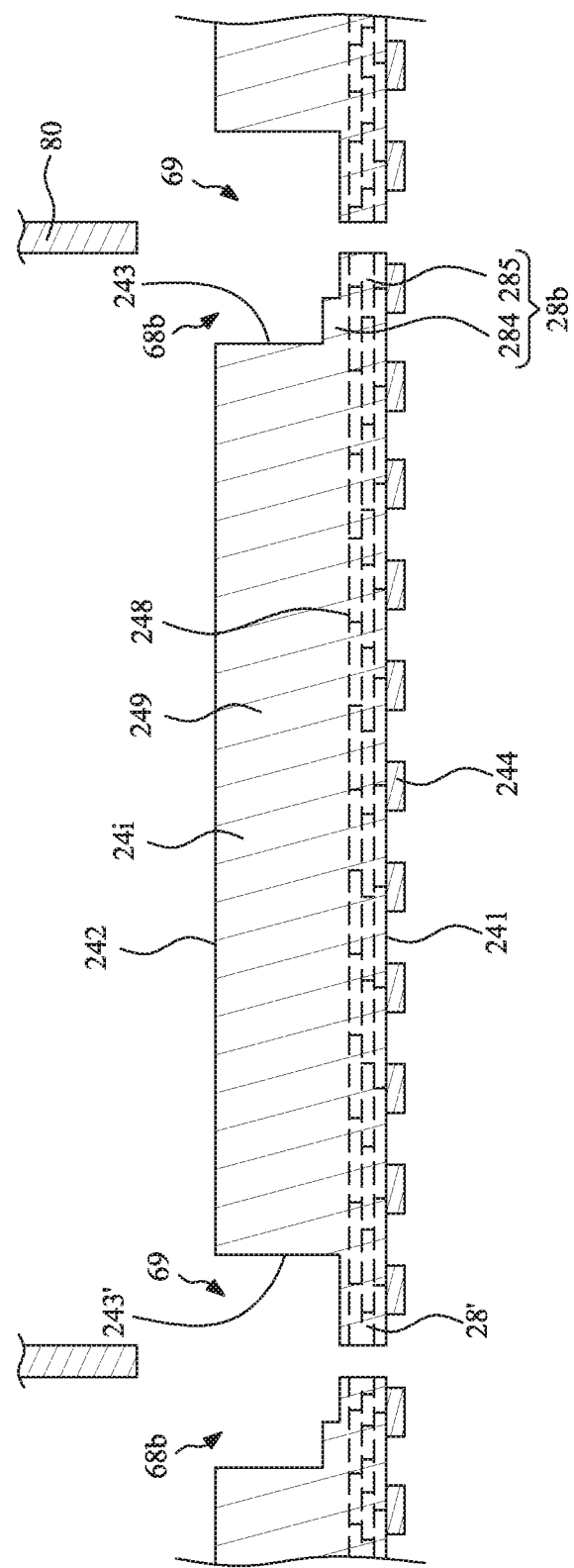
FIG. 39 illustrates one or more stages of an example of a method for manufacturing assembly structure according to some embodiments of the present disclosure.

FIG. 37 through FIG. 39 illustrate a method for manufacturing an assembly structure according to some embodiments of the present disclosure. In some embodiments, the method is for manufacturing the package structure 3i and the assembly structure 4i shown in FIG. 18. The initial stages of the illustrated process are the same as, or similar to, the stages illustrated in FIG. 20 to FIG. 21. FIG. 37 depicts a stage subsequent to that depicted in FIG. 21.

Referring to FIG. 37, the wafer 60 may be cut by a first cutting tool, such as a first cutting blade 76, along the imaginary cutting lines 62. It is noted that the first cutting blade 76 does not cut through the wafer 60. Thus, the wafer 60 defines a plurality of first trenches 68b crossed with each other. The die units 64 are surrounded by the first trenches 68b. A width of each of the first trenches 68b is substantially equal to a width of the first cutting blade 76.

Referring to FIG. 38, the wafer 60 may be cut by a second cutting tool, such as a second cutting blade 78, along the first trenches 68b. It is noted that the second cutting blade 78 does not cut through the wafer 60. A cutting position (or a cutting path) of the second cutting tool (e.g., the second cutting blade 78) is outside the first trenches 68b and adjacent to the first trenches 68b so that a sidewall (e.g., a right sidewall) of the first trenches 68b is removed. Thus, the wafer 60 defines a plurality of second trenches 69 crossed with each other. The die units 64 are surrounded by the second trenches 69. A width of each of the second trenches 69 is substantially equal to a width of the second cutting blade 78. The second trenches 69 are outside the first trenches 68b and are communicated with the first trenches 68b. A width of the second cutting tool (e.g., the second cutting blade 78) may be greater than a width of the first cutting tool (e.g., the first cutting blade 76). A depth of the second trench 69 is greater than a depth of the first trench 68*b*.

Referring to FIG. 39, the wafer 60 may be cut through by a third cutting tool, such as a third cutting blade 80, along the second trenches 69. Meanwhile, the die units 64 become a plurality of first electronic devices 24*i* shown in FIG. 18. It is noted that a width of the third cutting tool (e.g., the third cutting blade 80) may be equal to or different from a width of the second cutting tool (e.g., the second cutting blade 78). A cutting position (or a cutting path) of the third cutting tool (e.g., the third cutting blade 80) is within the second trenches 69.

Then, the following stages of the illustrated process are the same as, or similar to, the stages illustrated in FIG. 26 to FIG. 32 so as to obtain the package structure 3*i* and the assembly structure 4*i* shown in FIG. 18.

Figure 40:
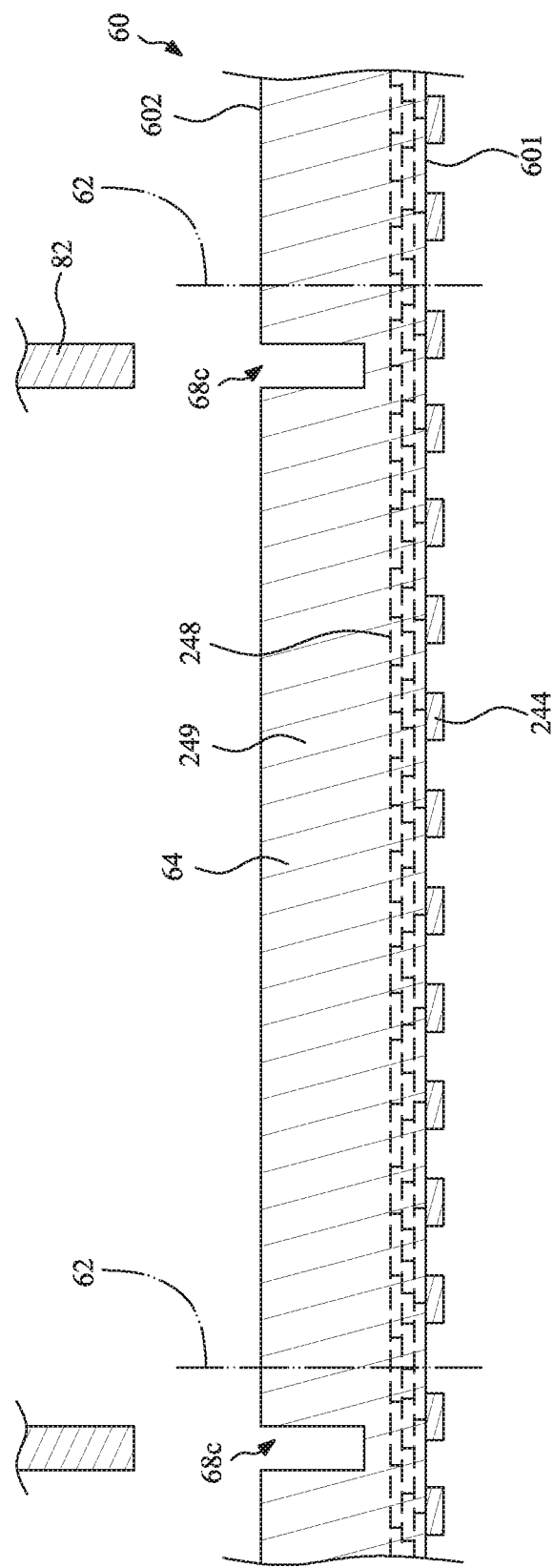
FIG. 40 illustrates one or more stages of an example of a method for manufacturing an assembly structure according to some embodiments of the present disclosure.
Figure 41:
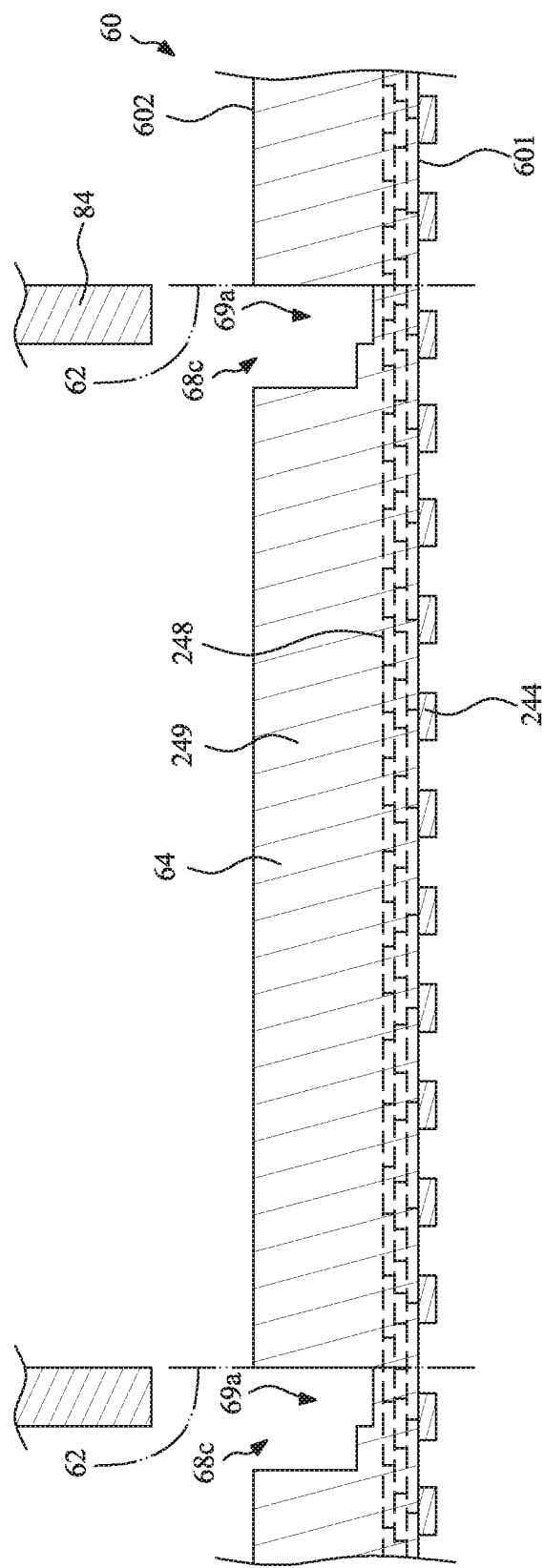
FIG. 41 illustrates one or more stages of an example of a method for manufacturing an assembly structure according to some embodiments of the present disclosure.
Figure 42:
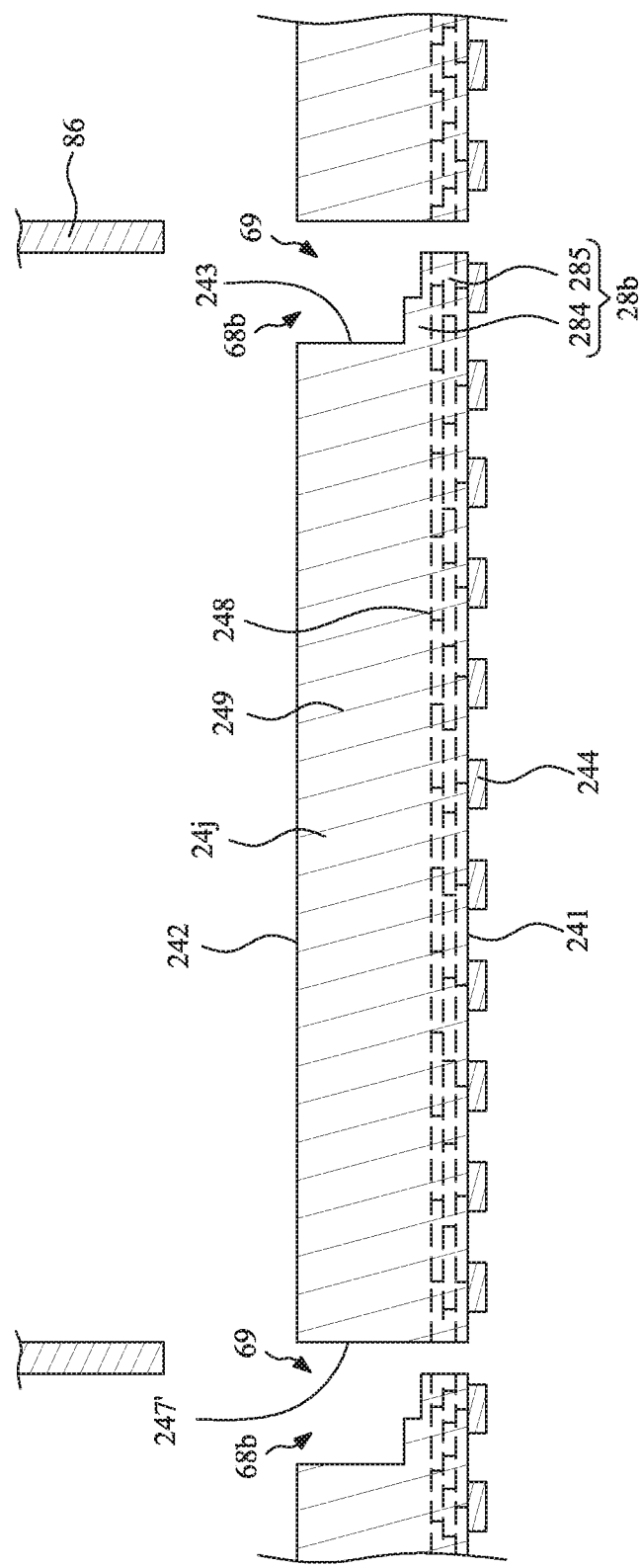
FIG. 42 illustrates one or more stages of an example of a method for manufacturing an assembly structure according to some embodiments of the present disclosure.

FIG. 40 through FIG. 42 illustrate a method for manufacturing an assembly structure according to some embodiments of the present disclosure. In some embodiments, the method is for manufacturing the package structure 3*j* and the assembly structure 4*j* shown in FIG. 19. The initial stages of the illustrated process are the same as, or similar to, the stages illustrated in FIG. 20 to FIG. 21. FIG. 40 depicts a stage subsequent to that depicted in FIG. 21.

Referring to FIG. 40, the wafer 60 may be cut by a first cutting tool, such as a first cutting blade 82, along the imaginary cutting lines 62. It is noted that the first cutting blade 82 does not cut through the wafer 60. Thus, the wafer 60 defines a plurality of first trenches 68*c* crossed with each other. The die units 64 are surrounded by the first trenches 68*c*. A width of each of the first trenches 68*c* is substantially equal to a width of the first cutting blade 82.

Referring to FIG. 41, the wafer 60 may be cut by a second cutting tool, such as a second cutting blade 84, along the first trenches 68*c*. It is noted that the second cutting blade 84 does not cut through the wafer 60. A cutting position (or a cutting path) of the second cutting tool (e.g., the second cutting blade 84) is outside the first trenches 68*c* and adjacent to the first trenches 68*c* so that a sidewall (e.g., a right sidewall) of the first trenches 68*c* is removed. Thus, the wafer 60 defines a plurality of second trenches 69*a* crossed with each other. The die units 64 are surrounded by the second trenches 69*a*. A width of each of the second trenches 69*a* is substantially equal to a width of the second cutting blade 84. The second trenches 69*a* are outside the first trenches 68*c* and are communicated with the first trenches 68*c*. A depth of the second trench 69*a* is greater than a depth of the first trench 68*c*.

Referring to FIG. 42, the wafer 60 may be cut through by a third cutting tool, such as a third cutting blade 86, along the second trenches 69*a*. Meanwhile, the die units 64 become a plurality of first electronic devices 24*j* shown in FIG. 19. It is noted that a width of the third cutting tool (e.g., the third cutting blade 86) may be equal to or different from a width of the second cutting tool (e.g., the second cutting blade 84). A cutting position (or a cutting path) of the third cutting tool (e.g., the third cutting blade 86) is outside the second trenches 69*a* and adjacent to the second trenches 69*a* so that a sidewall (e.g., a right sidewall) of the second trenches 69*a* is removed.

Then, the following stages of the illustrated process are the same as, or similar to, the stages illustrated in FIG. 26 to FIG. 32 so as to obtain the package structure 3*j* and the assembly structure 4*j* shown in FIG. 19.

FIG. 43 through FIG. 49 illustrate a method for manufacturing an assembly structure according to some embodiments of the present disclosure. In some embodiments, the method is for manufacturing the package structure 3*f* and the assembly structure 4*f* shown in FIG. 15.

Figure 43:
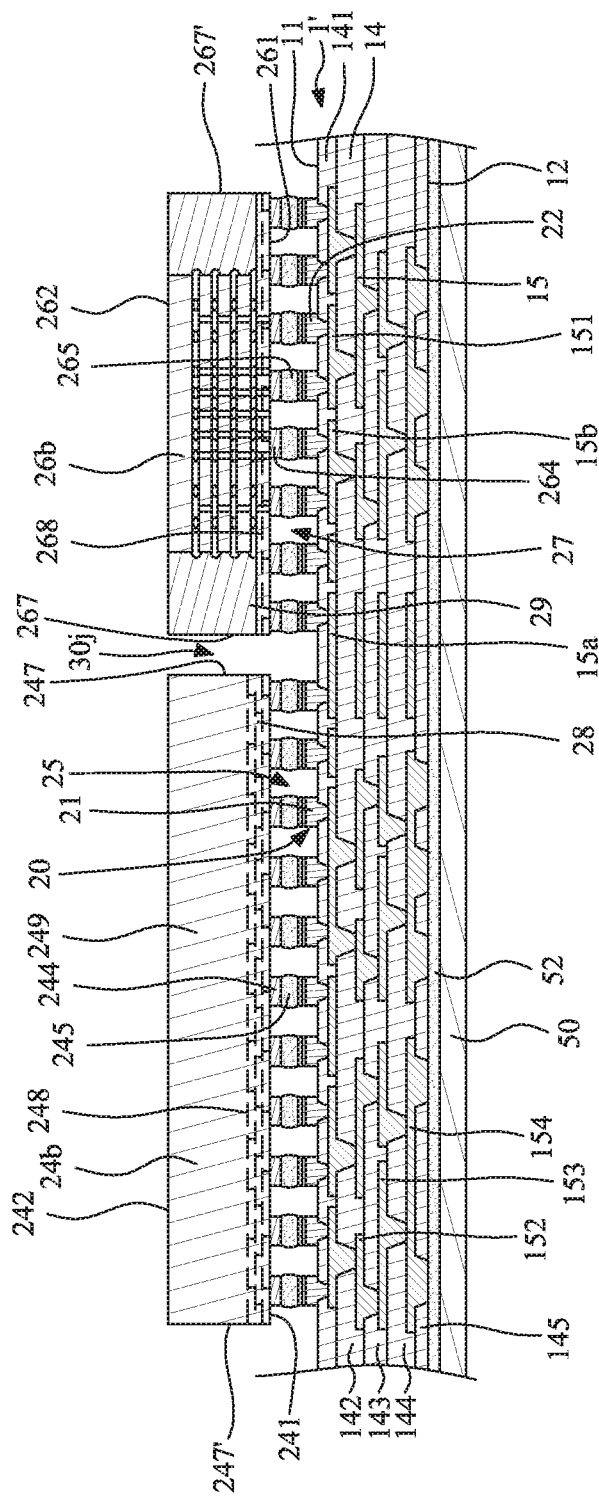
FIG. 43 illustrates one or more stages of an example of a method for manufacturing an assembly structure according to some embodiments of the present disclosure.

Referring to FIG. 43, a first electronic device 24*b* and a second electronic device 26*b* are electrically connected to a wiring structure 1' on a release layer 52 on a carrier 50 by flip-chip bonding. The first electronic device 24*b* may have a first surface 241, a second surface 242 opposite to the first surface 241, and a plurality of outer side surfaces 247, 247' extending between the first surface 241 and the second surface 242. The second electronic device 26*b* may have a first surface 261, a second surface 262 opposite to the first surface 261, and a plurality of outer side surfaces 267, 267' extending between the first surface 261 and the second surface 262. There may be a gap 30*j* between the outer side surface 247 of the first electronic device 24*b* and the outer side surface 267 of the second electronic device 26*b*.

Figure 44:
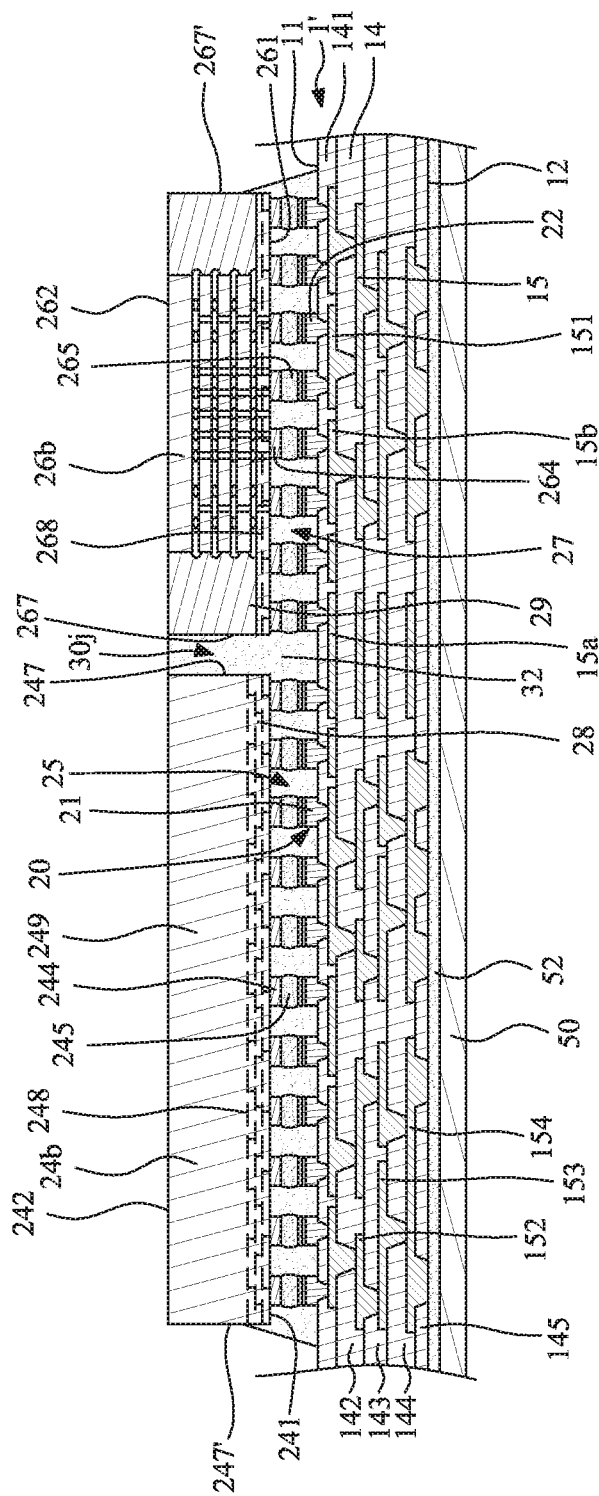
FIG. 44 illustrates one or more stages of an example of a method for manufacturing an assembly structure according to some embodiments of the present disclosure.

Referring to FIG. 44, a first protection material 32 (e.g., an underfill) is formed or disposed to extend from a first space 25 between the first electronic device 24*b* and the wiring structure 1' to a second space 27 between the second electronic device 26*b* and the wiring structure 1'. In addition, the first protection material 32 may further extend into the gap 30*j* and reach to the level of the second surface 242 of the first electronic device 24*b* and/or the second surface 262 of the second electronic device 26*b*.

Figure 45:
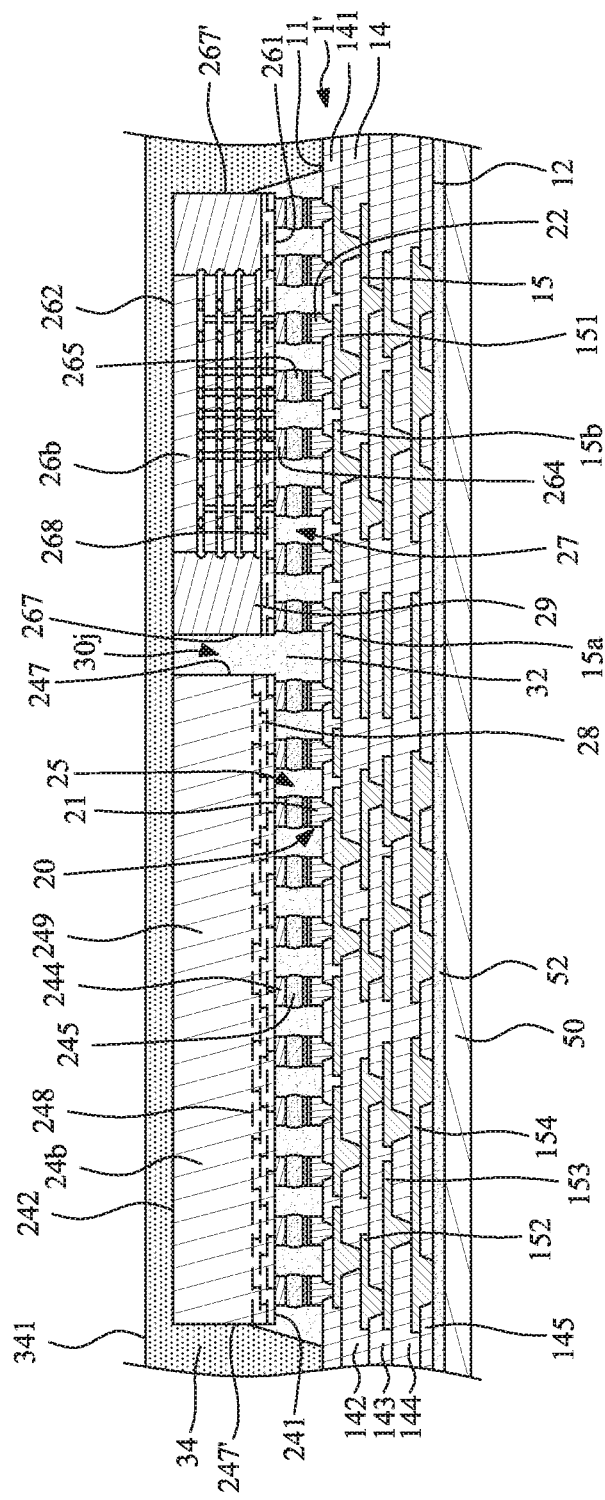
FIG. 45 illustrates one or more stages of an example of a method for manufacturing an assembly structure according to some embodiments of the present disclosure.

Referring to FIG. 45, an encapsulant 34 is formed or disposed to cover at least a portion of the first surface 11 of the wiring structure 1', at least a portion of the first electronic device 24*b*, at least a portion of the second electronic device 26*b* and the first protection material 32. The encapsulant 34 has a first surface 341 (e.g., a top surface).

Figure 46:
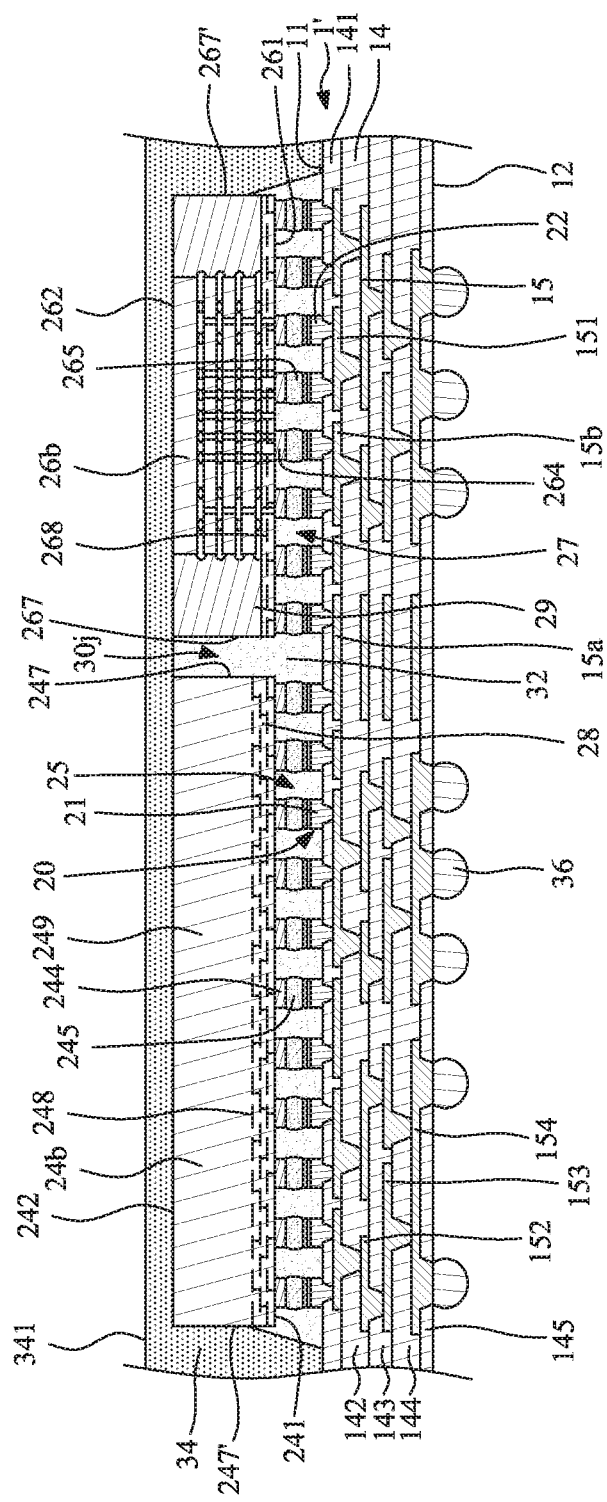
FIG. 46 illustrates one or more stages of an example of a method for manufacturing an assembly structure according to some embodiments of the present disclosure.

Referring to FIG. 46, the carrier 50 and the release layer 52 are removed. Thus, portions (e.g., the bottom portions of the via portions) of the fourth circuit layer 154 are exposed from the second surface 12 of the wiring structure 1'. Then, a plurality of solder materials 36 (e.g., solder balls) are formed or disposed to the second surface 12 of the wiring structure 1'.

Figure 47:
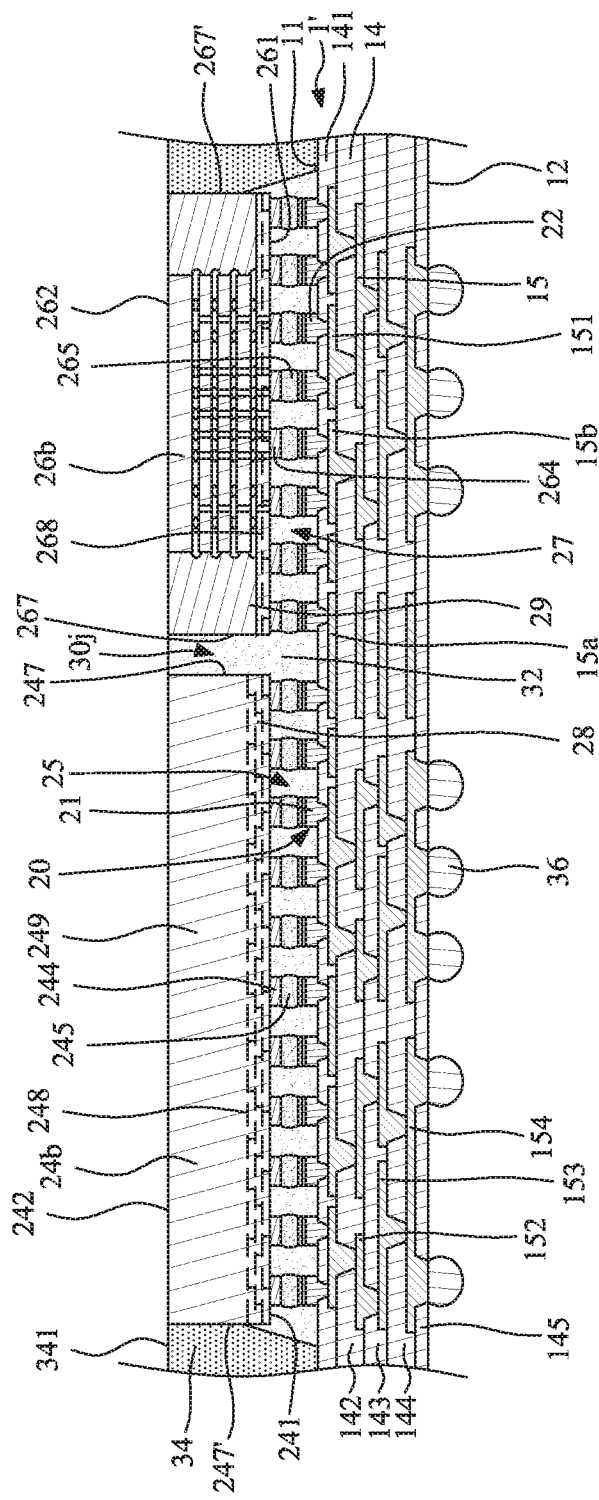
FIG. 47 illustrates one or more stages of an example of a method for manufacturing an assembly structure according to some embodiments of the present disclosure.

Referring to FIG. 47, the encapsulant 34 is thinned from its first surface 341 by, for example, grinding. Thus, the first surface 341 of the encapsulant 34, the second surface 242 of the first electronic device 24*b*, the second surface 262 of the second electronic device 26*b*, and a top surface of the first protection material 32 may be substantially coplanar with each other.

Figure 48:
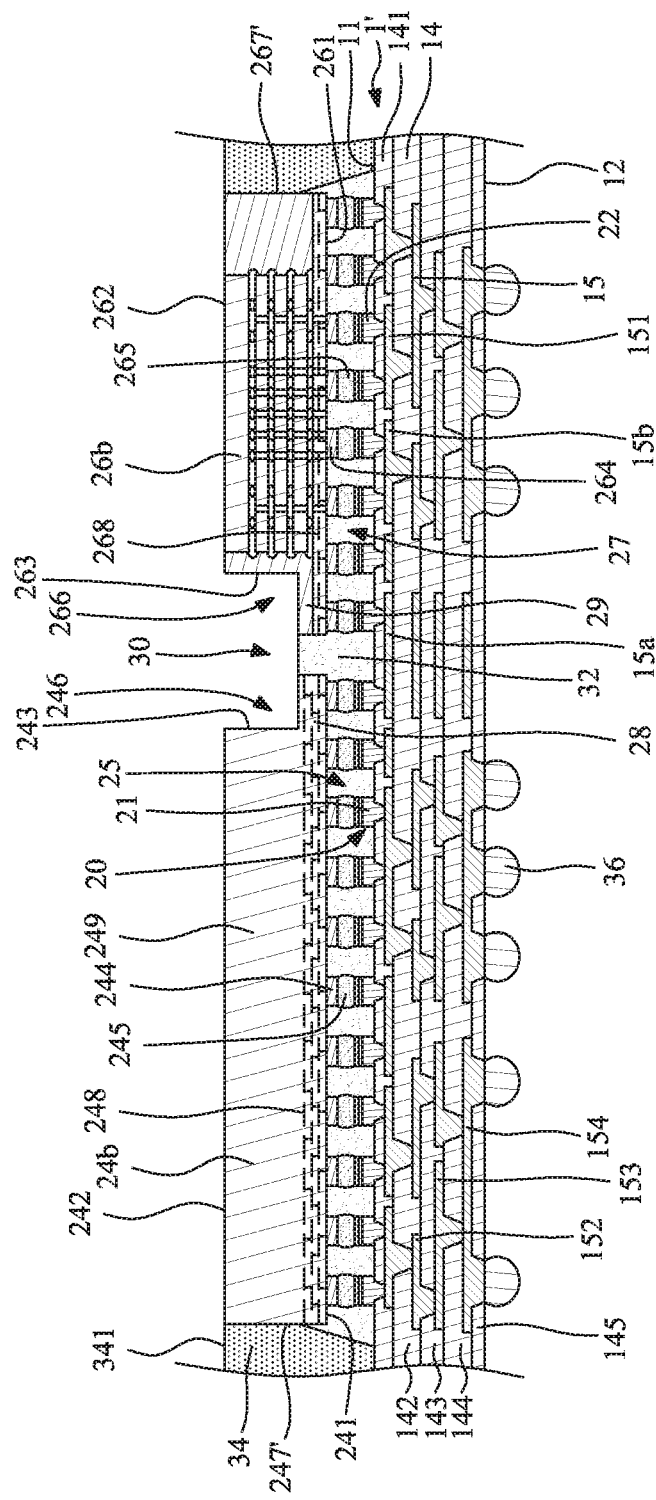
FIG. 48 illustrates one or more stages of an example of a method for manufacturing an assembly structure according to some embodiments of the present disclosure.

Referring to FIG. 48, a groove or a gap 30 is formed between the first electronic device 24*b* and the second electronic device 26*b*. A width of the groove or gap 30 is greater than a width of the gap 30*j*. Thus, the upper portion of the gap 30*j* is enlarged. Meanwhile, the first electronic device 24*b* has a lateral side surface 243 and a first protrusion portion 28, and defines a first indentation structure 246. The second electronic device 26*b* has a lateral side surface 263 and a second protrusion portion 29, and defines a second indentation structure 266. The top surface of the first protection material 32 may be substantially coplanar with the upper surface of the first protrusion portion 28 and the upper surface of the second protrusion portion 29. The groove or gap 30 is between the lateral side surface 243 of the first electronic device 24*b* and the lateral side surface 263 of the second electronic device 26*b*.

Figure 49:
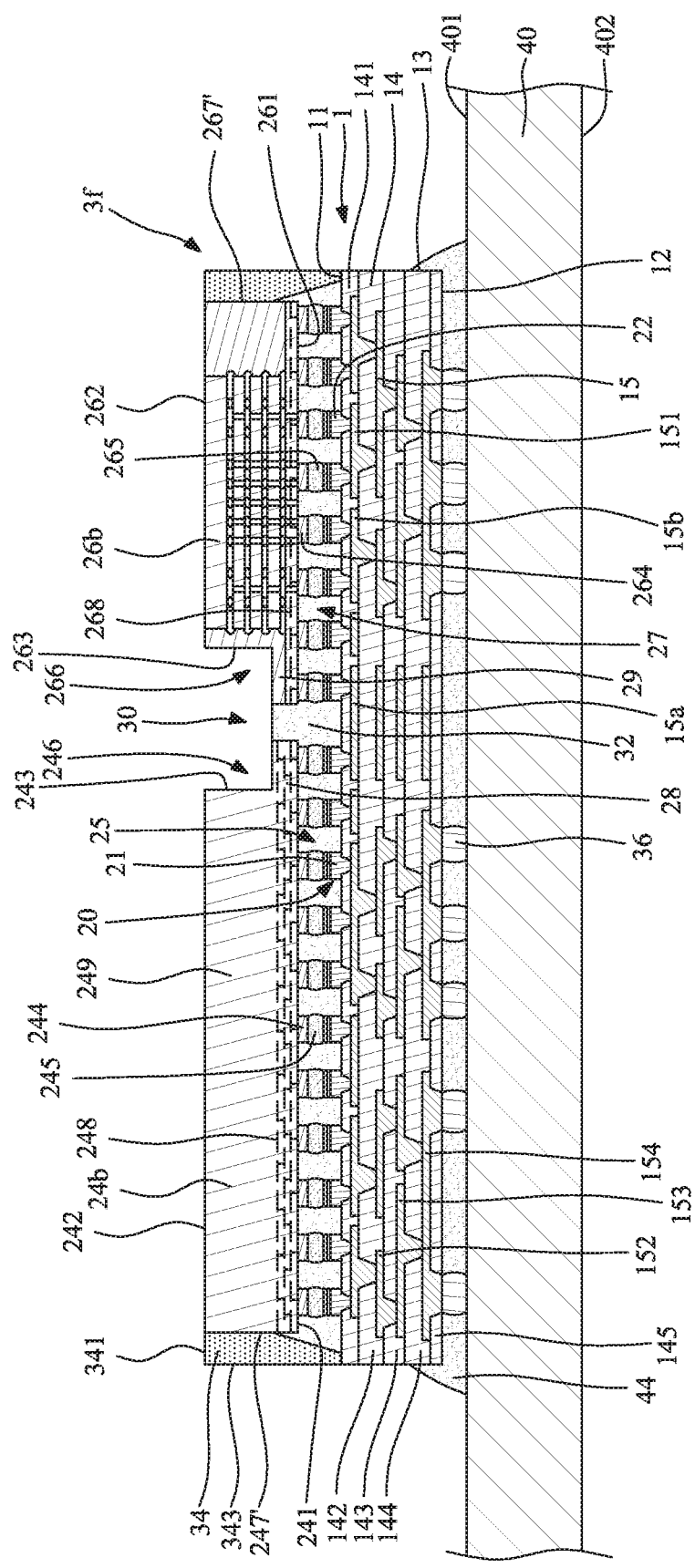
FIG. 49 illustrates one or more stages of an example of a method for manufacturing assembly structure according to some embodiments of the present disclosure.

Referring to FIG. 49, a singulation process may be conducted to the wiring structure 1' so as to obtain a plurality of package structures 3*f*. Then, the package structure 3*f* may be electrically connected to a first surface 401 of a base substrate 40 through the solder materials 36. Then, a second protection material 44 (e.g., an underfill) is formed or disposed in a space between the package structure 3f and the base substrate 40 so as to cover and protect the solder materials 36.

Then, a heat sink 46 may be attached to package structure 3f and the base substrate 40. Then, a singulation process may be conducted to the base substrate 40 so as to obtain a plurality of assembly structures 4f shown in FIG. 15

Figure 50:
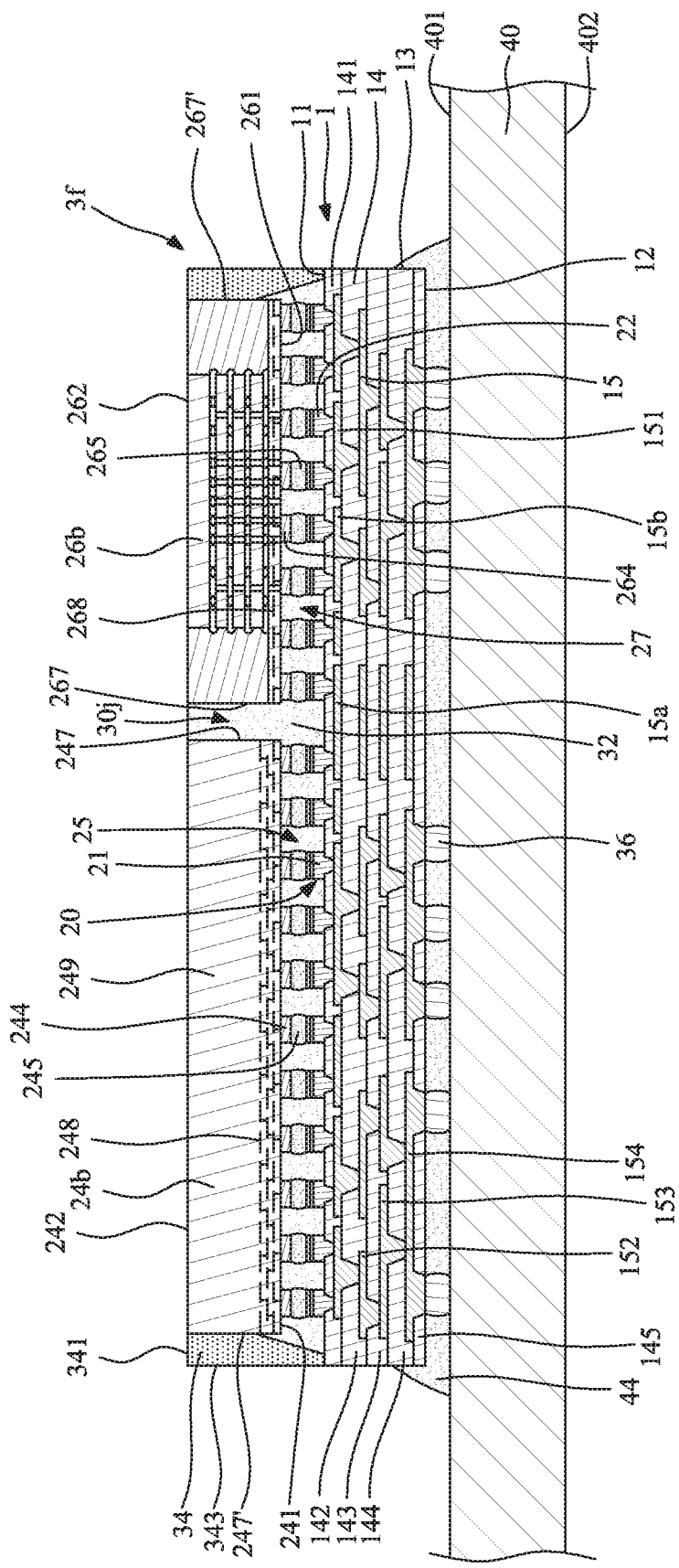
FIG. 50 illustrates one or more stages of an example of a method for manufacturing an assembly structure according to some embodiments of the present disclosure.
Figure 51:
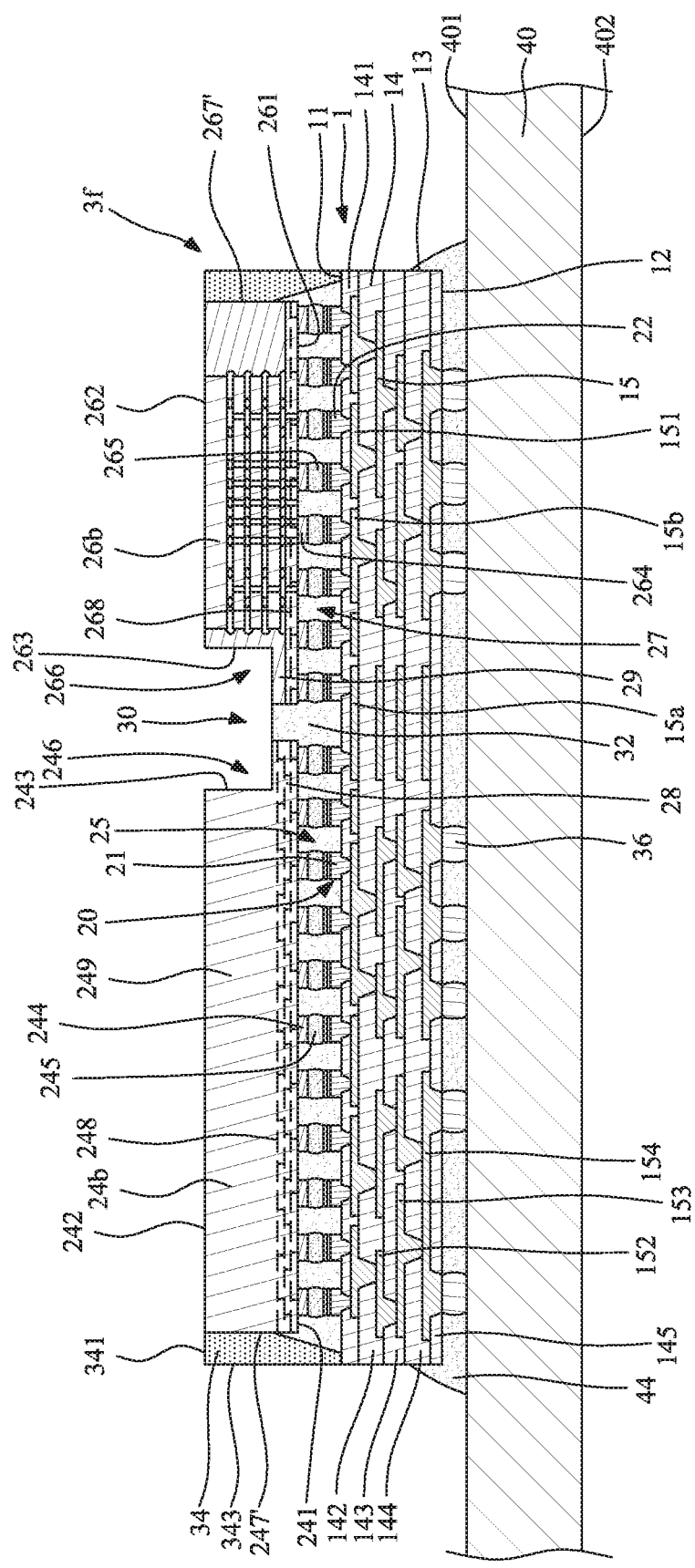
FIG. 51 illustrates one or more stages of an example of a method for manufacturing an assembly structure according to some embodiments of the present disclosure.

FIG. 50 through FIG. 51 illustrate a method for manufacturing an assembly structure according to some embodiments of the present disclosure. In some embodiments, the method is for manufacturing the package structure 3f and the assembly structure 4f shown in FIG. 15. The initial stages of the illustrated process are the same as, or similar to, the stages illustrated in FIG. 43 to FIG. 47. FIG. 50 depicts a stage subsequent to that depicted in FIG. 47.

Referring to FIG. 50, a singulation process may be conducted to the wiring structure 1' so as to obtain a plurality of package structures 3f. Then, the package structure 3f may be electrically connected to a first surface 401 of a base substrate 40 through the solder materials 36. Then, a second protection material 44 (e.g., an underfill) is formed or disposed in a space between the package structure 3f and the base substrate 40 so as to cover and protect the solder materials 36.

Referring to FIG. 51, a groove or a gap 30 is formed between the first electronic device 24b and the second electronic device 26b. A width of the groove or gap 30 is greater than a width of the gap 30j. Thus, the upper portion of the gap 30j is enlarged.

Then, a heat sink 46 may be attached to package structure 3f and the base substrate 40. Then, a singulation process may be conducted to the base substrate 40 so as to obtain a plurality of assembly structures 4f shown in FIG. 15.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
   a wiring structure including at least one dielectric layer, and at least one circuit layer in contact with the dielectric layer;
   a first electronic device electrically connected to the wiring structure, and the first electronic device having a first surface, a second surface and at least one lateral side surface extending between the first surface and the second surface, wherein the first electronic device includes a first active circuit region and a first protrusion portion, the first protrusion portion protrudes from the at least one lateral side surface of the first electronic device, and a portion of the first active circuit region is disposed in the first protrusion portion, wherein the first protrusion portion of the first electronic device has an upper surface, a lower surface and an outer side surface extending between the upper surface and the lower surface, and the upper surface of the first protrusion portion and the at least one lateral side surface of the first electronic device define an indentation structure; and a first underfill-repelling material disposed in the indentation structure.

2. The package structure of claim 1, wherein the outer side surface of the first protrusion portion is substantially coplanar with an outer side surface of the first underfill-repelling material.

3. The package structure of claim 1, wherein the first protrusion portion of the first electronic device includes a first portion and a second portion, a thickness of the first portion is greater than a thickness of the second portion.

4. The package structure of claim 1, further comprising a protection material disposed in a space between the first electronic device and the wiring structure, wherein the protection material extends into the indentation structure.

5. The package structure of claim 1, wherein the portion of the first active circuit region is electrically connected to the wiring structure.

6. The package structure of claim 1, further comprising a second electronic device electrically connected to the wiring structure.

7. The package structure of claim 6, wherein the first protrusion portion of the first electronic device protrudes toward the second electronic device.

8. The package structure of claim 6, wherein the second electronic device has a first surface, a second surface and at least one lateral side surface extending between the first surface and the second surface, and includes a second active circuit region and a second protrusion portion, wherein the second protrusion portion protrudes from the at least one lateral side surface of the second electronic device, and a portion of the second active circuit region is disposed in the second protrusion portion.

9. The package structure of claim 8, wherein the portion of the second active circuit region is electrically connected to the wiring structure.

10. The package structure of claim 1, wherein the first electronic device includes at least one second electrical contact disposed adjacent to the lower surface of the first protrusion portion and electrically connecting the first active circuit region and the wiring structure.

* * * * *